US011217303B2

United States Patent
Strand et al.

(10) Patent No.: US 11,217,303 B2
(45) Date of Patent: Jan. 4, 2022

(54) IMPRINT RECOVERY FOR MEMORY ARRAYS

(71) Applicant: Micron Technology, Inc., Boise, ID (US)

(72) Inventors: Jonathan J. Strand, Boise, ID (US); Sukneet Singh Basuta, Meridian, ID (US); Shashank Bangalore Lakshman, Boise, ID (US); Jonathan D. Harms, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 16/581,005

(22) Filed: Sep. 24, 2019

(65) Prior Publication Data

US 2021/0090641 A1    Mar. 25, 2021

(51) Int. Cl.

| | |
|---|---|
| *G11C 11/56* | (2006.01) |
| *G11C 29/50* | (2006.01) |
| *G11C 16/10* | (2006.01) |
| *G11C 16/26* | (2006.01) |
| *G11C 16/34* | (2006.01) |
| *G11C 16/08* | (2006.01) |

(52) U.S. Cl.
CPC ...... *G11C 11/5628* (2013.01); *G11C 11/5642* (2013.01); *G11C 16/08* (2013.01); *G11C 16/10* (2013.01); *G11C 16/26* (2013.01); *G11C 16/3427* (2013.01); *G11C 29/50004* (2013.01); *G11C 29/50016* (2013.01); *G11C 2029/5004* (2013.01)

(58) Field of Classification Search
CPC ............ G11C 11/5628; G11C 11/5642; G11C 16/08; G11C 16/10; G11C 16/26; G11C 16/3427; G11C 29/5004; G11C 29/50016
USPC ........................................................ 365/145
See application file for complete search history.

(56) References Cited

U.S. PATENT DOCUMENTS

| | | | |
|---|---|---|---|
| 9,697,913 B1 * | 7/2017 | Mariani | G11C 29/52 |
| 9,786,349 B1 | 10/2017 | Calderoni et al. | |
| 10,153,054 B2 | 12/2018 | Mariani et al. | |
| 2009/0180342 A1 * | 7/2009 | Higashi | G11C 11/406 |
| | | | 365/205 |
| 2010/0296329 A1 * | 11/2010 | Summerfelt | G11C 29/50 |
| | | | 365/145 |

(Continued)

*Primary Examiner* — Sung Il Cho
(74) *Attorney, Agent, or Firm* — Holland & Hart LLP

(57) ABSTRACT

Methods, systems, and devices for imprint recovery for memory arrays are described. In some cases, memory cells may become imprinted, which may refer to conditions where a cell becomes predisposed toward storing one logic state over another, resistant to being written to a different logic state, or both. Imprinted memory cells may be recovered using a recovery or repair process that may be initiated according to various conditions, detections, or inferences. In some examples, a system may be configured to perform imprint recovery operations that are scaled or selected according to a characterized severity of imprint, an operational mode, environmental conditions, and other factors. Imprint management techniques may increase the robustness, accuracy, or efficiency with which a memory system, or components thereof, can operate in the presence of conditions associated with memory cell imprinting.

25 Claims, 20 Drawing Sheets

(56) References Cited

U.S. PATENT DOCUMENTS

2015/0363257 A1\* 12/2015 Kwon ................ G06F 11/0751
714/6.11
2016/0062681 A1\* 3/2016 Samuels ............... G06F 3/0619
711/103

\* cited by examiner

IMPRINT RECOVERY FOR MEMORY ARRAYS

BACKGROUND

The following relates generally to a system that includes at least one memory device and more specifically to imprint management for memory systems.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as FeRAM, may maintain stored logic states for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Some memory types may experience imprinting, which may refer to various conditions where a memory cell becomes predisposed toward storing one logic state over another, resistant to being written to a different logic state (e.g., a logic state different than a stored logic state prior to a write operation), or both. In some cases, a likelihood of imprint may increase as a function of time (e.g., where longer durations of a memory cell storing a logic state may be associated with an increased likelihood of the memory cell being imprinted with the logic state). Additionally, or alternatively, a likelihood of imprint may increase as a function of temperature (e.g., where higher temperatures of a memory cell storing a logic state may be associated with an increased likelihood of the memory cell being imprinted with the logic state). Imprinted memory cells may be associated with read errors, write errors, or other behaviors or vulnerabilities that can impair operations of a memory device, or a system that includes a memory device.

DETAILED DESCRIPTION

Figure 1:
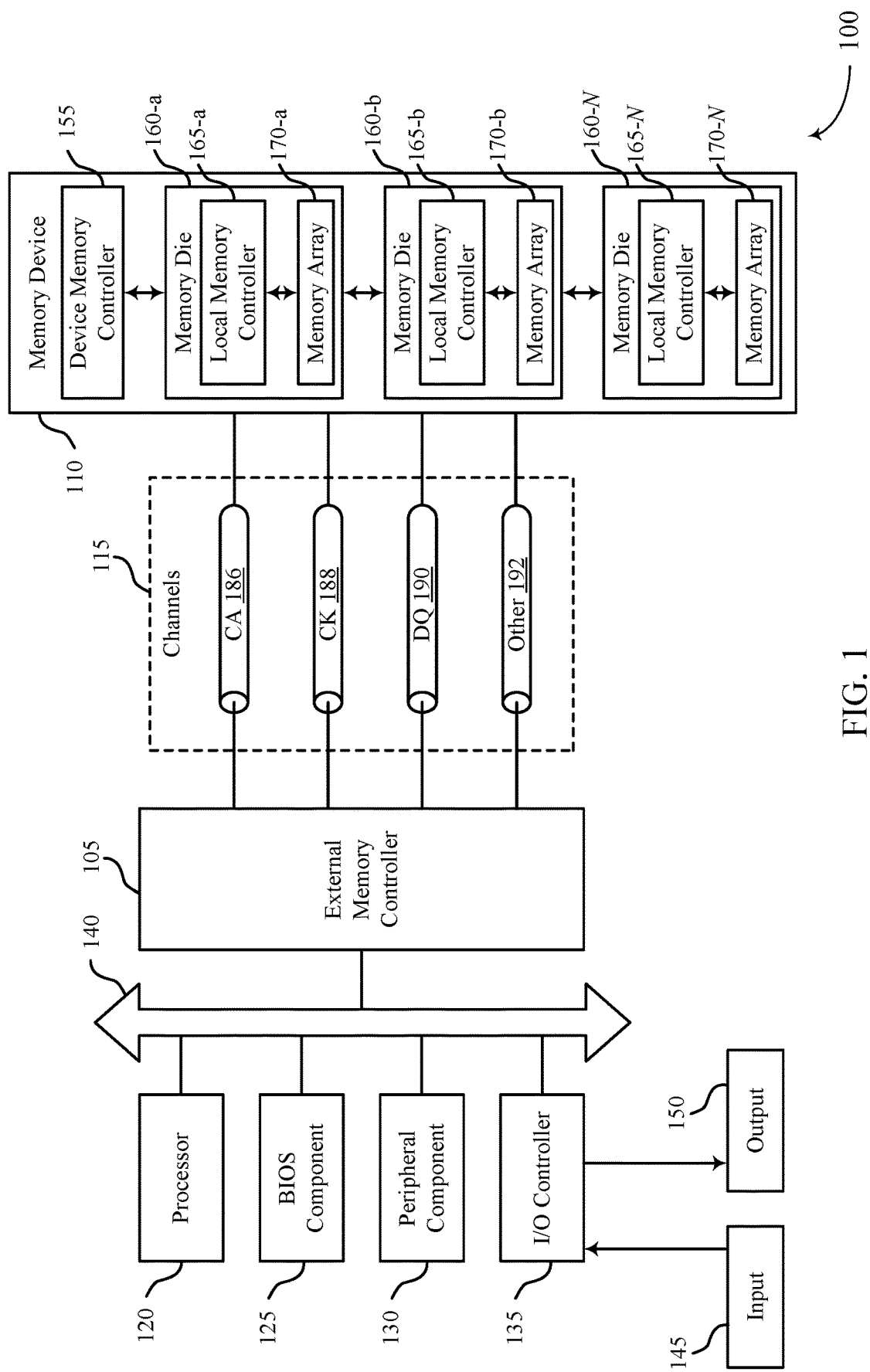
FIG. 1 illustrates an example of a system that supports imprint management in accordance with examples as disclosed herein.

Memory devices may experience various conditions when operating as part of electronic devices such as mobile devices, personal computers, wireless communication devices, servers, internet-of-things (IoT) devices, vehicles or vehicle components, and the like. In some cases, one or more memory cells of a memory device may become imprinted, which may refer to various conditions where a memory cell of a memory device becomes predisposed toward storing one logic state over another, resistant to being written to a different logic state (e.g., a logic state different than a stored logic state prior to a write operation), or both. A likelihood of a memory cell becoming imprinted with a logic state may be related to a length of uninterrupted (e.g., continuous) time storing the logic state, a temperature of the memory cell while storing the logic state, or other factors.

In one example, a memory device may experience imprinting from being exposed to an elevated temperature over a duration, such as being located in a hot vehicle, located in direct sunlight, or other environments, where such conditions may be referred to as a static bake (e.g., when one or more memory cells are maintained at a particular logic state during the elevated temperature exposure). In some cases, a static bake may imprint (e.g., thermally imprint) various memory cells of the memory device such that they become biased or stuck in a first state (e.g., a state corresponding to a logic 0) over another state (e.g., a state corresponding to a logic 1). In another example, memory cells of a memory device may store logic states, or some charge state or material state that may or may not be associated with data, in an as-manufactured condition. The memory device may undergo some amount of imprinting prior to being installed in a system or operated in the system, such as an imprinting over time while idle or unpowered in a warehouse, which may cause degraded performance or failures upon initial operation. In another example, imprinting may be inadvertently or maliciously caused by operating parameters or access patterns.

Imprinted memory cells may be associated with adverse performance when compared with non-imprinted memory cells. For example, imprinted memory cells may resist charge flow during access operations (e.g., read or write operations), may resist changes in polarization during access operations, may resist changes in material properties such as changes in atomic distribution or arrangement, changes in electrical resistance, or changes in threshold voltage, or may be associated with other behaviors that are different than non-imprinted memory cells (e.g., behaviors that are asymmetric with respect to different logic states). In one example, when a write operation is performed on an imprinted memory cell in an effort to write a target logic state, the memory cell may not store the target logic state, or a memory device may be otherwise unable to be read the memory cell as storing the target state, which may result in access errors (e.g., write errors, read errors) or data corruption.

In some cases, imprinted memory cells may be recovered (e.g., unimprinted, unstuck, repaired, normalized, equalized) using a recovery or repair process. For example, memory cells of an array can be recovered (e.g., from a recoverable imprinting) by applying various biasing techniques, such as applying one or more voltages or voltage pulses across the memory cells, or performing multiple access operations (e.g., multiple read operations, multiple write operations, multiple read and write operations) on memory cells of the memory array. In various examples, such biasing may be performed in a maintenance or recovery mode that may or may not be related to a particular data accessing (e.g., as requested or commanded by a host device, on a scheduled basis, based on detecting or predicting that an imprinting has occurred), or may be performed in an imprint maintenance or recovery mode that modifies parameters of access operations (e.g., read operations, write operations, refresh operations) while supporting data transfer in the imprint maintenance or recovery mode. In some cases, the parameters may be permanently or indefinitely modified to support imprint recovery or prevention (e.g., durations or magnitudes of access voltages may be modified). Such techniques may relieve the effect of imprinting, such as returning memory cells to generally normalized, equalized, or otherwise symmetric behavior with respect to different logic states.

Recovery operations related to memory cell imprint in accordance with the described techniques may be initiated according to various conditions or detections. For example, an electronic device or memory device may detect conditions associated with imprinting (e.g., conditions associated with elevated temperatures, conditions associated with maintaining logic states over relatively long durations, an indication that the memory device is powering on for the first time, inadvertent or malicious access patterns that may cause imprint), and initiate recovery operations based at least in part on the detected conditions. In other words, in some examples, a likelihood of imprinting may be inferred based on operating conditions, or a presence of imprinting may be otherwise predicted. In some examples, such detections may be based on signaling conveyed between an electronic device (e.g., a host device, a host controller) and the memory device, or various tracking, monitoring, sensing, or calculation operations performed by one or both of a memory device or an electronic device that includes the memory device.

In some cases, an electronic device or memory device may not have an indication of imprinting, or may lack information relevant to determining or predicting whether imprint occurred or likely occurred. For example, a memory device may be powered down or deactivated over the course of using an electronic device, such as when an electronic device is powered off or loses power (e.g., when a battery is depleted, when a power source is disconnected), or when the electronic device is placed in a standby mode or other mode where a memory device is powered down or otherwise not monitoring operating conditions or environmental conditions. During a powered down, deactivated, or standby state, the electronic device and memory device may be exposed to one or more operational or environmental conditions that may affect operation of the memory device, but the device may not detect conditions that would be associated with imprinting. For example, if a device is not powered on, the device may not be monitoring a thermal history or condition. Accordingly, in some examples, a memory device may perform an imprint detection procedure (e.g., detecting a presence of imprinting in the memory device) to determine whether an imprint recovery operation should be performed on a memory array. A memory device or system that includes the memory device may initiate or perform such a detection procedure upon activation (e.g., as part of an initialization, powering, or boot process), in response to a request from a host device, or upon any other scheduled (e.g., periodic) or event-driven (e.g., triggered) basis, including various scenarios described herein.

Techniques in accordance with the present disclosure may increase the robustness, accuracy, or efficiency with which a memory device, or a host device for the memory device, or a system that includes a memory device and host device can operate in the presence of conditions associated with memory cell imprinting. For example, in accordance with the described techniques, a memory device, a host device, or both may perform various operations to detect a presence of memory cell imprint, or infer a likelihood of memory cell imprint. A memory device may accordingly be configured to perform various operations in response to such a detection or inference, which may be more efficient than performing such operations continuously or preemptively. In some examples, a system may be configured to characterize a severity or directionality of imprinting, and perform imprint recovery operations that are scaled or selected according to the characterized severity or directionality. Additionally, or alternatively, imprint recovery operations may be tailored by a system to particular operating conditions of a memory device or host device, such as an operational mode or environmental condition, which, in some examples, may be based at least in part on signaling or operational negotiation between a memory device and a host device. In some cases, the described techniques may also consider various aspects of data preservation or operational integrity, including various signaling, data transfer, or operational management between a memory device and a host device.

Features of the disclosure are initially described in the context of a memory system and memory die as described with reference to FIGS. 1 through 4. Features of the disclosure are further described in the context of imprint detection and recovery techniques with reference to FIGS. 5 through 16. These and other features of the disclosure are further illustrated by and described with reference to apparatus diagrams and flowcharts that relate to imprint management for memory as described with references to FIGS. 17 through 32.

FIG. 1 illustrates an example of a system 100 that supports imprint management in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, a graphics processing device, a vehicle, or other systems. In some examples, the system 100 may be an example of a portable electronic device. For example, the system 100 may illustrate aspects of a computer, a laptop computer, a tablet computer, a smartphone, a cellular phone, a wearable device, an internet-connected device, a vehicle controller, or the like. The memory device 110 may be a component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses or space that may be used or referenced by the system 100. In some examples, a memory device 110 may be configurable to work with one or more different types of systems 100. Signaling between the components of the system 100 and the memory device 110 may be operable to support modulation schemes to modulate the signals, various pin designs for communicating the signals, various form factors for physical packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to provide control or other functionality for at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100 (e.g., the peripheral components 130, the I/O controller 135). The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., one or more grids, one or more sections) of memory cells, with each memory cell being configured to store at least one bit of digital data. In some cases, a memory array 170 may include ferroelectric RAM (FeRAM) memory cells. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another (e.g., relative to a substrate) or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuitry or components configured to control operation of the memory device 110. The device memory controller 155 may include the hardware, firmware, instructions, or other configuration that enable the memory device 110 to perform various operations and may be configured to receive, transmit, or execute commands, data, or control information related to components of the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of components that may be included in the device memory controller 155 and/or the local memory controllers 165 may include receivers for receiving signals (e.g., from the external memory controller 105), transmitters for transmitting signals (e.g., to the external memory controller 105), decoders for decoding or demodulating received signals, encoders for encoding or modulating signals to be transmitted, or various other circuitry or controllers configured for supporting described operations of the device memory controller 155 or local memory controller 165.

A local memory controller 165 (e.g., local to a memory die 160) may be configured to control operations of the memory die 160. In some examples, a local memory controller 165 may be configured to communicate (e.g., receive or transmit data and/or commands) with the device memory controller 155. A local memory controller 165 may support the device memory controller 155 to control operation of the memory device 110 as described herein. In some cases, a memory device 110 may not include a device memory controller 155, and a local memory controller 165 or an external memory controller 105 may perform the various functions described herein. As such, a local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may be configured to support communications between the external memory controller 105 and the memory device 110. Each channel 115 may include or be associated with one or more signal paths or transmission media (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, and other PAM configurations, quadrature amplitude modulation (QAM), quadrature phase shift keying (QPSK), and/or others. A multi-symbol signal (e.g., PAM3 signal or PAM4 signal) signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, one or more memory cells of a memory array 170 may become imprinted, which may refer to various conditions where a memory cell becomes predisposed toward storing one logic state over another, resistant to being written to a different logic state (e.g., a logic state different than a logic state stored prior to a write operation), or both. A likelihood of a memory cell becoming imprinted with a logic state may be related to a length of time storing the logic state (e.g., a continuous duration, an uninterrupted duration), a temperature of the memory cell while storing the logic state, inadvertent or malicious access patterns, or other factors. In accordance with the described techniques, components of the system 100 may be configured to selectively perform various operations to mitigate or recover from such imprinting, which may increase the robustness, accuracy, or efficiency with which a memory device 110, a host device, or the system 100 as a whole, can operate in the presence of conditions associated with memory cell imprinting.

For example, in accordance with the described techniques, a memory device 110, a host device (e.g., an external memory controller 105), or both may perform various operations to detect a presence of memory cell imprint, or infer a likelihood of memory cell imprint. A memory device 110 may accordingly be configured to perform various operations in response to such a detection or inference, which may be more efficient than performing such operations continuously or preemptively. In some examples, one or more components of the system 100 may be configured to characterize a severity or directionality of imprinting, and perform imprint recovery operations that are scaled or selected according to the characterized severity or directionality. Additionally, or alternatively, imprint recovery operations may be tailored by the system 100 to particular operating conditions of a memory device 110, of a host device (e.g., an external memory controller 105) or the system 100 as a whole, such as an operational mode or environmental condition, which, in some examples, may be based at least in part on signaling or operational negotiation between a memory device 110 and a host device (e.g., an external memory controller 105).

Figure 2:
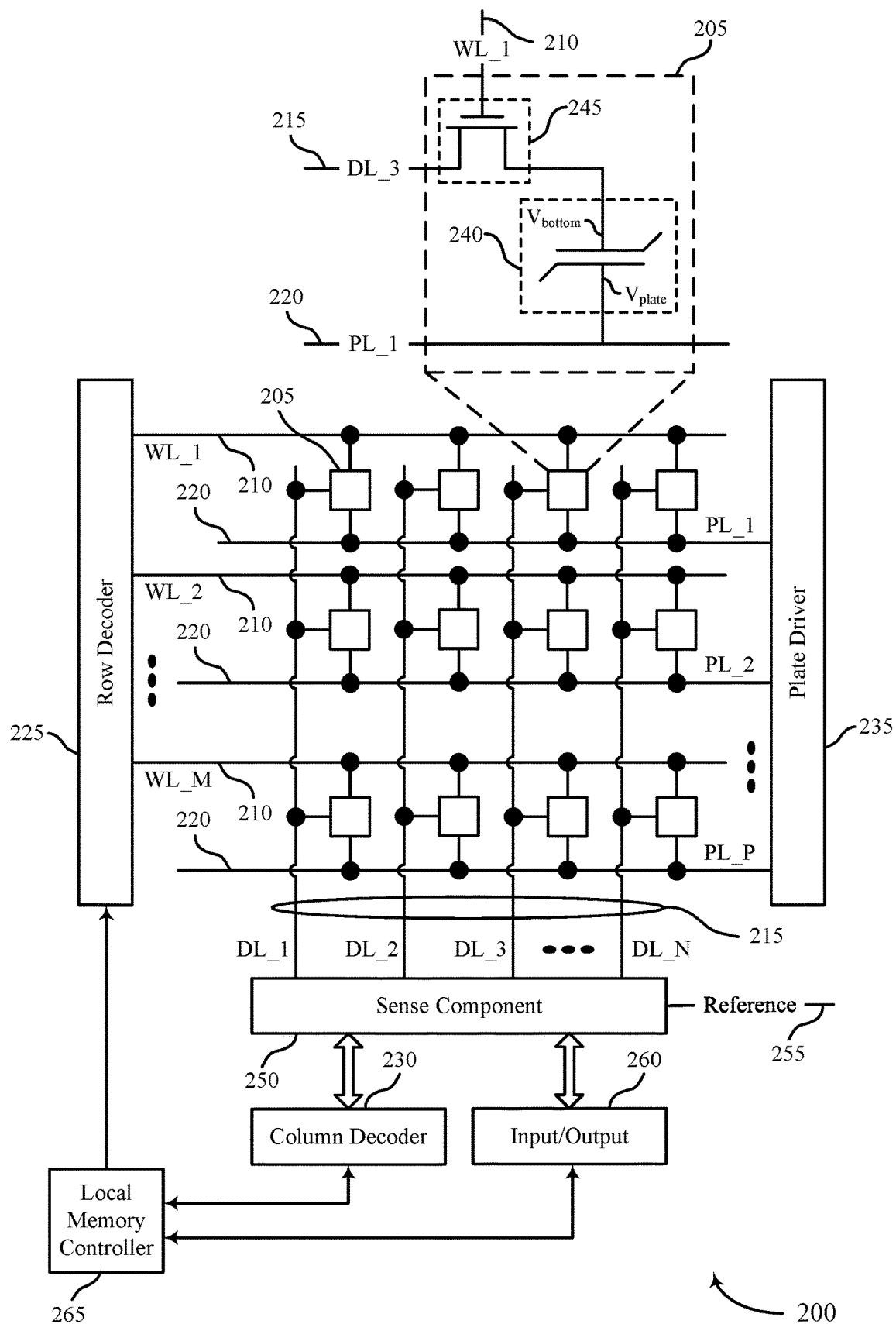
FIG. 2 illustrates an example of a memory die that supports imprint management for memory systems in accordance with examples as disclosed herein.

FIG. 2 illustrates an example of a memory die 200 that supports imprint management for memory systems in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are each programmable to store different logic states (e.g., a programmed one of a set of two or more possible states). For example, a memory cell 205 may be configured to store one bit of digital logic at a time (e.g., a logic 0 or a logic 1). In some cases, a memory cell 205 (e.g., a multi-level memory cell 205) may be configured to store more than one bit of digit logic at a time (e.g., a logic 00, logic 01, logic 10, or a logic 11).

In some examples, a memory cell 205 may store an electric charge representative of the programmable logic states (e.g., storing charge in a capacitor, capacitive memory element, capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 205. In some examples, such as FeRAM architectures, a memory cell 205 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 205). Ferroelectric materials have non-linear polarization properties including those discussed in further detail with reference to FIGS. 3A and 3B.

In some examples, a memory cell 205 may store a logic state using a configurable material, which may be referred to as a memory element, a memory storage element, a material element, a material memory element, a material portion, a polarity-written material portion, and others. A configurable material of a memory cell 205 may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics. In some examples, such characteristics may be associated with different electrical resistances, different threshold voltages, or other properties that are detectable or distinguishable during a read operation to identify a logic state stored by the configurable material. In some examples, a configurable material may refer to a chalcogenide-based storage component. For example, a chalcogenide storage element may be used in phase change memory (PCM) cells or self-selecting memory cells. Chalcogenide storage elements may be examples of resistive memories or thresholding memories.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines, bit lines, or their analogues, are interchangeable without loss of understanding or operation. Activating or selecting a word line 210, a digit line 215, or a plate line 220 may include applying a voltage to the respective access line (e.g., "biasing" the respective access line).

The memory die 200 may include the access lines (e.g., word lines 210, digit lines 215, plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address, or may activate a common plate or plate node that is common to a section of memory cells 205 being accessed. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. By activating a word line 210, a digit line 215, and a plate line 220, e.g., WL_1, DL_3, and PL_1, a memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. In some examples, the capacitor 240 may be an example of a ferroelectric capacitor. A first node (e.g., a cell bottom, a bottom node) of the capacitor 240 may be coupled with the switching component 245 and a second node (e.g., a cell plate, a plate node) of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 (e.g., a cell bottom) may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In various examples, the switching component 245 may be a p-type transistor or an n-type transistor. The word line 210 may be in electronic communication with the gate of the switching component 245 and may activate/deactivate the switching component 245 based on a voltage being applied to word line 210.

The sense component 250 may be configured to detect a state (e.g., a polarization state, a charge state) stored by the capacitor 240 of a memory cell 205 and determine a logic state of the memory cell 205 based on the detected state. The sense component 250 may include one or more sense amplifiers to amplify or otherwise convert a signal resulting from accessing the memory cell 205. For example, during a read operation, the capacitor 240 of memory cell 205 may output a signal (e.g., discharge a charge) to its corresponding digit line 215, which may cause a voltage of the digit line 215 to change. The sense amplifiers may detect small changes in the charge or voltage of a digit line 215 during a read operation and may produce signals corresponding to either a logic 0 or a logic 1 based on the detected charge.

In some examples, the sense component 250 may be configured to compare a signal received from the memory cell 205 (e.g., via the digit line 215) to a reference line 255 (e.g., a reference voltage). The sense component 250 may determine the stored state of the memory cell 205 based on the comparison. In one example according to binary-signaling, if a digit line 215 has a higher voltage than the reference line 255, the sense component 250 may determine that the stored state of memory cell 205 is a logic 1, and, if the digit line 215 has a lower voltage than the reference line 255, the sense component 250 may determine that the stored state of the memory cell 205 is a logic 0. The sense component 250 may include various transistors, amplifiers, or other circuitry to detect and amplify a difference in the signals. The detected logic state of the memory cell 205 may be provided as an output of the sense component 250 (e.g., to an input/output component 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

In some cases, the sense component 250 or the reference line 255 may be configured (e.g., by the local memory controller 265) to control or adjust the reference voltage used to determine (read) a logic state stored by the memory cell 205 (e.g., according to various operational modes or other adjustments). For example, during an access mode (e.g., a mode in which application data may be written to or read from memory cells 205), the sense component 250 and reference line 255 may be configured to use a default reference voltage for determining (e.g., reading) the stored state of the memory cell 205. The default reference voltage may be configured or set at a voltage level that decreases or minimizes errors during sensing operations or otherwise maximizes a read window (e.g., a reference voltage that is equalized or centralized with respect to detecting different logic states). For example, a default voltage may be configured (e.g., as a static configuration, as a configuration that is adjusted over the course of operation) to a voltage level that is between a voltage of a digit line 215 when reading a memory cell 205 storing a logic 1 and a voltage of the digit line 215 when reading a memory cell 205 storing a logic 0 (e.g., equidistant from the digit line 215 voltage associated with a logic 1 and a digit line 215 voltage associated with a logic 0). This may facilitate an accurate determination of the stored memory state.

The local memory controller 265 may control the accessing of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 or a device memory controller 155 described with reference to FIG. 1, translate the commands and/or data into information that can be used by the memory die 200, perform one or more operations on the memory die 200, or communicate data from the memory die 200 to the external memory controller 105 or the device memory controller 155 in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference line 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205, and rewrite or refresh operations may be performed to return the original logic state to memory cell 205. In DRAM or FeRAM, for example, a capacitor of a memory cell 205 may be partially or completely discharged during a sense operation, thereby corrupting the logic state that was stored in the memory cell 205. Thus, in some examples, the logic state stored in a memory cell 205 may be rewritten after an access operation (e.g., in a rewrite operation) to return the memory cell to its original logic state. The local memory controller 265 may rewrite the logic state to the target memory cell after a read operation, and, in some cases, a rewrite operation may be considered part of the read operation. In some cases, activating a single access line (e.g., a word line 210, a digit line 215, a plate line 220) may result in the discharge of all memory cells 205 coupled with the activated access line. Thus, several or all memory cells 205 coupled with an access line associated with an access operation (e.g., all cells of an accessed row, all cells of an accessed column) may be rewritten after the access operation.

In some examples, reading a memory cell 205 may be non-destructive. That is, the logic state of the memory cell 205 may not need to be rewritten after the memory cell 205 is read. However, in some examples, refreshing the logic state of the memory cell 205 may or may not be needed in the absence or presence of other access operations. For example, the logic state stored by a memory cell 205 may be refreshed at periodic intervals by applying an appropriate write, rewrite, refresh, or equalization pulse or bias to maintain the stored logic state. Refreshing the memory cell 205 may reduce or eliminate read disturb errors or logic state corruption due to a charge leakage or a change in an atomic configuration of a memory element over time.

In some cases, environmental conditions such as a static bake may shift or change a programmable characteristic of the memory cell 205. For example, in an FeRAM application, a static bake may shift or alter the polarization capacity, coercivity, or other aspect of charge mobility of the memory cell 205, which may cause the memory cell 205 to become biased to a specific logic state (e.g., biased toward being written to or read as a logic 1 state or biased toward being written to or read as a logic 0 state). In a memory application using a configurable material (e.g., material memory elements), these or other conditions may cause a variable and configurable characteristic or property to resist being changed in response to write operations, such as a resistance to being programmed with a different atomic configuration, a resistance to being programmed with a different degree of crystallinity, a resistance to being programmed with a different atomic distribution, or a resistance to being programmed with some other characteristic associated with a different logic state. Such changes in a programmable characteristic may be referred to as an imprinting, and may cause read or write behavior that is different than when imprinting has not occurred (e.g., asymmetric with respect to logic states). For example, when a write operation, intended to change a logic state of a memory cell, is performed on an imprinted memory cell having an initial state, the memory cell 205 may remain or return to the initial (e.g., imprinted) state, or may be otherwise read as storing the initial state. For example, if a memory cell 205 is imprinted in the 0 logic state, the memory cell 205 may continue to remain in the 0 logic state, or continue to be read as storing the logic 0 state, after an attempt to write the memory cell 205 with a logic 1 state (e.g., after performing a write operation corresponding to the logic 1 state).

In some cases, the memory die 200, or a memory device 110 or system 100 that includes the memory die 200, may be configured to perform an imprint detection procedure to determine whether to perform an imprint recovery operation. In some cases, the imprint detection procedure may evaluate or determine a quantity of the memory cells 205 that have been imprinted or are stuck in a logic state, or otherwise determine or infer a presence, severity, or directionality of imprinting.

In one example, an imprint detection procedure may include writing or attempting to write at least a first set of logic states to a set of the memory cells 205. The memory die 200 may be configured or operated to read the set of the memory cells 205 and perform an analysis procedure that compares the written logic states with the logic states read from the set of the memory cells 205 to determine whether a recovery operation should be performed. As used herein, a written logic state may refer to a logic state that was attempted or intended to be written, and writing a logic state may refer to attempting to write the logic state, though in some cases writing the logic state may be unsuccessful (e.g., due to imprint of the target memory cell 205).

In some cases, for one or more write operations, and using one or more read reference voltages, the imprint detection procedure may determine how many logic states read from the set of the memory cells 205 fail to match the corresponding respective logic state that was written. For example, the memory die 200 (e.g., the local memory controller 265), or a memory device or host device otherwise operating the memory die 200, may determine that a mismatch or error has occurred when the logic state read from a memory cell 205 is different from the logic state written to that memory cell 205. The imprint detection procedure may count the number of mismatches or errors to determine whether a recovery operation should be performed, which may include performing one or more comparisons or other calculations based on the number of mismatches or errors.

In some cases, to support an imprint detection or evaluation procedure, the sense component 250 or the reference line 255 may be configured to adjust a reference voltage from a default reference voltage to a reference voltage that is larger or smaller than the default reference voltage (e.g., an offset reference voltage). Using an offset reference voltage when reading a set of memory cells 205 may be expected to introduce or be otherwise associated with some quantity of mismatches or errors (e.g., expected differences between a stored logic state and a detected logic state), regardless of imprint. For example, a first offset reference voltage may be closer than the default reference voltage to a digit line voltage associated with a logic 1, which may reduce or eliminate a read margin associated with reading memory cells storing a logic 1. This may result in increased read mismatches or errors associated with a sense operation. That is, even without imprint, a sense operation modified to use an offset reference voltage may be expected to result in a certain number of mis-reads such as, for example, detecting a logic 0 when reading a memory cell 205 that is actually storing a logic 1. In some examples, various aspects of expected and measured mismatches or errors may be leveraged in an imprint evaluation as described herein In some cases, an imprint detection or evaluation procedure may be configured to adjust a reference voltage from a default reference voltage to multiple different reference voltages (e.g., multiple offset reference voltages) that are larger or smaller than the default reference voltage, where each of the offset reference voltages may be associated with a respective expected number of mismatches or errors (e.g., according to a stochastic or probabilistic distribution). In some cases, comparing a determined number of mismatches observed when reading the memory cells 205 using the operating reference voltage or offset reference voltage to a corresponding expected number of mismatches, possibly along with related analysis as described herein, may be used to determine whether to perform an imprint recovery procedure.

In some cases, imprinted memory cells 205 may be recovered (e.g., unimprinted, unstuck, repaired, normalized, equalized) using various imprint recovery or repair processes. For example, memory cells 205 can be recovered by applying various biasing techniques, such as applying one or more voltages or voltage pulses across the memory cells 205 (e.g., according to voltage pulses or biasing applied via digit lines 215, plate lines 220, or both). In various examples, such voltage pulses or biasing may include one or more pulses, where pulses may be applied according to different impulses, steps, ramps, or other characteristic shapes having various durations, amplitudes, polarities, and combinations thereof. In some examples, such voltage pulses may be applied based on a detected or inferred severity or directionality of imprint, based on operating conditions of the memory cells 205 at the time of imprint recovery, based on an operating mode of the memory die 200 or a memory device or host device associated with the memory die 200, or various combinations thereof Additionally, or alternatively, memory cells 205 may be recovered by performing access operations (e.g., multiple read operations, multiple write operations, multiple read and write operations) on the memory cells 205, which may be tailored (e.g., modified) or otherwise performed specifically for imprint recovery (e.g., according to an imprint recovery or maintenance mode). For example, an imprint repair operation may include cycling logic states on a memory cell 205 by writing multiple opposite logic states to the memory cells 205 (e.g., including an application of repeating or alternating write biases). In some cases, the memory cell 205 may be cycled a defined number of times, or repeatedly for a defined amount of time, during a repair or maintenance operation. In some cases, the repair operation may include performing multiple read operations on the memory cell 205 (e.g., including an application of repeating or alternating read biases), and the read operations may be included as part of a cycling procedure (e.g., with or without respective write or rewrite operations). Additionally, or alternatively, a refresh operation may be modified (e.g., by lengthening a refresh duration, by increasing a refresh bias amplitude) for a specific purpose of imprint recovery, which, in various examples, may or may not be performed during an operational mode that supports data exchange with a host device. In some examples, read operations may be used to determine when imprint in the memory cells 205 has decreased, or more generally characterize a severity of imprint. For example, the read operations may be used to compare a read logic state or a memory cell 205 to a logic state meant to have been written to the memory cell 205 to determine if they match, or if a read signal associated with the read logic state is closer to a reference voltage than expected or desirable.

In various examples, such biasing may be performed in a maintenance or recovery mode of the memory die 200 that may or may not be related to a particular data accessing (e.g., as requested or commanded by a host device), which may include various signaling or data exchange between a host device and a memory device that includes the memory die 200, and potentially other auxiliary memory devices that may support various data preservation, redundancy, or integrity techniques. Such techniques may relieve the effect of imprinting, such as returning memory cells 205 to generally normalized, equalized, or otherwise symmetric behavior with respect to different logic states, and improving robustness to vulnerabilities that may be related to imprinting.

Figure 3A:
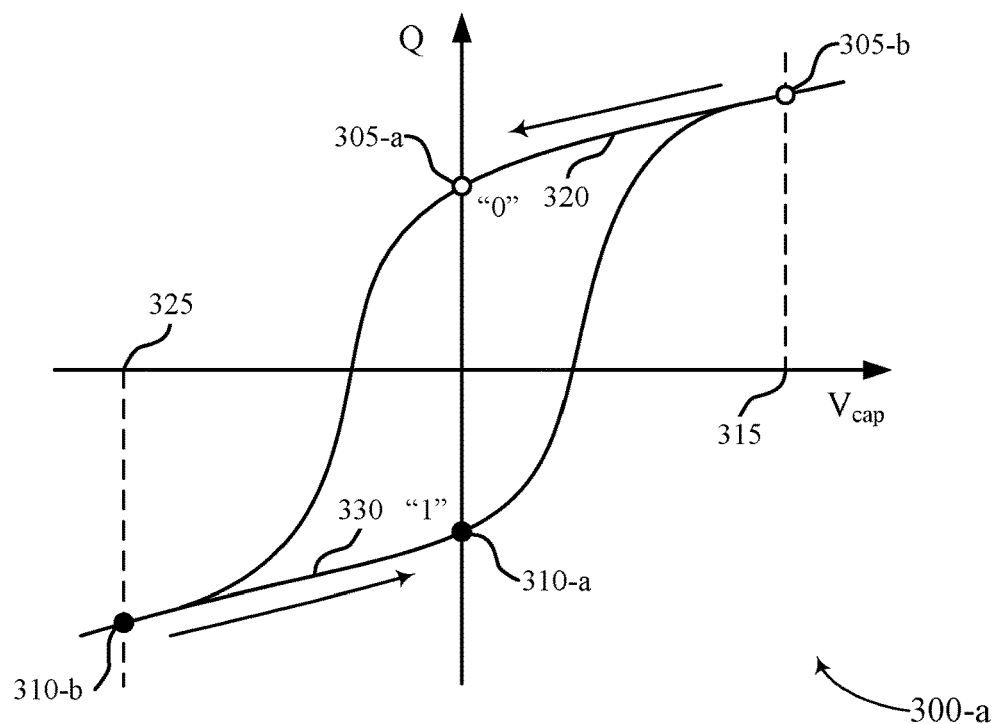
FIGS. 3A and 3B illustrate examples of non-linear electrical properties of a ferroelectric memory cell with hysteresis plots in accordance with various examples as disclosed herein.
Figure 3B:
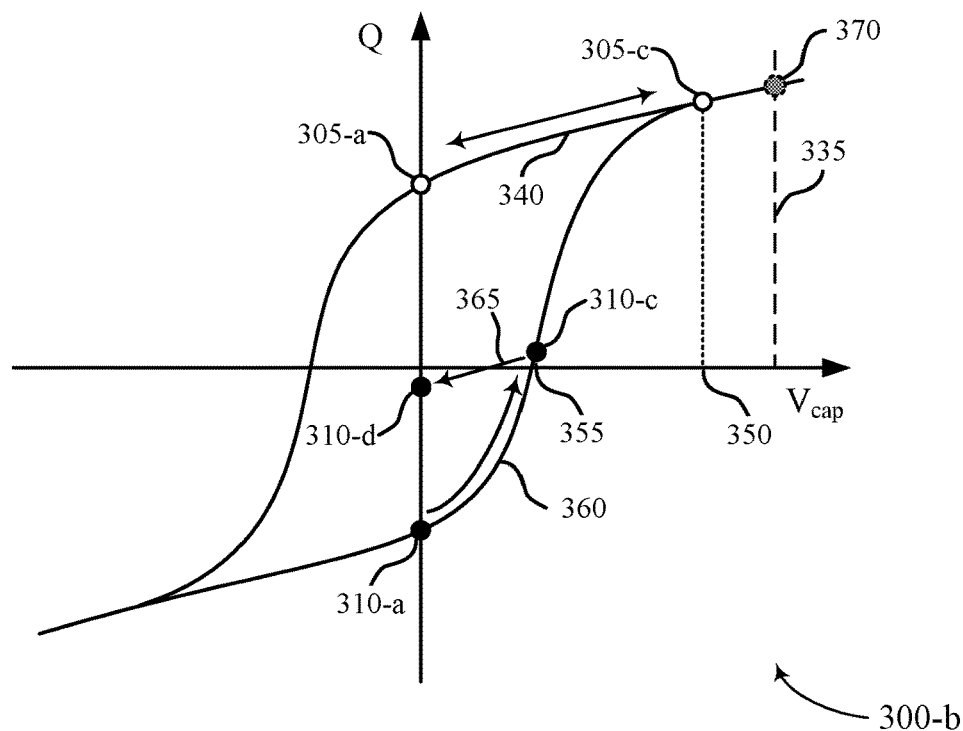

FIGS. 3A and 3B illustrate examples of non-linear electrical properties of a ferroelectric memory cell with hysteresis plots 300-a and 300-b in accordance with various examples as disclosed herein. The hysteresis plots 300-a and 300-b may illustrate examples of a writing process and a reading process, respectively, for a memory cell 205 employing a ferroelectric capacitor 240 as described with reference to FIG. 2. The hysteresis plots 300-a and 300-b depict the charge, Q, stored on the ferroelectric capacitor 240 as a function of a voltage difference $V_{cap}$, between the terminals of the ferroelectric capacitor 240 (e.g., when charge is permitted to flow into or out of the ferroelectric capacitor according to the voltage difference $V_{cap}$). For example, the voltage difference $V_{cap}$ may represent the difference in voltage between a plate line side of the capacitor 240 and a digit line side of the capacitor 240 (e.g., a difference between a voltage at a plate node and a voltage at a bottom node, which may be referred to as $V_{plate}-V_{bottom}$, as illustrated in FIG. 2).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 240 described herein may include these or other ferroelectric materials. Electric polarization within a ferroelectric capacitor 240 results in a net charge at the surface of the ferroelectric material, and attracts opposite charge through the terminals of the ferroelectric capacitor 240. Thus, charge may be stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in some DRAM arrays. Employing ferroelectric materials may reduce a need to perform refresh operations for some memory architectures, such that maintaining logic states of an FeRAM architecture may be associated with lower power consumption than maintaining logic states of a DRAM architecture.

The hysteresis plots 300-a and 300-b may be understood from the perspective of a single terminal of a ferroelectric capacitor 240. By way of example, if the ferroelectric material has a negative polarization, positive charge accumulates at the associated terminal of the ferroelectric capacitor 240. Likewise, if the ferroelectric material has a positive polarization, a negative charge accumulates at the associated terminal of the ferroelectric capacitor 240. Additionally, it should be understood that the voltages in the hysteresis plots 300-a and 300-b represent a voltage difference across the capacitor (e.g., an electric potential between the terminals of the ferroelectric capacitor 240) and are directional. For example, a positive voltage may be realized by applying a positive voltage to the perspective terminal (e.g., a cell plate) and maintaining the reference terminal (e.g., a cell bottom) at ground or virtual ground (or approximately zero volts (0V)). In some examples, a negative voltage may be applied by maintaining the perspective terminal (e.g., a cell plate) at ground and applying a positive voltage to the reference terminal (e.g., a cell bottom). In other words, positive voltages may be applied to arrive at a negative voltage difference $V_{cap}$ across the ferroelectric capacitor 240 and thereby negatively polarize the terminal in question. Similarly, two positive voltages, two negative voltages, or any combination of positive and negative voltages may be applied to the appropriate capacitor terminals to generate the voltage difference $V_{cap}$ shown in the hysteresis plots 300-a and 300-b.

As depicted in the hysteresis plot 300-a, a ferroelectric material used in a ferroelectric capacitor 240 may maintain a positive or negative polarization when there is no net voltage difference between the terminals of the ferroelectric capacitor 240. For example, the hysteresis plot 300-a illustrates two possible polarization states, a charge state 305-a and a charge state 310-a, which may represent a negatively saturated polarization state and a positively saturated polarization state, respectively. The charge states 305-a and 310-a may be at a physical condition illustrating remnant polarization (Pr) values, which may refer to the polarization or charge that remains upon removing the external bias (e.g., voltage). According to the example of the hysteresis plot 300-a, the charge state 305-a may represent a logic 0 when no voltage difference is applied across the ferroelectric capacitor 240, and the charge state 310-a may represent a logic 1 when no voltage difference is applied across the ferroelectric capacitor 240. In some examples, the logic values of the respective charge states or polarization states may be reversed or interpreted in an opposite manner to accommodate other schemes for operating a memory cell 205.

A logic 0 or 1 may be written to the memory cell by controlling the electric polarization of the ferroelectric material, and thus the charge on the capacitor terminals, by applying a net voltage difference across the ferroelectric capacitor 240. For example, the voltage 315 may be a voltage equal to or greater than a positive saturation voltage, and applying the voltage 315 across the ferroelectric capacitor 240 may result in charge accumulation until the charge state 305-b is reached (e.g., writing a logic 0). Upon removing the voltage 315 from the ferroelectric capacitor 240 (e.g., applying a zero net voltage across the terminals of the ferroelectric capacitor 240), the charge state of the ferroelectric capacitor 240 may follow the path 320 shown between the charge state 305-b and the charge state 305-a at zero voltage across the capacitor. In other words, charge state 305-a may represent a logic 0 state at an equalized voltage across a ferroelectric capacitor 240 that has been positively saturated.

Similarly, voltage 325 may be a voltage equal to or less than a negative saturation voltage, and applying the voltage 325 across the ferroelectric capacitor 240 may result in charge accumulation until the charge state 310-b is reached (e.g., writing a logic 1). Upon removing the voltage 325 from the ferroelectric capacitor 240 (e.g., applying a zero net voltage across the terminals of the ferroelectric capacitor 240), the charge state of the ferroelectric capacitor 240 may follow the path 330 shown between the charge state 310-*b* and the charge state 310-*a* at zero voltage across the capacitor. In other words, charge state 310-*a* may represent a logic 1 state at an equalized voltage across a ferroelectric capacitor 240 that has been negatively saturated. In some examples, the voltage 315 and the voltage 325, representing saturation voltages, may have the same magnitude, but opposite polarity across the ferroelectric capacitor 240.

To read, or sense, the stored state of a ferroelectric capacitor 240, a voltage may also be applied across the ferroelectric capacitor 240. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-*a*, or the charge state 310-*a*, or some other charge state was initially stored, among other factors.

The hysteresis plot 300-*b* illustrates an example of access operations for reading stored charge states 305-*a* and 310-*a*. A read voltage 335 may be applied, for example, as a voltage difference via a plate line 220 and a digit line 215 as described with reference to FIG. 2. The hysteresis plot 300-*b* may illustrate read operations where the read voltage 335 is positive voltage difference $V_{cap}$ (e.g., where $V_{plate}-V_{bottom}$ is positive). A positive read voltage across the ferroelectric capacitor 240 may be referred to as a "plate high" read operation, where a plate line 220 is taken initially to a high voltage, and a digit line 215 is initially at a low voltage (e.g., a ground voltage). Although the read voltage 335 is shown as a positive voltage across the ferroelectric capacitor 240, in alternative access operations a read voltage may be a negative voltage across the ferroelectric capacitor 240, which may be referred to as a "plate low" read operation.

The read voltage 335 may be applied across the ferroelectric capacitor 240 while a memory cell 205 is selected (e.g., by activating a switching component 245 via a word line 210 as described with reference to FIG. 2). Upon applying the read voltage 335 to the ferroelectric capacitor 240, charge may flow into or out of the ferroelectric capacitor 240 via the associated digit line 215 and plate line 220, and, in some examples, different charge states or access line voltages may result depending on whether the ferroelectric capacitor 240 was at the charge state 305-*a* (e.g., a logic 0) or at the charge state 310-*a* (e.g., a logic 1), or some other charge state.

When performing a read operation on a ferroelectric capacitor 240 at the charge state 305-*a* (e.g., a logic 0), additional positive charge may accumulate across the ferroelectric capacitor 240, and the charge state may follow path 340 until reaching the charge and voltage of the charge state 305-*c*. The amount of charge flowing through the capacitor 240 may be related to the intrinsic or other capacitance of a digit line 215 (e.g., intrinsic capacitance of the digit line 215, capacitance of a capacitor or capacitive element coupled with the digit line 215, or a combination thereof), or other access line (e.g., a signal line opposite an amplifier, such as a charge transfer sensing amplifier, from a digit line 215). In a "plate high" read configuration, a read operation associated with the charge states 305-*a* and 305-*c*, or more generally a read operation associated with the logic 0 state, may be associated with a relatively small amount of charge transfer (e.g., compared to a read operation associated with the charge states 310-*a* and 310-*c*, or more generally, compared to reading the logic 1 state).

As shown by the transition between the charge state 305-*a* and the charge state 305-*c*, the resulting voltage 350 across the ferroelectric capacitor 240 may be a relatively large positive value due to the relatively large change in voltage at the capacitor 240 for the given change in charge. Thus, upon reading a logic 0 in a "plate high" read operation, the digit line voltage, equal to the difference of a plate line voltage, VPL, and $V_{cap}$ (e.g., $V_{plate}-V_{bottom}$) at the charge state 310-*c*, may be a relatively low voltage. Such a read operation may not change the remnant polarization of the ferroelectric capacitor 240 that stored the charge state 305-*a*, and thus after performing the read operation the ferroelectric capacitor 240 may return to the charge state 305-*a* via path 340 when the read voltage 335 is removed (e.g., by applying a zero net voltage across the ferroelectric capacitor 240, by equalizing the voltage across the ferroelectric capacitor 240). Thus, performing a read operation with a positive read voltage on a ferroelectric capacitor 240 with a charge state 305-*a* may be considered a non-destructive read process. In some cases, a rewrite operation may not be required or may be omitted in such scenarios.

When performing the read operation on the ferroelectric capacitor 240 at the charge state 310-*a* (e.g., a logic 1), the stored charge may or may not reverse polarity as a net positive charge accumulates across the ferroelectric capacitor 240, and the charge state may follow the path 360 until reaching the charge and voltage of the charge state 310-*c*. The amount of charge flowing through the ferroelectric capacitor 240 may again be related to the intrinsic or other capacitance of the digit line 215. In a "plate high" read configuration, a read operation associated with the charge states 310-*a* and 310-*c*, or more generally a read operation associated with the logic 1 state, may be associated with a relatively large amount of charge transfer, or a relatively smaller capacitor voltage, $V_{cap}$ (e.g., compared to a read operation associated with the charge states 305-*a* and 305-*c*, or more generally the logic 1 state).

As shown by the transition between the charge state 310-*a* and the charge state 310-*c*, the resulting voltage 355 may, in some cases, be a relatively small positive value due to the relatively small change in voltage at the capacitor 240 for the given change in charge. Thus, upon reading a logic 1 in a "plate high" read operation, the digit line voltage, equal to the difference of a plate line voltage, VPL, and $V_{cap}$ (e.g., $V_{plate}-V_{bottom}$) at the charge state 310-*c*, may be a relatively high voltage.

The transition from the charge state 310-*a* to the charge state 310-*d* may be illustrative of a sensing operation that is associated with a partial reduction or partial reversal in polarization or charge of a ferroelectric capacitor 240 of a memory cell 205 (e.g., a reduction in the magnitude of charge Q from the charge state 310-*a* to the charge state 310-*d*). In other words, according to the properties of the ferroelectric material, after performing the read operation the ferroelectric capacitor 240 may not return to the charge state 310-*a* when the read voltage 335 is removed (e.g., by applying a zero net voltage across the ferroelectric capacitor 240, by equalizing the voltage across the ferroelectric capacitor 240). Rather, when applying a zero net voltage across the ferroelectric capacitor 240 after a read operation of the charge state 310-*a* with read voltage 335, the charge state may follow path 365 from the charge state 310-*c* to the charge state 310-*d*, illustrating a net reduction in polarization magnitude (e.g., a less positively polarized charge state than initial charge state 310-*a*, illustrated by the difference in charge between the charge state 310-*a* and the charge state 310-*d*). Thus, performing a read operation with a positive read voltage on a ferroelectric capacitor 240 with a charge state 310-*a* may be described as a destructive read process.

In some cases, a rewrite operation (e.g., applying a voltage 325) may be performed after performing such a read operation, which may cause the memory cell to transition from the charge state 310-*d* to the charge state 310-*a* (e.g., indirectly, such as via a charge state 310-*b*). In various examples, such a rewrite operation may be performed after any read operation, or may be selectively performed based on certain circumstances (e.g., when a read voltage is opposite from the write voltage associated with a detected logic state). However, in some sensing schemes, a reduced remnant polarization may still be read as the same stored logic state as a saturated remnant polarization state (e.g., supporting detection of a logic 1 from both the charge state 310-*a* and the charge state 310-*d*), thereby providing a degree of non-volatility for a memory cell 205 with respect to read operations.

In other examples (e.g., when a ferroelectric material is able to maintain polarization in the presence of at least some level of a depolarizing field, when a ferroelectric material has sufficient coercivity, not shown), after performing a read operation the ferroelectric capacitor 240 may return to the charge state 310-*a* when a read voltage is removed, and performing such a read operation with a positive read voltage on a ferroelectric capacitor 240 with a charge state 310-*a* may be described as a non-destructive read process. In such cases, rewrite operations may not be required after such a read operation.

The position of the charge state 305-*c* and the charge state 310-*c* after initiating a read operation may depend on a number of factors, including the specific sensing scheme and circuitry. In some cases, the final charge may depend on the net capacitance of the digit line 215 coupled with the memory cell 205, which may include an intrinsic capacitance, integrator capacitors, and others. For example, if a ferroelectric capacitor 240 is electrically coupled with a digit line 215 initially at 0V and the read voltage 335 is applied to a plate line 220, the voltage of the digit line 215 may rise when the memory cell 205 is selected due to charge flowing from the ferroelectric capacitor 240 to the net capacitance of the digit line 215. Thus, in some examples, a voltage measured at a sense component 250 may not be equal to the read voltage 335, or the resulting voltages 350 or 355, and instead may depend on the voltage of the digit line 215 following a period of charge sharing.

The position of the charge state 305-*c* and the charge state 310-*c* on hysteresis plot 300-*b* upon initiating a read operation may depend on the net capacitance of a digit line 215 and may be determined through a load-line analysis. In other words, the charge states 305-*c* and 310-*c* may be defined with respect to the net capacitance of the digit line 215, or other access line (e.g., a signal line opposite a charge transfer sensing amplifier from the digit line 215). As a result, the voltage of the ferroelectric capacitor 240 after initiating a read operation (e.g., voltage 350 when reading the ferroelectric capacitor 240 that stored the charge state 305-*a*, voltage 355 when reading the ferroelectric capacitor 240 that stored the charge state 310-*a*), may be different and may depend on the initial state of the ferroelectric capacitor 240. In some examples, the amount of change in polarization of a ferroelectric capacitor 240 of a memory cell 205 as a result of a sensing operation may be selected according to a particular sensing scheme. In some examples, sensing operations having a greater change in polarization of a ferroelectric capacitor 240 of a memory cell 205 may be associated with relatively greater robustness in detecting a logic state of a memory cell 205 (e.g., wider sense margins).

The initial state (e.g., charge state, logic state) of the ferroelectric capacitor 240 may be determined by comparing the voltage of a digit line 215, or signal line, where applicable, resulting from the read operation with a reference voltage (e.g., via a reference line 255 as described with reference to FIG. 2). In some examples, the digit line voltage may be the difference between the read voltage 335 and the final voltage across the capacitor 240 (e.g., (read voltage 335—voltage 350) when reading the ferroelectric capacitor 240 having a stored charge state 305-*a*, (read voltage 335—voltage 355) when reading the ferroelectric capacitor 240 having a stored charge state 310-*a*). In some examples, the digit line voltage may be the sum of the plate line voltage and the final voltage across the ferroelectric capacitor 240 (e.g., voltage 350 when reading the ferroelectric capacitor 240 having a stored charge state 305-*a*, or voltage 355 when reading the ferroelectric capacitor 240 having a stored charge state 310-*a*).

In some examples, read operations of a memory cell 205 may be associated with a fixed voltage of a digit line 215, where a charge state of a ferroelectric capacitor 240 after initiating a read operation may be the same regardless of its initial charge state. For example, in a read operation where a digit line 215 and plate line 220 are held at a fixed relative voltage that supports the read voltage 335, the ferroelectric capacitor 240 may proceed to a charge state 370 for both the case where the ferroelectric capacitor initially stored a charge state 305-*a* and the case where the ferroelectric capacitor initially stored a charge state 310-*a*. Accordingly, rather than using a difference in voltage of a digit line 215 to detect an initial charge state or logic state, in some examples, the initial charge state or logic state of the ferroelectric capacitor 240 may be determined based at least in part on the difference in charge associated with the read operation. For example, as illustrated by hysteresis plot 300-*b*, a logic 0 may be detected based on difference in charge, Q, between charge state 305-*a* and charge state 370 (e.g., a relatively small amount of charge transfer), and a logic 1 may be detected based on a difference in charge, Q, between charge state 310-*a* and charge state 370 (e.g., a relatively large amount of charge transfer).

In some examples, such a detection may be supported by a charge-transfer sensing amplifier, a cascode (e.g., a transistor configured in a cascode arrangement), or other signal development circuitry between a digit line 215 and a signal line that is coupled with a sense amplifier, where a voltage of the signal line may be based at least in part on the amount of charge transfer of a capacitor 240 after initiating a read operation (e.g., where the described charge transfer may correspond to an amount of charge that passes through the charge-transfer sensing amplifier, cascode, or other signal development circuitry). In such examples, the voltage of the signal line may be compared with a reference voltage (e.g., at a sense component 250) to determine the logic state initially stored by the ferroelectric capacitor 240, despite the digit line 215 being held at a fixed voltage level.

In some examples where a digit line 215 is held at a fixed read voltage 335, a capacitor 240 may be positively saturated after a read operation irrespective of whether the capacitor 240 was initially at a charge state 305-*a* (e.g., a logic 0) or initially at a charge state 310-*a* (e.g., a logic 1). Accordingly, after such a read operation, the capacitor 240 may, at least temporarily, be charged or polarized according to a logic 0 state irrespective of its initial or intended logic state. Thus, a rewrite operation may be required at least when the capacitor 240 is intended to store a logic 1 state, where such a rewrite operation may include applying a write voltage 325 to store a logic 1 state as described with reference to hysteresis plot 300-a. Such rewrite operations may be configured or otherwise described as a selective rewrite operation, since a rewrite voltage may not need to be applied when the capacitor 240 is intended to store a logic 0 state. In some examples, such an access scheme may be referred to as a "2Pr" scheme, where the difference in charge for distinguishing a logic 0 from a logic 1 may be equal to two times the remnant polarization of a memory cell 205 (e.g., a difference in charge between charge state 305-a, a positively saturated charge state, and charge state 310-a, a negatively saturated charge state).

In some sensing schemes, a reference voltage may be generated such that the reference voltage is between the possible voltages (e.g., of a digit line 215, of a signal line) that may result from reading different logic states. For example, a reference voltage may be selected to be lower than the resulting voltage of a digit line 215 or signal line when reading a logic 1, and higher than the resulting voltage of the digit line 215 or signal line when reading a logic 0, or vice versa depending on the convention used. In other examples, a comparison may be made at a portion of a sense component 250 or related sense amplifier that is different from a portion where a digit line 215 or signal line is coupled, and therefore a reference voltage may be selected to be lower than the resulting voltage at the comparison portion of the sense component 250 or related sense amplifier when reading a logic 1, and higher than the resulting voltage at the comparison portion of the sense component 250 or sense amplifier when reading a logic 0. During comparison by the sense component 250 or sense amplifier, the voltage based on the sensing may be determined to be higher or lower than the reference voltage, and the stored logic state of the memory cell 205 (e.g., a logic 0, a logic 1) may thus be determined.

During a sensing operation, the resulting signals from reading various memory cells 205 may be a function of manufacturing, operational, or other variations between the various memory cells 205. For example, capacitors 240 of various memory cells 205 may have different levels of capacitance, saturation polarization, or coercivity, so that a logic 0 may be associated with different levels of charge from one memory cell 205 to the next, and a logic 1 may be associated with different levels of charge from one memory cell 205 to the next. Further, intrinsic or other capacitance may vary from one digit line 215 to another digit line 215 in a memory device 110, or from one signal line to another signal line, and may also vary within a digit line 215 from the perspective of one memory cell 205 to the next memory cell 205 on the same digit line 215. Thus, for these and other reasons, reading a logic 0 may be associated with different levels of voltage of a digit line 215 or a signal line from one memory cell 205 to the another (e.g., resulting voltage 350 may vary from reading one memory cell 205 to the next), and reading a logic 1 may be associated with different levels of voltage from one memory cell 205 to another (e.g., resulting voltage 355 may vary from reading one memory cell 205 to the next).

In some examples, a default reference voltage may be provided between a statistical average of voltages associated with reading a logic 0 and a statistical average of voltages associated with reading a logic 1, but the reference voltage may be relatively closer to the resulting voltage of reading one of the logic states for any given memory cell 205. The minimum difference between a resulting voltage of reading a particular logic state (e.g., as a statistical value for reading a plurality of memory cells 205 of a memory device) and an associated level of a default reference voltage may be referred to as a "minimum read voltage difference" or a "read margin," and having a low minimum read voltage difference or read margin may be associated with difficulties or sensitivities in reliably sensing the logic states of memory cells 205 in a given memory device 110 or memory die 200.

The examples of hysteresis plots 300-a and 300-b may be illustrative of an equalized or normalized behavior of a memory cell 205 including a ferroelectric capacitor 240 when subjected to a write pulse or a read pules. However, based on various operating or environmental conditions, ferroelectric capacitors 240 may become imprinted with a particular logic state, which may refer to various conditions where a ferroelectric capacitor 240 becomes predisposed toward storing one logic state over another, resistant to being written to a different logic state (e.g., a logic state different than a stored logic state prior to a write operation), or both. For example, as compared with the hysteresis plots 300-a and 300-b, an imprinted ferroelectric capacitor 240 may be associated with a higher coercivity (e.g., with respect to changing or inverting a polarization state), a reduced saturation polarization, a shallower slope of polarization, or other characteristics that may be asymmetric with respect to different logic states. Memory arrays having imprinted ferroelectric capacitors 240 may be associated with read errors, write errors, or other behaviors that can impair operations of a memory device, or a system that includes a memory device. In accordance with examples as disclosed herein, imprinted ferroelectric capacitors 240 may be recovered (e.g., unimprinted, unstuck, repaired, normalized, equalized) using various imprint recovery or repair processes.

Figure 4A:
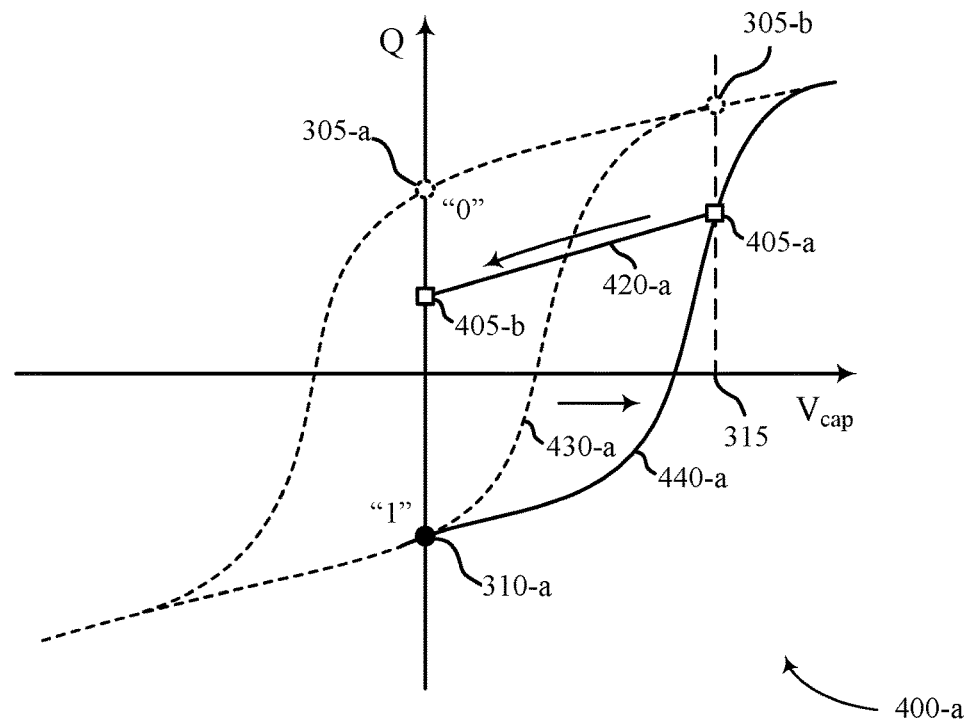
FIGS. 4A and 4B illustrate examples of non-linear electrical properties of imprinted ferroelectric memory cells with hysteresis plots in accordance with various examples as disclosed herein.
Figure 4B:
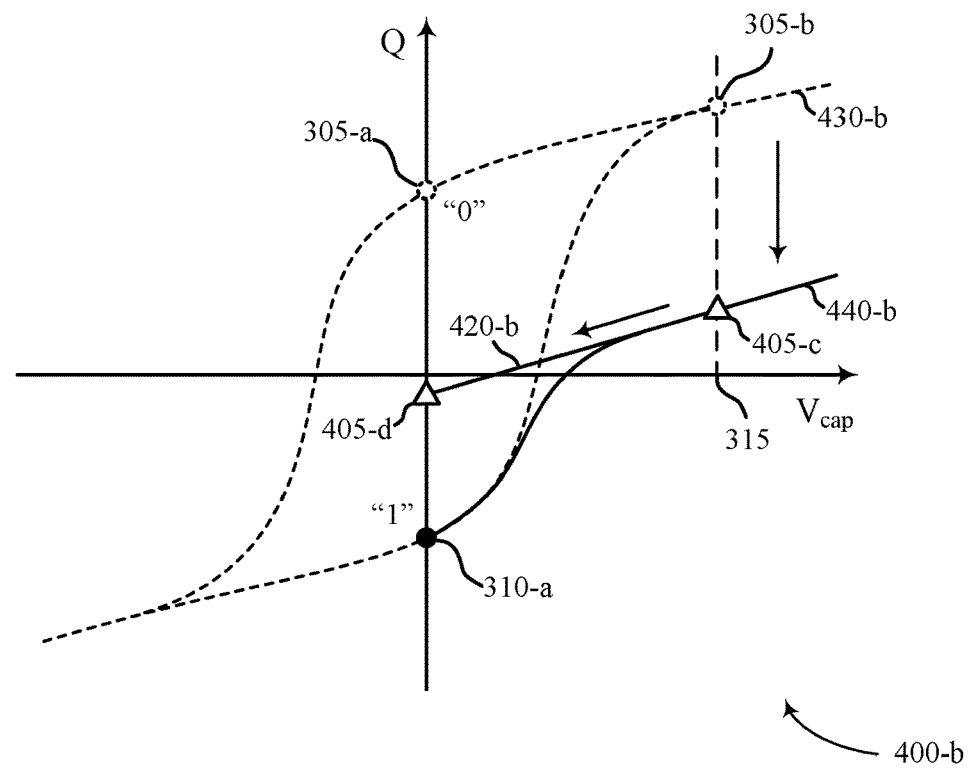

FIGS. 4A and 4B illustrate examples of non-linear electrical properties of imprinted ferroelectric memory cells with hysteresis plots 400-a and 400-b in accordance with various examples as disclosed herein. Hysteresis plots 400-a and 400-b illustrate examples of characteristics of a ferroelectric capacitor 240 that may shift as a result of imprinting with a logic state or charge state (e.g., an imprinting with a logic 1, an imprinting with a charge state 310-a), which may be related to an alteration of configuration of electrostatic domains in a ferroelectric memory cell 205. For example, the shifted characteristics of the hysteresis plots 400-a and 400-b, illustrated by imprinted hysteresis curves 440, may result from conditions where a ferroelectric capacitor 240 has maintained a charge state for a relatively long duration, or under relatively high temperature conditions, or both (e.g., under static bake conditions).

FIG. 4A illustrates an example of a shift from an unimprinted hysteresis curve 430-a to an imprinted hysteresis curve 440-a, which may correspond to a shift in coercivity of a ferroelectric capacitor 240. In some examples, a shift in coercivity to the imprinted hysteresis curve 440-a may be associated with an increased resistance to changing polarization during a write operation, such as a collective increase of resistance of domains from changing polarization state (e.g., where domains are able to have their polarization reversed, but where such a reversal collectively requires a relatively higher voltage bias).

For example, according to the hysteresis plot 400-a, when an imprinted ferroelectric capacitor 240 storing a charge state 310-a is biased with a voltage 315 (e.g., a write bias associated with writing a logic 0, as described with reference to FIG. 3A), charge may accumulate until the charge state 405-a is reached. However, compared with the charge state 305-b, which may correspond to a saturated condition of an equalized or normalized ferroelectric capacitor 240 where polarization of the ferroelectric capacitor is fully reversed, the charge state 405-a may not correspond to a saturated condition, and instead may illustrate an example of a partial polarization reversal in response to the write voltage 315. Upon removing the voltage 315 from the ferroelectric capacitor 240 (e.g., applying a zero net voltage across the terminals of the ferroelectric capacitor 240), the charge state of the ferroelectric capacitor 240 may follow the path 420-a shown between the charge state 405-a and the charge state 405-b at zero voltage across the capacitor.

In various examples, the charge state 405-b may have a lower charge than the charge state 305-a (e.g., a charge state of an unimprinted memory cell 205 corresponding to a logic 0). Although the illustrative example of hysteresis plot 400-a illustrates the charge state 405-b as having a net charge, Q, that is positive, under various circumstances (e.g., various imprint severity, various degrees of coercivity shift, various degrees of polarization reversal among a set of domains of a memory cell 205 or ferroelectric capacitor 240), a net charge of a charge state 405-b may have a positive or negative value. Accordingly, under various circumstances, such a charge state may be illustrative of storing a logic 0 or a logic 1, or may be illustrative of a charge state that may be read by a memory device as storing a logic 0 or a logic 1. In other words, as a result of the shift from unimprinted hysteresis curve 430-a to imprinted hysteresis curve 440-a, applying the voltage 315 to an imprinted memory cell may or may not successfully write a ferroelectric capacitor imprinted with a logic 1 to a logic 0, or may not support the ferroelectric capacitor being successfully read as a logic 0.

FIG. 4B illustrates an example of a shift from an unimprinted hysteresis curve 430-b to an imprinted hysteresis curve 440-b, which may illustrate a shift or collapse in saturation polarization, or polarization capacity, of a ferroelectric capacitor 240. In some examples, a shift or collapse to the imprinted hysteresis curve 440-a may be associated with an inability of some domains in a ferroelectric capacitor to have their polarization reversed during a write operation (e.g., where certain domains are frozen or stuck in a polarization state). In some examples, the coercivity of domains that are able to have their polarization reversed may be substantially the same or similar to the coercivity of domains in an unimprinted state, but the capacity for polarization reversal (e.g., at a saturation voltage or biasing) may be diminished. In other examples, such an imprinting may also be accompanied with aspects of a shift in coercivity for those domains that are able to have their polarization reversed (e.g., as described with reference to FIG. 4A).

For example, according to the hysteresis plot 400-b, when an imprinted ferroelectric capacitor 240 storing a charge state 310-a is biased with a voltage 315 (e.g., a write bias associated with writing a logic 0, as described with reference to FIG. 3), charge may accumulate until the charge state 405-c is reached. However, compared with the charge state 305-b, which may correspond to a saturated condition of an unimprinted (e.g., equalized or normalized) ferroelectric capacitor 240 where polarization of the ferroelectric capacitor is fully reversed, the charge state 405-c may correspond to an effectively saturated condition of a ferroelectric capacitor having a diminished capacity for polarization reversal, or an inability to support polarization reversal, in response to the write voltage 315. Upon removing the voltage 315 from the ferroelectric capacitor 240 (e.g., applying a zero net voltage across the terminals of the ferroelectric capacitor 240), the charge state of the ferroelectric capacitor 240 may follow the path 420-b shown between the charge state 405-c and the charge state 405-d at zero voltage across the capacitor.

In various examples, the charge state 405-d may have a lower charge than the charge state 305-a (e.g., a charge state of an unimprinted memory cell 205 corresponding to a logic 0). Although the illustrative example of hysteresis plot 400-b illustrates the charge state 405-b as having a net charge, Q, that is negative, under various circumstances (e.g., various imprint severity, various degrees of polarization immobility among a set of domains of a memory cell 205 or ferroelectric capacitor 240), a net charge of a charge state 405-d may have a positive or negative value. Accordingly, under various circumstances, such a charge state may be illustrative of storing a logic 0 or a logic 1, or may be illustrative of a charge state that may be read by a memory device as storing a logic 0 or a logic 1. In other words, as a result of the shift from unimprinted hysteresis curve 430-b to imprinted hysteresis curve 440-b, applying the voltage 315 to an imprinted memory cell may or may not successfully write a ferroelectric capacitor imprinted with a logic 1 to a logic 0, or may not support the ferroelectric capacitor being successfully read as a logic 0.

Although the hysteresis plots 400-a and 400-b illustrate simplified examples of mechanisms that may be related to imprinting in a ferroelectric capacitor 240, other mechanisms or conditions, or combinations thereof, may be associated with memory cell imprint. For example, a memory cell imprinted with a logic 1 may or may not be associated with a charge state 310-a as described with reference to FIGS. 3A, 3B, 4A, and 4B, and may have a different charge state after imprinting (e.g., due to charge degradation during imprint, due to saturation polarization collapse of an imprinted logic state or charge state during imprint itself, due to charge leakage, due to a change in saturation polarization that may change or reduce a charge state 310-a when rewritten with a logic 1 state). In another example, imprint may change (e.g., widen) a distribution of polarization reversal voltages across a set of domains in a ferroelectric capacitor 240, which may be associated with a shallower slope of Q versus $V_{cap}$ between one polarization state and another (e.g., across a polarization reversal region), which may or may not be accompanied by a collective shift in coercivity or a change in polarization reversal capacity (e.g., as described with reference to FIGS. 4A and 4B). In some examples, imprinting in a ferroelectric capacitor 240 may be associated with other phenomena, or various combinations of these and other phenomena.

In some cases, imprint of a ferroelectric memory cell 205 (e.g., as illustrated by FIG. 4A or FIG. 4B, or otherwise) may be driven by local electrostatic interaction in the memory cell 205 that prevents domains (e.g., charge domains) from remaining in a written state. An imprinted memory cell 205 may, for example, be capable of changing its charge state or polarization state when an appropriate write bias is applied. However, the memory cell 205 may return to an imprinted charge state or polarization state when a write bias is removed, which may be referred to as backswitching, drop, or recoil. Thus, it may be desirable to perform an imprint recovery operation (e.g., in a repair mode, in a maintenance mode, in a recovery mode) to normalize or equalize memory cells in a memory device to resolve or mitigate such effects (e.g., to return charge mobility of a memory cell 205 to a normalized or equalized state, to return to an unimprinted hysteresis curve 430, to restore a remnant polarization capacity, to normalize or equalize coercivity).

In some examples, imprint recovery may be supported by holding a memory cell 205 in an opposite state (e.g., opposite from an imprinted state) over a long enough duration to alter the local electrostatic configuration that is causing a memory cell to revert to the imprinted state. For example, recovery may be aided by time under applied bias and charge state switching (e.g., bias switching, charge switching, polarization switching).

Regarding time under bias, mobile charged defects may change configuration within a memory cell 205 in alignment with the applied bias, which may also be aligned with an intended polarization state. In some examples, such a process may scale with total cumulative time under bias. However, the time under bias may only be beneficial if the internal electric field aligns with the applied electric field. For example, significant buildup of local charge within a memory cell 205 may screen an applied field and prevent a local reconfiguration of defects in some parts of the memory cell 205. Although unipolar (e.g., non-switching, non-cycling) bias can be used to support imprint recovery, and have certain advantages, cycling methods may be more effective in some examples.

Regarding charge state switching, in some examples, repeatedly switching an applied bias may provide repeated opportunities for domains within the memory cell 205 to undergo a stochastic switching event. For example, for domains that, according to a probability distribution, may or may not undergo a polarization switching event at a given voltage or bias, a repeated charge switching may provide more opportunities for such a domain to switch polarization, enhancing a probability that such a switching will actually occur. In some examples, state or bias switching may also raise an internal temperature of a memory cell 205 cell, which may further enhance defect or domain mobility. Accordingly, both an increase in temperature and repeated opportunities for repolarization may aid imprint recovery of a memory cell 205.

Mechanisms such as these may contribute to phenomena that may be referred to as "wakeup" or "recovery" from an as-processed (time zero, initial, starting) imprint state of a memory cell 205. Such mechanisms may also contribute to recovery from fatigue, which may be related to charge domains that are symmetrically not participating in a polarization switching process (e.g., not participating in polarization switching whether switching from a logic 0 polarization to a logic 1 polarization or switching from a logic 1 polarization to a logic 0 polarization). In some examples, fatigue recovery may be driven by "waking up" domains within a cell that had not previously been participating in polarization switching. Since fatigue may be defined as loss of polarization signal induced by repeated switching of a polarization state, recovery from fatigue may rely on variation in an applied bias (e.g., higher bias or longer pulses compared with typical or initial operating conditions).

Although certain aspects of memory cell imprint are described with reference to ferroelectric memory applications, imprint management in accordance with the present disclosure may also be applicable to other memory technologies that undergo drift or other shifts in characteristics that may be asymmetric with respect to different logic states. For example, material memory elements, such as phase change, resistive, or thresholding memories may undergo material segregation or immobilization as a result of memory cell imprint (e.g., as a result of storing a logic state over a duration, as a result of storing a logic state at an elevated temperature, where such effects may be associated with (e.g., asymmetrically associated with, drift towards) storing or reading a particular logic state over another. In some examples, memory cells 205 in such applications that are imprinted may be associated with an increased resistance to changing from one configurable material property or characteristic to another, which may correspond to such phenomena as a relatively greater resistance to changes from one threshold voltage to another, a relatively greater resistance to changes from one electrical resistance to another, and other characteristics.

In various examples, an imprint recovery operation, which may include signal or pulse cycling or time under bias, or cycling of access operations, may normalize or equalize characteristics of material memory elements, such as normalizing or equalizing material distributions, moving defects to one end or another, distributing defects more evenly through a cell, or mobilizing a material memory element to undergo atomic reconfiguration. For example, in certain phase change memory applications, imprint recovery may selectively apply aspects of a seasoning step in accordance with various techniques for imprint management described herein.

Figure 5:
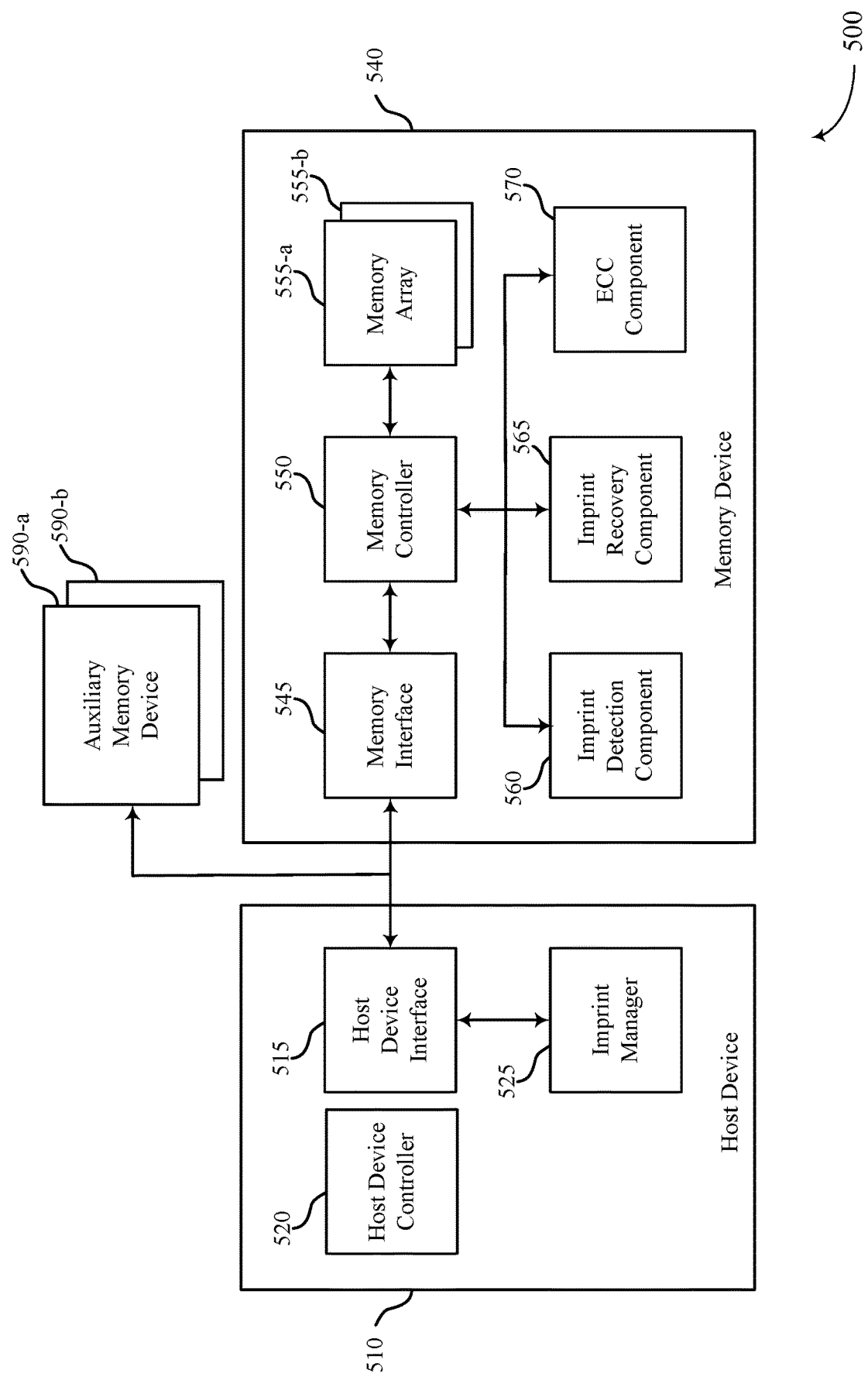
FIG. 5 illustrates an example of a system that supports imprint management for memory systems in accordance with examples as disclosed herein.

FIG. 5 illustrates an example of a system 500 that supports imprint management for memory systems in accordance with examples as disclosed herein. The system 500 may include one or more components described with reference to FIGS. 1 through 4, among others. For example, the system 500 may include a host device 510 and a memory device 540. In some examples, the system 500 may also include one or more auxiliary memory devices 590, which in various examples may include a memory device with the same or similar functionality as the memory device 540, or may be a memory device with different configurations or characteristics. For example, auxiliary memory devices 590 may include memory devices configured to provide additional storage capacity to the host device 510, redundant memory devices for redundant or backup information storage, memory devices having different degrees of access speed or nonvolatility, memory devices having different storage architectures, memory devices arranged or configured with different roles in a memory hierarchy, and others.

In some cases, one or more memory cells of the memory arrays 555 (e.g., memory cells 205 described with reference to FIG. 2) may become imprinted or may be otherwise vulnerable to imprinting, which may refer to various conditions where a memory cell becomes predisposed toward storing one logic state over another, resistant to being written to a different logic state (e.g., a logic state different than a logic state stored prior to a write operation), or both. In some examples, imprinting itself may degrade or destroy logic states stored at a memory cell, but such effects may not directly cause problems with the operation of the system 500. For example, imprinting may occur while the system 500 is powered down or inactive, but the system 500 may not be configured to rely on the memory device 540 to provide non-volatile data storage. However, upon powering or booting the system 500, for example, the host device 510 may attempt to write data to the memory device 540 (e.g., transferring data from a non-volatile storage, such as a non-volatile auxiliary memory device 590 such as a hard drive or flash memory device, as part of a boot operation, as a BIOS-level operation, as part of or prior to loading an operating system), and such write operations may not be successful as a result of the imprinted state of the memory arrays 555. In other words, in some examples or configurations, ongoing basic operation (e.g., writing and reading) of imprinted memory cells may be more problematic than a loss of information associated with the imprinting itself.

In accordance with various examples of the described techniques, components of the system 500 may be configured to perform various operations to detect, infer, mitigate, inhibit, or recover from such imprinting, which may increase the robustness, accuracy, or efficiency with which the memory device 540, the host device 510, or the system 500 as a whole, can operate in the presence of conditions associated with memory cell imprinting. For example, the memory device 540, the host device 510, or both may perform various operations to detect a presence of imprint in the memory arrays 555, or infer a likelihood of such imprint, and the memory device 540 may accordingly be configured to perform various operations on the memory arrays 555 in response to such a detection or inference. Imprint recovery procedures such as those described herein may include various memory cell biasing or accessing techniques that are particularly initiated or modified to accelerate an equalization or normalization of imprinted memory cells that may exhibit asymmetric behavior with respect to different logic states. In some cases, the described techniques may also consider various aspects of data preservation or operational integrity, including various signaling, data transfer, or operational management between the host device 510, the memory device 540, and any auxiliary memory devices 590.

The described techniques for imprint management may employ various distributions of detections, calculations, evaluations, and operations between the memory device 540 and the host device. In some examples, the memory device 540 may include chip-level or transistor-level circuitry (e.g., of a local memory controller 265, of a device memory controller 155, of a local memory controller 165) configured to support various imprint management techniques. Additionally, or alternatively, the memory device 540 may include an onboard processor or integrated processor (e.g., a RAM-integrated processor, a processor of a RAM-integrated controller), coupled with associated memory dies, configured or programmed to support various imprint management techniques. Additionally, or alternatively, the host device 510 may include a processor, a controller, or other circuitry configured or programmed to support various imprint management techniques, which may include various signaling to or from the memory device 540 or any auxiliary memory devices 590.

In some examples, one or more components of the system 500 may be configured to characterize a severity (e.g., magnitude, degree) of imprinting or a directionality (e.g., whether imprinting is more heavily associated with or more sensitive to one logic state or another, whether imprinting is asymmetric) and perform imprint recovery operations that are scaled or selected according to the characterized severity or direction. Additionally, or alternatively, imprint recovery operations may be tailored by the system 500 to particular operating conditions of the memory device 540, of the host device 510, or of the system 500 as a whole, such as an operational mode or environmental condition, which, in some examples, may be based at least in part on signaling or operational negotiation between the memory device 540 and the host device 510. Additionally, or alternatively, imprint recovery operations may be based on various operational modes, permissions, approvals, or inhibiting, which may be based at least in part on signaling or operational negotiations between the memory device 540 and the host device 510.

The host device 510 may be an example of a host device or an external memory controller 105 as described with reference to FIG. 1, or any combination thereof. The host device may include a host device interface 515, a host device controller 520, and an imprint manager 525. Although the host device interface 515, the host device controller 520, and the imprint manager 525 are illustrated as being separate components, one or more of the described components, or portions thereof, may collectively or generally described as a component, controller, processor, or circuitry configured to perform various techniques described herein.

The host device interface 515 may be an example of, or may otherwise be associated with, one or more channels 115 as described with reference to FIG. 1. For example, the host device interface 515 may include a transceiver that supports bidirectional signaling or communications, such as commands, status indications, data, and other information with the memory device 540 (e.g., with the memory interface 545). In some examples, the host device interface 515 may also supply power to the memory device 540 (e.g., from a battery of the host device 510, from a power supply of the host device 510, from a power source wired to the host device 510).

The host device controller 520 may be a processing element of the host device 510 that exchanges information (e.g., application data, user data) with the memory device 540. For example, the host device controller 520 may issue read commands and receive data from the memory device 540 in response to the read command, or the host device controller 520 may issue write commands to the memory device 540 that are accompanied by or are otherwise associated with write data provided to the memory device 540. The host device controller 520 may also control various other aspects of the operation of the host device 510. For example, the host device controller 520 may manage various operational modes or configurations of the host device 510, may control various information or control signaling between the host device 510 and the memory device 540, or control various operations of the host device 510 in response to signaling from the memory device 540.

The imprint manager 525 may be configured to perform various operations related to imprint detection or imprint recovery described herein, or to control or modify other operations of the host device 510 that are otherwise related to imprint management of the memory device 540. In some examples, such an approach may support offloading aspects of imprint management from the memory device 540 to the host device 510, which may support relatively lean memory architectures (e.g., with relatively limited onboard processing capability or performance), enable relatively sophisticated techniques to be supported by enhanced capabilities of the host device 510, and other benefits.

In some examples, the imprint manager 525 may detect various conditions (e.g., temperature, time, a failure of the host device 510, an access pattern that inadvertently or maliciously may cause imprint, a blue screen event) that may be related to possible imprinting of a memory array 555. In response to such detections, the imprint manager 525 may issue a command to the memory device 540 to perform an imprint detection procedure (e.g., for the memory device 540 to directly evaluate whether a memory array 555 has been imprinted), or issue a command to the memory device 540 to perform an imprint recovery procedure (e.g., regardless of whether imprint has been detected by the memory device 540). In some examples, such commands may be accompanied by information used to trigger such commands, an indication of a detected severity of conditions, an indication of conditions that may be used by the memory device 540 to identify or select an imprint recovery procedure, or an indication of how aggressively imprint recovery should be performed. In some examples, the imprint manager 525 may support selecting an imprint recovery method based on system state, user demand, or other parameters, and may indicate a selection to the memory device 540, or may provide information to the memory device 540 so that the memory device 540 can make such a selection.

In some examples, the imprint manager 525 may authorize or approve the memory device 540 entering a recovery mode, which may or may not support ongoing data operations (e.g., read operations, write operations, data exchange between the host device 510 and the memory device 540) during the recovery mode. In some examples, the imprint manager 525 may receive an indication that the memory device 540 is performing recovery operations, and may suspend access operations with the memory device 540 or may perform access operations with the memory device 540 according to a slower rate or otherwise degraded or lower-performing mode. In some examples, the imprint manager 525 may refuse a request by the memory device 540 to perform imprint detection or recovery operations, or may otherwise inhibit or disallow such operations (e.g., when the host device 510 is operating according to a mode that requires certain performance from the memory device 540, when the memory device 540 may perform such operations by default but the host device 510 has an understanding that such operations can be disabled).

In some examples, the imprint manager 525 may receive an indication from the memory device 540 that a memory array 555 is or may be imprinted, and the imprint manager 525 may issue or initiate (e.g., via the host device controller 520) a pattern of access commands that are particularly configured to alleviate imprint of the memory array 555. For example, in response to such an indication of detected or inferred imprint of a memory array, the imprint manager 525 may issue read, write, or refresh commands associated with patterns of logic states, such as cycling or alternating write operations between solid patterns of logic states or other patterns of logic states (e.g., according to alternating logic states, according to alternating checkerboard patterns, according to inverted writeback operations).

The system may also include a memory device 540, which may be an example of the memory device 110, the memory dice 160, or the memory die 200 as described with reference to FIGS. 1 and 2. The memory device 540 may include a memory interface 545, a memory controller 550, one or more memory arrays 555 (e.g., memory array 555-a and memory array 555-b), an imprint detection component 560, an imprint recovery component 565, and an error correction code (ECC) component 570. Although the memory interface 545, the memory controller, the imprint detection component 560, the imprint recovery component 565, and ECC component 570 are illustrated as being separate components, one or more of the described components, or portions thereof, may collectively or generally described as a component, controller, processor, or circuitry configured to perform various techniques described herein.

The memory interface 545 may be an example of, or otherwise be associated with, one or more channels 115 as described with reference to FIG. 1. For example, the memory interface 545 may include a transceiver that supports bidirectional signaling or communications, such as commands, status indications, data, and other information with the host device 510 (e.g., with the host device interface 515). In some examples, the memory interface 545 may also receive power from the host device 510.

The memory controller 550 may be a processing element of the memory device 540 that exchanges information (e.g., application data, user data) with the host device 510. For example, the memory controller 550 may receive read commands and transmit responsive data to the host device 510 in response to the read command, or the memory controller 550 may receive write commands from the host device 510 that are accompanied by or are otherwise associated with write data provided from the host device 510. The memory controller 550 may also control various other aspects of the operation of the memory device 540. For example, the memory controller 550 may manage various operational modes or configurations of the memory device 540, may control various information or control signaling between the memory device 540 and the host device 510, or control various operations of the memory device 540 in response to signaling from the host device 510.

In some examples, the memory controller 550 may receive the commands from the memory interface 545, process the commands, and execute the commands (e.g., by interacting with the memory arrays 555 or other aspects of the memory device 540). The memory controller 550 may be configured in various manners, and may be an example of, or otherwise include, or refer to functionality of a device memory controller 155, a local memory controller 165, a local memory controller 265, or a combination thereof. In some examples, the memory controller 550 may include hardware or circuitry (e.g., transistor-level circuitry) configured for various techniques of combinatorial logic, or may be a separate processing component or chip of the memory device 540 that interfaces with the memory arrays 555.

The memory arrays 555 may be examples of the memory arrays 170 as described with reference to FIGS. 1 and 2. In some examples, the memory arrays 555 may include an array of memory cells 205 comprising ferroelectric capacitors as respective memory storage elements. However, the described techniques for imprint management may be performed using other types of memory arrays 555, such as memory arrays having material memory elements that store a logic state based on a variable and configurable material property.

The imprint detection component 560 may be configured to perform various operations to detect or predict a presence of memory cell imprint in the memory arrays 555. In some examples, the imprint detection component 560 may operate independently of an imprint manager 525, or in the absence of an imprint manager 525, to support various techniques for imprint detection within the memory device 540. For example, the imprint detection component 560 may operate autonomously without coordinating imprint detection techniques with the host device 510 (e.g., using on-die or otherwise integrated circuitry or processing capability of the memory device 540). In some examples, such an approach may be beneficial for imprint detection techniques that benefit from a deeper understanding of chip-level conditions or other relatively direct understanding of operating conditions (e.g., without being required to convey such an understanding to the host device), and may support the memory device 540 being agnostic to different types or capabilities of different host devices. In other examples, the imprint detection component 560 may operate based on signaling exchanged with the imprint manager 525 in a coordinated imprint management system, which may support imprint management coordination between the host device 510 and the memory device. In some examples, such an approach may support offloading aspects of imprint management from the memory device 540 to the host device 510, which may support relatively lean memory architectures (e.g., with relatively limited onboard processing capability or performance), enable relatively sophisticated techniques to be supported by enhanced capabilities of the host device 510, and other benefits.

The imprint detection component 560 may support various detections that support a selective or scaled application of imprint recovery techniques. For example, although certain aspects of imprint recovery may be generally beneficial to the memory device, performing a recovery procedure may take some amount of time or other system resources, which may affect performance or operation of the memory device 540 or the host device 510. In some examples, imprint recovery techniques may have detrimental effects, such as an acceleration of fatigue or other wear out mechanisms that need to be balanced with a presence or susceptibility for imprint. Thus, for these and other reasons, it may be preferable to selectively perform recovery procedures based on a detected or inferred presence of imprint, or selectively inhibit recovery procedures based on a detected or inferred absence of imprint. Accordingly, the imprint detection component 560 may be configured to support determining when to perform a recovery procedure, which may provide efficiency and reliability benefits, among other benefits that may be appreciated by those of ordinary skill in the art.

In some examples, the imprint detection component 560 may perform or manage (e.g., cause the memory device 540 to perform, cause the imprint detection component 560 to perform) one or more imprint detection procedures to determine whether the memory arrays 555 and/or memory cells of the of the memory arrays 555 are functioning within one or more specifications (e.g., whether to perform a recovery operation). In some cases, the imprint detection component 560 may determine that the memory arrays 555 are operating within one or more specifications and send an indication to another component of the memory device 540 or to the host device 510 that the memory device 540 is operating properly. In other cases, the imprint detection component 560 may determine that the memory arrays 555 are not or may not be operating within one or more specifications (e.g., that imprint has occurred, that imprint has been detected, that imprint has been predicted), and may initiate a recovery procedure. The imprint detection component 560 may perform imprint detection procedures (e.g., autonomously, or in response to a command from the host device 510) on a scheduled (e.g., periodic) or event-driven basis (e.g., in response to detecting one or more trigger events).

In some examples, imprint detection component 560 may detect various conditions (e.g., temperature, time, a failure of the memory device 540, an access pattern that inadvertently or maliciously may cause imprint) that may be related to possible imprinting of a memory array 555. In response to such detections, the imprint detection component 560 may issue a command to the imprint recovery component 565 to initiate recovery operations, or may trigger further (e.g., more deterministic, more sophisticated) aspects of imprint detection by the imprint detection component. In some examples, such commands or triggering may be accompanied by information used to initiate or scale operations, an indication of a detected severity of conditions, an indication of conditions that may be used by the imprint recovery component 565 to select an imprint recovery procedure, or an indication of how aggressively imprint recovery should be performed. In some examples, the imprint detection component 560 may indicate (e.g., to the imprint recovery component 565, to the memory controller 550) one or more sections of the memory arrays 555 for which to perform the imprint detection procedure.

In some examples, the imprint detection component 560 may support the imprint recovery component 565 selecting an imprint recovery method based on system state, user demand, or other parameters, such as providing information to the imprint recovery component 565 so that the imprint recovery component 565 can make such a selection. In some examples, the imprint detection component 560 may provide such information to the imprint manager 525 so that the imprint manager 525 can make such a selection.

In some examples, the imprint detection component 560 may signal a presence or prediction of imprint in a memory array 555 to the host device 510, which may indicate or be otherwise interpreted as a request that the host device 510 initiate a recovery operation, a request that the host device 510 approve a recovery operation (e.g., signaling approval for the imprint recovery component 565 to proceed with imprint recovery), an indication that the memory device 540 will be or is undergoing a recovery operation, an indication that the memory device 540 may or will be temporarily unavailable for access operations, or may be available for access operations at a reduced rate or performance, and other interpretations.

In some cases, the imprint detection component 560 may autonomously (e.g., unilaterally, without an explicit command from the host device 510) determine to perform an imprint detection procedure, which may be associated with the memory device 540 proactively or preemptively performing detection or recovery operations (e.g., in a set of operations that are transparent to the host device 510). In some examples, the imprint detection component 560 may determine to perform an imprint detection procedure in response to a command received from the host device 510 (e.g., from the imprint manager 525). In some cases, the command may be received by the memory device 540 as part of an activation procedure (e.g., as part of a boot or initialization signaling).

In some examples, the imprint detection component 560 may perform detection operations as part of a boot process (e.g., as part of a power on self-test (POST)), an initialization of the memory device 540 (e.g., a first powering of the memory device 540), or other operational conditions. In some examples, the imprint detection component 560 may perform such operations before loading data to the memory arrays 555 (e.g., prior to loading an operating system), which may include inhibiting or caching access commands from the host device 510. In some examples, the imprint detection component 560 may perform detection operations while data is stored in the memory arrays 555, and the imprint detection component 560 may support various coordination with the host device 510 or other components of the memory device 540 to support various data preservation, redundancy, or integrity techniques described herein.

The imprint detection component 560 may support various techniques for determining a presence or likelihood of imprint in the memory arrays 555. For example, the imprint detection component 560 may have knowledge that the arrays 555 are storing logic states that may be imprinted, and detect or monitor temperatures or durations that may be indicative of a static bake. In another example, the imprint detection component may monitor access operations (e.g., performed by the memory controller 550), and may be configured to detect inadvertent or malicious access conditions that could lead to imprint, such as adverse access patterns, adverse biasing, or other conditions that may be related to asymmetrically altering memory cells in the memory arrays 555 with respect to different logic states. Thus, the imprint detection component 560 may be configured to support initiating or triggering various operations in the system 500 based on a prediction of imprint or other adverse conditions, without necessarily directly detecting imprint itself.

Additionally, or alternatively, the imprint detection component 560 may perform various operations intended to directly detect a presence or degree of imprint in the memory arrays 555. In one example, an imprint detection procedure that may be performed or managed by the imprint detection component 560 may include writing a first set of logic states to a subset of memory cells of a memory array 555. In some cases, prior to writing the first set of logic states, the memory device 540 may write a particular (e.g., known, configured, enforced) pattern of logic states to the subset of memory cells, and the pattern may be configured to support the subsequent operations of the imprint detection procedure. In other cases, logic states stored by the subset of memory cells may not be enforced a priori and thus may be random (e.g., unknown, not specially configured to support the imprint detection procedure) from the perspective of the imprint detection procedure.

The memory device 540 may be configured (e.g., via operations of the imprint detection component) to read the subset of memory cells to obtain a second set of logic states and determine a first quantity of mismatches or errors associated with the second set of logic states. In some cases, the memory device may compare a logic state read from each memory cell (e.g., from the second set of logic states, a read or detected logic state) to a logic state that was written to each respective memory cell (e.g., from first set of logic states, a target logic state of the preceding write operation). A mismatch or error may be counted for each instance a read or detected logic state is different from the target logic state of the preceding write operation. In one example, an imprinted memory cell may remain in a first state (e.g., corresponding to a detected logic 1) even after attempting to write that memory cell to a different state (e.g., corresponding to a target logic 0). Based on such a discrepancy, the memory device 540 (e.g., the imprint detection component 560) may determine or infer that imprint has or may have occurred on that memory cell. When a presence, quantity, or rate of mismatches or errors satisfies a threshold, the memory device 540 may proceed with a recovery operation (e.g., of the imprint recovery component 565, as triggered or initiated by the imprint detection component 560) based on the mismatches or errors between the second set of logic states and the first set of logic states.

The imprint detection component 560 may employ a variety of techniques to determine and evaluate the quantity of mismatches or errors in such operations. For example, the memory device 540 (e.g., a sense component of the memory device 540) may be configured with a default or operational reference voltage used to determine logic states of memory cells under normal operating conditions, such as when reading application data from a memory array 555. As one example, the memory device 540 (e.g., the imprint detection component 560) may obtain the second set of logic states by reading the memory cells using the default reference voltage, and compare a resulting quantity of mismatches or errors to a threshold.

Additionally, or alternatively, the memory device 540 (e.g., the imprint detection component 560) may obtain the second set of logic states by reading the memory cells using a reference voltage that is either below or above the default reference voltage, which may be referred to as an offset reference voltage. In some cases, an offset reference voltage may be associated with an expected quantity of mismatches or errors (e.g., an expected number of errors that would occur due to reading using a reference voltage that is less than or greater than the default reference voltage, even without imprint). The memory device 540 (e.g., the imprint detection component 560) may compare a measured quantity of errors, as observed when reading the subset of memory cells using the offset reference voltage, to an expected quantity of errors associated with the offset reference voltage. In some cases, the imprint detection component 560 may determine whether to perform a recovery procedure based on this comparison. In some cases, two offset reference voltages may be used to obtain two sets of logic states. For example, a first offset reference voltage may be less than the default reference voltage and a second offset reference voltage may be greater than the default reference voltage.

Additionally, or alternatively, the memory device 540 (e.g., the imprint detection component 560) may use a difference between quantities of mismatches or errors observed when reading using two different reference voltages to determine whether a recovery procedure should be performed. For example, the second set of logic states and a third set of logic states may be obtained by reading the memory cells using two respective offset reference voltages that are either both below or both above the default reference voltage. A measured difference (e.g., subtraction), slope, or other type of gradient (e.g., a linear gradient, a non-linear gradient such as a non-linear regression) may be determined based on a first quantity of mismatches or errors associated with reading the subset of memory cells at a first offset reference voltage and a second quantity of errors associated with reading the subset of memory cells as a second offset reference voltage. An expected difference, slope, or other corresponding type of gradient may be defined based on a first expected number of errors due to reading using the first offset reference voltage and a second expected quantity of errors due to reading using the second offset reference voltage. The measured difference, slope, or other type of gradient may be compared to an expected counterpart to determine whether imprint has occurred or whether a recovery procedure should be performed.

These examples are for illustrative purposes, and the imprint detection component 560 may perform one or more additional analyses based on the quantity of mismatches or errors (e.g., comparing the quantity of mismatches or errors to a threshold, comparing or otherwise analyzing the quantity of mismatches or errors relative to another quantity of mismatches or errors determined using another reference voltage) to determine whether to perform a recovery operation.

The memory device 540 may also include an ECC component 570 that is configured to support one or more ECC operations at the memory device 540. In various examples, the ECC component 570 may be configured to correct single bit per word or page, double bit errors for a word or page, or other configurations. In some examples, the imprint detection component 560 may be coupled with the ECC component 570, and the imprint detection component 560 may use information from the ECC component 570 to determine whether to perform a recovery procedure. For example, the imprint detection component 560 may determine to perform an imprint detection procedure when a number of mismatches or errors between written and read logic states fails to satisfy a threshold, and in some cases, the threshold may be based on a number of errors that are correctable by the ECC component 570, or a rate or errors that are correctable by the ECC component 570. In this regard, the imprint detection component 560 may set a threshold for initiating a recovery operation at or above the number of errors that the ECC component 570 can correct (e.g., indicating a relatively severe condition). In some cases, the threshold for initiating a recovery operation may be at zero errors (e.g., a recovery operation may be initiated whenever any mismatches are detected).

In some examples, the imprint detection component 560 may be configured to set a threshold for initiating a recovery operation below the number of errors correctable by the ECC component 570, which may indicate a less severe or moderately severe condition. For example, the ECC component 570 may be assumed to handle some failures according to a capability of the ECC scheme employed, but if a quantity of errors or rate of errors handled by the ECC component 570 reaches a threshold level within such a capability, the imprint detection component 560 may be configured to preemptively initiate recovery operations (e.g., before the ECC component fails to keep up with errors), which may include triggering relatively low-level or moderate recovery operations.

In some examples, multiple thresholds of errors or threshold rates of errors at the ECC component 570 may be used as part of a recovery decision. For an ECC correction rate that is below a lowest threshold, recovery operations may not be initiated. For an ECC correction rate above a low threshold, there could be a "low severity" recovery operation such as a recovery during operation (e.g., a background recovery, a maintenance recovery). For an ECC correction rate above a high threshold, or for functional fails that exceed a capability of ECC correction, there could be a "high severity" recovery operation such as a discrete recovery event. In some examples, such techniques may be supported by a state machine approach (e.g., of the memory controller 550, of the imprint detection component 560), where, if counters exceed a threshold, various transitions may be initiated. In some examples, such techniques may include a real time rate determination on the fly based on combinatorial logic techniques (e.g., chip-level or array-level techniques applied at the memory device 540).

In one example for considering capability or errors at the ECC component, ECC rate may be defined as a quantity of correctable ECC errors divided by an access count (e.g., a time derivative, a count derivative). In some examples, an ECC rate may be calculated or otherwise considered with absolute values, such as directly dividing a determined quantity of ECC errors by an access count. In some examples, an ECC rate may be calculated or otherwise considered as an approximate derivative (e.g., as a right shift of counters upon overflow) to incorporate combinatorial logic. In some examples, the memory device 540 may not be configured to perform an interrupt and stop the system. Accordingly, the described technique for considering ECC rate may use an actual (e.g., determined) ECC count or rate, and may add the actual ECC count or rate to a background count or rate that the ECC component 570 is capable of detecting (e.g., a nominal ECC count or rate, a threshold ECC count or rate, or a normalized ECC count or rate). Where such an addition results in an overflow of a counter, a corresponding roll back of the counter may be used as an indication of a difference from expected behavior (e.g., as a detection or prediction of memory cell imprint).

In an illustrative example, over the course of some quantity of access operations (e.g., a million activations, a billion activations, 10 billion activations), an expected or threshold number of failures may be 10 words corrected. In the event that the ECC component 570 corrects 35 words over the same quantity of access operations, the errors may be well within the capability of the ECC component, but the drift or increase over expectation may be used (e.g., by the imprint detection component 560) to take preventative measures (e.g., initiate a recovery operation) to lighten the correction load of the ECC component 570.

In various examples, a quantity of errors or rate of errors at the ECC component 570 may include a total quantity or rate of corrections, a quantity or rate where corrections associated with logic states (e.g., errors of a logic 0, errors of a logic 1) are considered independently, or a quantity or rate where corrections associated with logic states (e.g., errors of a logic 0, errors of a logic 1) are considered in isolation. In other words, the ECC component 570 may support information related to error quantity or rate directionality (e.g., with respect to different logic states. Thus, according to various examples of the described techniques, an imprint detection component 560, an imprint recovery component 565, an imprint manager 525, or various combinations thereof, may consider error or mismatch directionality to determine one or more parameters related to imprint management.

The imprint recovery component 565 may be configured to perform various operations to equalize or normalize memory cells of the memory arrays 555 (e.g., to recover from actual or possible memory cell imprint, to mitigate the effect of conditions associated with memory cell imprint). For example, when one or more of the arrays 555 employ a ferroelectric memory architecture, the imprint recovery component 565 may perform or control operations that are configured to shift memory cells from an imprinted hysteresis curve 440 to or towards an unimprinted hysteresis curve 430. In some examples, the imprint recovery component 565 may operate independently of an imprint manager 525, or in the absence of an imprint manager 525, to support various techniques for imprint recovery within the memory device 540. For example, the imprint recovery component 565 may operate autonomously without coordinating imprint recovery techniques with the host device 510 (e.g., using on-die or otherwise integrated circuitry or processing capability of the memory device 540). In some examples, such an approach may be beneficial for imprint recovery techniques that benefit from a deeper understanding of chip-level conditions or other relatively direct understanding of operating conditions (e.g., without being required to convey such an understanding to the host device), and may support the memory device 540 being agnostic to different types or capabilities of different host devices. In other examples, the imprint recovery component 565 may operate based on signaling exchanged with the imprint manager 525 in a coordinated imprint management system, which may support imprint management coordination between the host device 510 and the memory device. In some examples, such an approach may support offloading aspects of imprint management from the memory device 540 to the host device 510, which may support relatively lean memory architectures (e.g., with relatively limited onboard processing capability or performance), enable relatively sophisticated techniques to be supported by enhanced capabilities of the host device 510, and other benefits.

In some examples (e.g., in response to a trigger or other information from the imprint detection component 560 or the imprint manager 525, to recover memory cells of the memory arrays 555), the imprint recovery component 565 may be configured to apply or otherwise control various biasing techniques, such as applying one or more voltages or voltage pulses across the memory cells, or performing multiple access operations (e.g., multiple read operations, multiple write operations, multiple read and write operations) on memory cells of a memory array 555. In various examples, such biasing may be performed in a maintenance or recovery mode that may or may not be related to a particular data accessing (e.g., as requested or commanded by the host device 510, on a scheduled basis, based on detecting or predicting that an imprinting has occurred), or may be performed in an imprint maintenance or recovery mode that modifies parameters of access operations (e.g., read operations, write operations, refresh operations) while supporting data transfer in the imprint maintenance or recovery mode. In some cases, the parameters may be permanently or indefinitely modified to support imprint recovery or prevention (e.g., durations or magnitudes of access voltages may be modified).

The operations of the imprint recovery component 565 may be initiated, triggered, scaled, or otherwise controlled or modified by various signaling (e.g., from the imprint detection component 560, from the imprint manager 525). For example, the imprint recovery component 565 may begin recovery operations based on initialization, permission, authorization signaling that may be generated within the memory device 540 or within the host device 510. In some examples, various imprint management components (e.g., of the memory device 540, of the host device 510) may detect various conditions relevant to recovery operations, and the imprint recovery component 565 may tune or scale recovery operations to different environmental (e.g., system or product) conditions or constraints, different cell technology sensitivities, and other factors. Additionally, or alternatively, the imprint recovery component 565 may perform imprint recovery operations that are scaled or selected according to a characterized severity or direction of imprinting, particular operating conditions of the memory device 540, of the host device 510, or of the system 500 as a whole, or based on various operational modes, permissions, approvals, or inhibiting.

In some example, the imprint recovery component 565 may initiate operations based on the memory device 540 being powered on or initialized for a boot operation of the host device 510. In some examples, the operations of the imprint recover component themselves may be part of a boot loop, and if the recovery operations are unsuccessful, the memory device 540 may signal to the host device 510 to try another memory device (e.g., an auxiliary memory device 590) to support ongoing operations. Additionally, or alternatively, the memory device 540 may provide signaling to the host device indicating that the memory device 540 needs to be replaced (e.g., a fault signal, a fault indicator).

In some examples, the imprint recovery component 565 may send one or more indications to the host device 510 related to an imprint recovery procedure (e.g., indicating a beginning of an imprint recovery operation or an end of the recovery operation). In some examples, the imprint recovery component 565 may otherwise provide signaling that the memory device 540, or one or more memory arrays 555 of the memory device 540, are unavailable for access operations.

In some examples, the system 500 (e.g., the host device interface 515, the memory interface 545) may be configured for signaling between the host device 510 and the memory device 540 that supports various operations or operational modes. In some examples, such system or controller signals may be set external to the memory device 540 or external to the memory arrays 555, and may control certain aspects of a recovery treatment. For example, a "needs recovery" signal may be configured (e.g., by the host device 510, by the memory device 540) to signal, request, or otherwise trigger various imprint recovery operations described herein. In some examples, a "needs recovery" signal may be enabled as a default or initial configuration or preconfiguration, such that imprint recovery operations are performed preemptively on an initial startup of the system 500 or before shipping to customer (e.g., according to an early-life recovery or "wakeup" operation). In another example, when an imprint detection is performed by the host device 510, a "controller specified recovery" signal may be configured by the host device 510 to schedule imprint recovery operations to be performed by the memory device 540.

Additionally, or alternatively, other signaling may be provided to refine various aspects of imprint management in the system 500. In some examples, a "disable recovery" may be configured (e.g., by the host device 510, by the memory device 540) to override internal recovery monitors (e.g., of the memory device 540, of a memory array 555) and prevent recovery operations, such as when certain performance is required from the memory device 540. In some examples, a "force recovery" signal may be configured (e.g., by the host device 510, by the memory device 540) above or otherwise override internal recovery monitors, to initiate recovery operations. In some examples, a "pause recovery" signal may be configured (e.g., by the host device 510, by the memory device 540) to temporarily override internal recovery operations, such as in support of a temporary high bandwidth date transfer scenario, a temporarily desire to reduce power consumption (e.g., low battery), or other conditions. In some examples, a "recovery time" signal may be configured (e.g., by the host device 510, by the memory device 540) to specify a time available for recovery operations (e.g., for a discrete recovery event on a memory array 555 or subset thereof).

The system 500 may be configured to support various techniques for imprint recovery, which may broadly be characterized as discrete recovery events on a full memory array 555, recovery operations during operation, or modifying other operations on a memory array 555 for the purpose of imprint recovery. Although certain examples may be described in the context of one of these characterizations, such descriptions are provided as non-limiting examples for illustrative purposes, and various other examples or combinations may also be used in accordance with the described techniques.

In a first set of examples, imprint management may include various techniques for performing a discrete imprint recovery on a full memory array 555. For example, some aspects of imprint management may be included in a monitor that runs on bootup or powering on of the system 500 or the host device 510. In some examples, a flag may be set prior to or while the memory device 540 is powered off as an indication that imprint may have occurred, or that imprint management techniques described herein should be triggered. Accordingly, the system 500 may be configured to proactively attempt to recover from or mitigate the effects of imprint.

In some examples, techniques for performing a discrete imprint recovery may operate on a full array 555, or a defined subset of a memory array 555 (e.g., in response to a trigger). Some techniques may prevent normal operation of the system 500, and may include signaling or other operational understanding between the host device 510 and the memory device 540 (e.g., "pause" signaling, operational inhibit signaling, pausing a boot operation). Thus, in some examples, performing a discrete imprint recovery may be performed before the system 500 regains normal functionality, but including such operations (e.g., in a preventative manner) may prevent the system 500 from simply failing due to the effects of imprint.

In some examples, a discrete imprint management technique may include an assessment of whether a memory array 555 or a subset of a memory array 555 passes or fails a monitoring step, such as a re-test operation after imprint recovery biasing or accessing. A re-test operation may include or be associated with an option to initiate additional imprint recovery biasing or accessing, signaling of a status from the memory device 540 to the host device 510 (e.g., to the imprint manager 525), or both.

In one example, a full array recovery may be triggered or initiated by a boot sequence imprint monitor or other functional failure (e.g., a boot failure, a blue screen event, a high severity imprint monitor failure). In another example, a full array recovery may be triggered or initiated by an inability to correct non-volatile data with ECC during recovery, in which case the memory device 540 or the host device 510 (e.g., the imprint manager 525) may generate a signal to the system 500 that data in a memory array 555 needs to be replaced from storage (e.g., an auxiliary memory device 590), and initiate a clean reboot.

When the system 500 is configured to select from among various options of imprint recovery methods, a selection to perform a discrete recovery event on a full memory array 555 may be preferable or advantageous in some circumstances. For example, discrete recovery events may be configured to provide relatively strong recovery in a relatively short amount of time. However, such techniques may be associated with relatively greater power consumption, may halt certain aspects of memory operation while recovery is performed, may be associated with causing fatigue or accelerating other degradation, or may have other tradeoffs. Accordingly, in some cases, certain aspects of discrete recovery on a full memory array 555 may be reserved for moderate or high severity imprint (e.g., inhibiting discrete recovery events on a full memory 555 when low-severity imprint is detected or inferred).

In some cases, discrete recovery events on a full memory array 555 may be applied when operating temperatures of a memory device 540 or a host device 510 are determined to be relatively low (e.g., at or below a temperature threshold), because less aggressive imprint recovery may not be effective under such conditions where charge mobility or other response to imprint recovery is impaired. In other words, when operating temperatures of a host device 510 or memory device 540 are higher, less aggressive imprint recovery techniques may be suitably effective at normalizing or equalizing memory cells. A selection of such recovery techniques may also consider power supply or power availability, as discrete recovery operations on a full memory array 555 may only be selected, available for selection, or enabled under certain power conditions (e.g., battery charge level being at or above a threshold, power consumption of the system 500 being at or below a threshold, the host device 510 or the system 500 being plugged in).

In some examples, the described techniques for discrete imprint recovery on a full memory array 555 may be supported by various signaling between a host device 510 and a memory device 540. For example, as supported by such signaling, components of the system 500 may have an understanding that operations should be suspended or inhibited during imprint recovery. In some examples, signaling may include or be accompanied by a negotiation of available time (e.g., as requested by a memory device 540, as approved or otherwise signaled by a host device 510). In some examples, such recovery techniques may include or be triggered by relatively sophisticated imprint detection techniques, such as detections at a memory array 555 using multiple reference voltages, performing slope or gradient calculations or analyses, or other techniques that provide greater observability into imprint conditions at the memory array 555.

In a second set of examples, imprint management may include various techniques for performing imprint recovery during operation of the memory device 540 or the memory arrays 555 (e.g., in a maintenance mode). A memory array 555 may continue operating during such techniques, but aspects of cell behavior may be detected (e.g., a detected or inferred presence of imprint, a detection of inadvertent or malicious access operations that may result in imprint or other cell-level degradation or failures) such that recovery operations may be performed during operation to relieve, mitigate, or prevent imprint. In some examples, performing imprint recovery during operation may reduce performance (e.g., increase power consumption, reduce bandwidth, increase latency), but such a reduction may be within allowable specifications. Thus, imprint recovery during operation of the memory device 540 may be used to provide recovery when a low to moderated amount of recovery is needed, but normal operation of the device is required and a reduced performance of the memory device 540 or the host device 510 is acceptable.

In some examples, imprint recovery during operation may be associated with monitoring schemes that have multiple thresholds, supporting relatively less aggressive recovery techniques under some circumstances (e.g., relatively less aggressive than a discrete recovery event on a full memory array 555). For example, if low-severity imprint is detected or inferred, lower-level imprint recovery may be performed without stopping certain operations of the system 500 (e.g., imprint recovery may be performed while allowing some data exchange between the memory device 540 and the host device 510). In some cases, imprint recovery during operation may be considered as a maintenance mode or operation that equalizes or normalizes a memory array 555 before imprint causes access errors, compared with other recovery techniques that may be performed based on detecting failures that may be related to such access errors (e.g., a full-blown recovery of a failed memory array 555).

In some examples, thresholds related to imprint recovery during operation may be based on detection schemes that leverage different reference voltages when reading a memory array 555 (e.g., as described with reference to FIGS. 7 and 8). For example, conditions associated with each of a set of reference voltages, or some combination thereof, may be used to separately indicate a severity of an imprint detection or prediction. When performing imprint detections at multiple reference voltages, if the conditions at a memory array 555 fail thresholds at one or more reference voltages but pass thresholds at one or more other reference voltages, the system 500 may proceed with a maintenance-type imprint recovery. If the conditions at the memory array 555 fail thresholds at all reference voltages, the system 500 may proceed with a full recovery mode (e.g., a discrete recovery event on the full memory array 555. In some examples, such techniques could be supported by chip-level analog thresholds at a memory array, where different thresholds are configured for each of a set of applied reference voltages.

Imprint recovery during operation may be triggered or scaled according to various operating conditions in the system 500. For example, such techniques may be triggered or scaled based on data load between the host device 510 and the memory device 540, or based on a processor load of the host device 510, where a higher load may correspond to performing a less disruptive imprint recovery maintenance. In other examples, the system 500 may be configured to detect a non-functional or reduced function mode (e.g., when the system 500 or the host device 510 is plugged in overnight), and techniques for imprint recovery during operation may be initiated based on such a detection to support a maintenance mode. In some examples, imprint recovery during operation may consider a handshake or other signaling between the host device 510 and the memory device 540, and various aspects may be initiated or scaled based on various requirements, operating modes, or other considerations.

In one example, imprint recovery during operation may leverage a self-refresh configuration at a memory device 540. For example, refresh may work (e.g., uniformly) through an entire memory 555, and refresh operations may be performed more frequently (e.g., increasing a rate or frequency of self-refresh operations) at the memory device 540 based on an imprint detection trigger. The increased rate or frequency of refresh operations may provide biasing to memory cells that relieves the effect of imprint. In various examples, modified refresh operations may include one or more temporary modifications to lengthen, change voltage, or include a state swap/inversion, which may or may not affect normal operations. Although such techniques may slow down operation of a memory device 540, or increase power consumption, such techniques may be otherwise transparent to operations of an interfacing component (e.g., a host device 510), and may not require signaling or negotiation between a memory device 540 and a host device. In other examples, such a lengthening may be associated with commands or signaling with a host device 510, such as signaling that indicates or approves (e.g., grants authority to perform) a relatively lower-performance mode of operation.

In some examples, imprint recovery during operation may be based on, included in, or otherwise associated with ECC or wear-leveling operations at the memory device 540, where related operations may be modified based on a relatively lower-severity trigger. For example, a relatively small amount of recovery (e.g., relatively low-amplitude or low-duration biasing or accessing) may be applied to each page being refreshed according to an ECC scrub or wear leveling. In other words, operations or algorithms associated with ECC or wear-leveling may be modified for the purpose of imprint recovery (e.g., based at least in part on a detection or inference of memory cell imprint). Over time, such techniques may work through an entire memory array 555 while access operations of the memory array 555 are still supported.

In one example, an ECC correction count at the ECC component 570 may be monitored (e.g., by state, by transition), and imprint maintenance may be triggered or initiated if the monitored count exceeds or otherwise satisfies a threshold. In another example, aspects of a wear leveling may include a shift of a physical-to-logical pointer associated with shifting data to a new page. Before or after such shifting, a recovery treatment may be applied to an unused physical page. In various examples, a page in transition may be biased with some number (e.g., 1,000) of quick cycles, or some number (e.g., 10) of lengthened pulses.

Such techniques may be applied to other methods of memory management that include rotating data or any other refresh. For example, imprint recovery during operation may include adding recovery cycles or bias to a page being refreshed, increasing a number of self-refreshes, decreasing a number of system refreshes that are skipped (e.g., if the memory device 540 is configured to skip system refreshes), and others. In some examples, decreasing a number of skipped system refreshes may not require any system knowledge (assuming the part skips refreshes), and accordingly may be supported without particular signaling between the host device 510 and the memory device 540. When performing a fast recovery (e.g., according to a discrete recovery event), voltage may be higher, whereas a slower recovery for less severe imprint may have a lower voltage.

According to various examples, the described techniques may correspond to a permanent or unidirectional change in operation, or may correspond to changes that may be reset back to normal operation after a set time, a set number of passes through the full array, or in response to operating conditions such as being in idle mode and plugged in (e.g., an overnight battery charging condition). In some examples, imprint recovery during operation may be performed on a subset of a memory array 555 to recover an operating window of a particular subset.

When the system 500 is configured to select from among various options of imprint recovery methods, a selection to perform recovery during operation may be preferable or advantageous in some circumstances. For example, recovery during operation may be performed to provide recovery when power consumption is a concern by spreading out recovery cycles over multiple operations. In some examples, such techniques may be triggered or scaled at relatively high operating temperature of a memory device 540 or host device, because such techniques may be more effective at high temperatures than low temperatures. Additionally, or alternatively, such techniques may be triggered or scaled at relatively early operating life (e.g., early life or mid-life of a memory device), because such techniques may be relatively gentler on a memory device 540 (e.g., than a discrete recovery event), and accordingly may be less prone to accelerating fatigue or other degradation of a memory array 555. Additionally, or alternatively, such techniques may be triggered or scaled based on an available time for recovery operations.

In a third set of examples, imprint management may include various techniques for imprint recovery by modifying operation of the memory device 540 or the memory arrays 555. Imprint recovery by modifying operation may refer to various changes in the normal operation of the memory device 540 or a memory array 555 in a manner intended to promote recovery, and may be associated with a reduction in performance (e.g., increased power consumption, reduced bandwidth, increased latency) within allowable specs. In some examples, the described techniques for imprint recovery by modifying operation may differ from imprint recovery during operation in that there may not be additional operations or procedures that are executed on subsets of a memory array 555 in turn. Rather, imprint recovery by modifying operation may refer to various techniques that change how standard operations function. Accordingly, application of the described recovery to a full memory 555 array may be implied by the normal usage of the memory array 555 rather than an explicit loop through the memory array 555. In some examples, such techniques may be intended to be a relatively permanent change to the operation of the memory device 540 or the memory arrays 555, or at least a unidirectional change (e.g., a series of changes of a parameter in a same direction, not returning to a previous state or configuration of operation).

In some examples, imprint recovery by modifying operation may leverage flexibility in pulse width or amplitude at a memory device 540. For example, normal operations of the memory device may begin with relatively shorter pulses (e.g., read pulses, write pulses, refresh pulses), such as shorter duration under bias, or pulses having a relatively lower amplitude, which may be favorable for early life operation (e.g., for lower power consumption, for lower rate of fatigue or other degradation. Based on detected or inferred imprint conditions, pulse widths, pulse amplitudes, or both may be increased (e.g., later in life) to improve imprint recovery or robustness. In some examples, such techniques may be applied near an end of life (e.g., of a memory device 540, of a host device 510), where an improved resistance to imprint may be worth a corresponding higher power consumption or a corresponding acceleration of memory array degradation.

One example of such techniques may include a selective modification to a read pulse (e.g., a cell bias applied during a read operation, a cell bias upon issuing an activate or ACT command), such as an increased read pulse duration, an increased read pulse amplitude, or both. In some examples, such a modification may support recovering normalized or equalized performance of a memory array 555, or otherwise compensating for changes in memory cell behavior that may result from imprint. Another example of such techniques may include a selective modification (e.g., in response to an imprint detection or prediction) to a write pulse (e.g., a cell bias applied during a write operation or writeback operation, a cell bias upon issuing a precharge or PRE command), such as an increased write pulse duration, an increased write pulse amplitude, or both.

In another example, an "open page" time may be modified, which may refer to various techniques for modifying the voltage or duration of an applied bias during a time between activating a page and precharging a page, which may alternatively be referred to as a time between opening a page and closing a page. In some examples, such techniques may include modifying a duration of the period between activating the page and precharging the page, which may correspond to an increase in a row active time (tRAS) or other timing parameter. In some examples, an open page time may not be part of a read operation and not part of a write or rewrite operation. Rather, at least from the perspective of some of the memory cells of a memory array 555, an open time may refer to a waiting state, and modifications during such a state may not affect other timing specifications. Accordingly a biasing during an open page time may be tuned for various considerations without necessarily affecting timing performance. Applying a bias during such a period may be beneficial to mitigate imprint, but may be problematic for other reasons (e.g., degradation, fatigue, power consumption). Accordingly, changes to an open page time for the purpose of imprint management may be enabled relatively later in the operating life of a host device 510 or memory device 540, or during particular operating modes or conditions.

Another example may include various modifications to refresh cycles at a memory device 540. For example, whereas a typical refresh pulse may have a relatively short duration (e.g., 15-25 nanoseconds), modifications in response to a detection or inference of imprint may include extending refresh to a longer duration (e.g., 200 nanoseconds). In one example, a refresh operation may include various multiples of cycles (e.g., performing two refresh cycles per triggered refresh), which would effectively multiply the time under bias during refresh operations. Accordingly, some modifications to operation for imprint recovery may include lengthening a refresh time per page to include a recovery treatment for the page being refreshed.

In another example, for memory devices 540 with an ECC scrub feature enabled (e.g., passing an ECC code word through the ECC engine to correct errors and then writing the corrected data back to the array), a scrub frequency may be selectively increased in response to a low severity imprint monitor warning.

Techniques for imprint recovery by modifying operation may be selected or scaled based on various criteria. For example, various techniques may be selected or scaled based on an operating temperature of a memory device 540 or a host device 510. In one example, imprint recovery techniques by modifying operation turned off or inhibited at higher operating temperatures, because other operations or biasing patterns may be effective enough to mitigate imprint at higher temperatures. In another example, various techniques may be selected or scaled based on an age of a component. For example, imprint recovery techniques by modifying operation may be disabled or inhibited when a detected age or wear of a host device 510 or memory device 540 is below or otherwise satisfies a threshold to reduce acceleration of wear or fatigue that may be associated with such techniques, or enabled when a detected age or wear of a host device 510 or memory device 540 exceeds or otherwise satisfies a threshold because such an acceleration in wear or fatigue may be overshadowed by the benefits of imprint management.

When the system 500 is configured to select from among various options of imprint recovery methods, a selection to imprint recovery by modifying operations of the memory device 540 or one or more of the memory arrays 555 may be preferable or advantageous in some circumstances. In some examples, imprint recovery by modifying operation may be used to provide recovery that is relatively gentle, relatively slow, or relatively week, such as when a relatively low amount of recovery is needed, when normal operation and near-peak performance is required, or when power availability is relatively low or limited. In some examples, imprint recovery by modifying operation may be preferably applied at low severity, or during early life of a host device 510 or memory device 540, but such techniques may be beneficial through later stages in life. In some examples, imprint recovery by modifying operation may be preferably applied when power is limited, or when there is relatively limited time available for recovery. In some examples, such techniques may not require signaling between a memory device 540 and a host device, in which case such techniques may be preferably applied in embedded applications.

In other examples, recovery operations may be inhibited under certain circumstances. For example, if imprint is detected or predicted, but the corresponding severity is determined to be low, the system 500 may be configured to inhibit or otherwise not perform recovery operations, which may reduce unnecessary fatigue on cells. In other examples, it may be preferable to avoid or inhibit recovery operations depending on an age of the device, which may prevent or mitigate early end of life failures that could be caused by or exacerbated by the recovery method. For example, if the memory device 540 or one or more arrays 555 is relatively old or late in an operational-life, it may be advantageous to inhibit imprint recovery operations until absolutely necessary (e.g., having a relatively higher threshold for performing recovery operations) to reduce fatigue and stress-induced leakage current on memory cells of the memory array 555. In another example, if the system 500 is unable to recover a portion of a memory array 555 after attempting recovery many times (e.g., an indication that a portion of the memory array 555 array is at or near an end of operational life), recovery on that portion of the memory array 555 may be disabled to allow operation on the still functioning portions of the memory array 555. In some examples, recovery operations may be avoided or inhibited based on a power source or power availability. For example, if an available power or power storage is relatively low (e.g., an unplugged mode, a battery-only mode, a low-battery condition), recovery operations may be inhibited or scaled back to reduce power consumption. In some examples, a power state of the system 500 may change (e.g., the host device 510 may be plugged in to a wired power supply), and the host device 510 may respond by indicate an availability for maintenance operations such that the memory device 540 may proceed with imprint recovery operations.

In some examples, the system 500 may be configured to consider a detected severity of imprint as part of the described imprint recovery operations. For example, various techniques for imprint monitoring may be configured to detect or predict imprint severity, and responses may be initiated or configured according to different severity thresholds. In one example, if severity monitoring exceeds a relatively low threshold, where a memory array 555 is still functional, a "low severity" recovery response could be triggered, such as recovery during operation or recovery by modified operation. In some examples, this may include or refer to using recovery as a maintenance mode before widespread functional failure. In another example, if severity monitoring exceeds a relatively high threshold, where a memory array 555 is not functional, or errors are overwhelming ECC correction, a "high severity" recovery response could be triggered, such as a discrete recovery event on the entire memory array 555. In some examples, this may include or refer to a recovery of functional capability of a memory array 555.

In some examples, the system 500 may be configured to consider a detected directionality of imprint as part of the described imprint recovery operations. For example, some imprint detection techniques may be able to discern between imprint presence or severity as pertaining to failure of one logic state versus another. Additionally, or alternatively, a propensity for imprint in one direction or another may be otherwise known or predicted (e.g., based on known or predicted imprint phenomena related to one logic state or another). A predominance of imprint related to a particular logic state may accordingly be used to select or skew a recovery method towards countering imprint in that logic state.

In some examples, the system 500 may be configured to consider a temperature (e.g., an operating temperature of the host device 510, an operating temperature of the memory device 540, an operating temperature of the arrays 555) as part of the described imprint recovery operations. For example, whichever recovery method is used, a parameter such as bias magnitude, bias time, or number of cycles can vary by the current temperature of the device. In some examples, recovery may be faster or otherwise easier at higher temperatures, such that lower bias or fewer cycles may support a given recovery. Relatedly, recovery may be slower or otherwise more difficult at lower temperatures, such that higher bias or more cycles may be required to support a given recovery. In some examples, recovery may be constrained by a low temperature, such that a particular recovery technique may need to be selected when a host device 510 or a memory device 540 is operating at a relatively low temperature.

In some examples, the system 500 may be configured to consider a power condition (e.g., a power supply or power availability of the host device 510 or the memory device 540) as part of the described imprint recovery operations. For example, a choice of imprint recovery method may depend on available power, such as whether a host device 510 or a memory device 540 is operating in a low power state, on battery, or plugged in (e.g., to a main line power source). In another example, degrees of parallelism (e.g., a quantity of rows or pages being simultaneously recovered) may be based on a power condition, such as increasing parallelism of imprint recovery when plugged in. In various examples, such techniques may correspond to or otherwise consider a performance mode of a host device 510, power state of the host device 510, or other detected of inferred input power condition.

In some examples, the system 500 may be configured to consider age of the memory device 540, age of the memory arrays 555, or the age of the host device 510 as part of the described imprint recovery operations. For example, a device can generally be considered to experience three age ranges, referred to as early-life, mid-life, and late-life, which may correspond to a bathtub curve. In various examples, such descriptions or characterizations, or other monitor of device life, may be tracked by a memory device 540, a host device 510, or both, to select or scale various imprint recovery techniques.

During early-life conditions (e.g., of a memory device 540, of a host device 510, of a system 500), recovery methods may be used to induce "wakeup" in a memory array 555. For example, an early-life recovery may be a system-triggered maintenance response to defined thermal stresses of an assembly or packaging process (e.g., manufacturing operations during installation, mounting, soldering on a board, package-on-package mold compound curing, brazing), or by tracking a status of a usage counter. In some examples, early-life recovery techniques may selectively trend towards relatively few cycles with symmetric, low bias extended pulse widths to gently wake up the memory array 555.

During mid-life conditions (e.g., of a memory device 540, of a host device 510, of a system 500), recovery methods may be used to recover from more significant or unexpected thermal stress events. For example, during mid-life conditions (e.g., of a memory device 540, of a host device 510, of a system 500), the device may be experiencing multiple failure mechanisms, such as imprint, fatigue, leakage, and others. These events may be difficult to separate from mid-life failures without the benefit of a usage counter, or a system trigger. Mid-life recovery techniques may be triggered by the memory device 540 or the host device 510, and may include a preconfigured technique or a selection among a discrete recovery event on an entire memory array 555, a recovery during operation, or a recovery by modified operation. In some examples, mid-life could be defined either as "not early-life" (e.g., as a binary flag), or by a usage counter (e.g., an access operation counter, an odometer), either of which could be applied to a selection or scaling of a recovery method.

During late-life conditions (e.g., of a memory device 540, of a host device 510, of a system 500), recovery methods may tend to be more extreme, and may emphasize modifications to standard operation such as increasing write bias or read bias. In some examples, late-life recovery may be characterized as an "all or nothing" response, where a host device 510 or a memory device 540 may not have much operational life remaining and benefits of imprint recovery may be greater than any corresponding degradation in lifespan. In some examples, late-life could be defined either as "a late-life" flag (e.g., as a binary flag), or by a usage counter (e.g., an access operation counter, an odometer), either of which could be applied to a selection or scaling of a recovery method.

Age or wear evaluations may be supported by various techniques in a system 500. For example, a memory device 540 may include an on-die usage counter, which may be compared (e.g., at the memory device 540, at a host device 510) to a pre-defined set of lifetime usage thresholds to identify whether the memory device 540 satisfies an early-life, mid-life, or late-life condition. In another example, a host device 510 or a memory device 540 may include a controller that sets a flag or other indication that corresponds to an early-life, mid-life, or late-life condition. For example, an early-life flag may be set after final system assembly, or board soldering, or upon initial boot up and system testing, and toggled after some duration or other threshold of operation.

In some examples, imprint management techniques may also consider aspects of data preservation for the memory array 555, which may include various examples of static configuration or selective operation with respect to whether to attempt to preserve data stored by memory cells to which imprint recovery is applied.

In one example, imprint recovery methods may attempt to preserve data stored in a memory array 555 by copying data from subset of the memory array 555 that will receive a recovery treatment into an alternate location, such as another memory address of the same array 555, a different memory array 555, or an auxiliary memory device 590. For example, an imprint recovery process may include copying data to a different subset of the memory array 555 and remapping the logical to physical address scramble, where recovery treatment may be performed immediately or upon entering an idle state. In another example, data may be preserved locally by performing some number of repeated of cyclical inverted writeback operations, essentially flipping the data state of the subset of the array for a given number of cycles. In some examples, such data preservation may be enabled if an imprint detection or evaluation operation has delivered a low severity warning, and data can still be read from and written to the array without irrecoverable error. In other words, if the memory array 555 is not experiencing irrecoverable errors, the system 500 may be configured to attempt data preservation.

In another example, data may be read into a sense amplifier or latch (e.g., of a sense component 250) and held at the sense amplifier or latch in a bypass mode, where the biasing or cycling of the memory array 555 does not overwrite the sense amplifier or latch. In various examples, after recovery operations, the data from the recovered memory cells may be returned from the sense amplifier or latch to the same location, or the data from the recovered memory cells may be moved from the sense amplifier or latch to a different location and the recovered memory cells may be made available for other data.

In some examples, recovery methods may make no attempt to preserve data. For example, if an imprint failure is known, the system 500 may be configured to avoid taking time for data preservation (e.g., may inhibit data preservation), which may accelerate certain aspects of imprint recovery. Such operations or inhibitions may be selectively performed in response to high severity imprint monitor failures, when data cannot be read from or written to a memory array 555 array without error, or when there is no user expectation for data preservation (e.g., during a boot up operation when the memory device 540 or the memory array 555 is configured in a volatile mode or is otherwise not expected to be storing required information).

In some examples, aspects of data preservation during imprint recovery may be particularly considered in applications where the memory device 540 is expected to support some degree of nonvolatility (e.g., when the memory device 540 is configured for operation as non-volatile RAM). For example, the system 500 may be configured with a data hierarchy or other hierarchy of storage where a purpose of the memory device 540 may be to provide relatively high-speed storage. In one example, the memory device 540 may be configured to provide a virtual memory functionality that is fast compared to other auxiliary memory devices 590. In some examples, this may include operating a memory array 555 of the memory device 540 in a non-volatile mode to initialize quickly (e.g., to wake from sleep mode where the memory device 540 is powered down). In such cases, prior to entering a low-power mode, the system 500 may be configured such that data in virtual memory is flushed (e.g., copied) to an auxiliary memory device 590, where the auxiliary memory device may support, or be expected to support a greater degree of nonvolatility or imprint resistance than the memory device 540. In other words, the memory device 540 may be configured to support a fast boot (e.g., leveraging a probability that the stored information is still present), but the presence of such data at the memory device 540 may not be explicitly or solely relied upon. For example, the system 500 may be configured to attempt to initialize using information of the memory device 540, and in the event of failure (e.g., a failure to boot), imprint management techniques (e.g., detection operations, recovery operations) may be performed on the memory device 540 before, during, or after an initialization is attempted using information copied to the auxiliary memory device 590.

Flushing, copying, or other redundancy techniques may additionally, or alternatively include a flush by address space identifier (ASID), a flush of program and operating system data, a flush by user, a flush according to program versus data, or flushing or copying by other configuration or initiation, and various operational management schemes may be configured accordingly. For example, when an error while accessing the memory device 540 is unrecoverable by normal ECC operation, data can be pulled back using a page table or map (e.g., virtual memory map, a data redundancy map) during an error recovery, which may include data stored at a different memory array 555 or an auxiliary memory device 590 (e.g., flash memory, a hard disk, or other storage). In other words, according to these and other techniques, the system 500 may be configured to determine whether to pull data from a memory array 555 or its copy from other memory (e.g., another memory array 555, or an auxiliary memory device 590), which may have a different (e.g., greater) degree of non-volatility or other difference in a degree of imprint. Such techniques for determining a location for accessing copies of data may be combined with various techniques for imprint management described herein.

In another example of applying the described techniques in a memory hierarchy, the system 500 may be configured to copy information from the memory device 540 to an auxiliary memory device 590 during imprint detection or imprint recovery. For example, the system 500 may be configured to apply such techniques as an attempt to back up or recover information that would be otherwise lost when writing information back to imprinted memory cells of the memory device 540 (e.g., backing up data to an auxiliary memory device 590). Such techniques may be preferably applied with an auxiliary memory device 590 configured for relatively fast operation, such as an auxiliary memory device 590 employing a DRAM or FeRAM architecture.

In some examples, the system 500 may be configured to selectively enable or configure various aspects of data preservation based on various considerations. For example, if an ECC correction at the memory device 540 fails, the system 500 may be configured to understand that the data in the memory device 540 may be corrupted, such that data in the memory device 540 or particular memory array 555 need not be preserved during imprint recovery (e.g., relying instead on data stored in another location). In another example, the system 500 may be configured to perform various operations based on a system or product constraint, such as a configuration of volatility or nonvolatility of the memory device 540. For example, if the system 500 is configured to use the memory device 540 in a non-volatile mode, or the memory device 540 is otherwise not configured for nonvolatility, the system 500 (e.g., the host device 510, the memory device 540) may set a flag or mode register that identifies the memory device 540 or operation thereof as being non-volatile, and perform imprint management techniques accordingly. In some examples, if an imprint recovery is being performed after a powerup or otherwise during operation of the memory device 540, data may need to be preserved unless the system 500 provides an indication that data preservation is not required a given subset of the memory array 555. In another example, various imprint recovery techniques described herein may be selectively enabled or configured based on a detection of whether a backup location is available in another memory array 555 or an auxiliary memory device 590. For example, imprint detection limits or thresholds may be set based on a presence or absence of such a detection, or various recovery types may be selected based on a presence or absence of such a detection.

In some examples, one or more of the described techniques may be leveraged to mitigate or resolve aspects of security vulnerabilities, malicious attacks, or inadvertently adverse access patterns. For example, as non-volatility in memory devices moves closer to a processor (e.g., according to a memory hierarchy), the configuration of a system architecture may need to consider the possibility of data retention failures in the memory devices, and the mechanisms that may cause such failures (e.g., whether due to imprint or some other phenomenon). In some examples, imprint in a memory device 540 may be associated with certain vulnerabilities, and accordingly, the host device 510, the memory device 540, or the system 500 as a whole may be configured to resolve such vulnerabilities or to improve immunity or robustness to such vulnerabilities.

In one example, memory devices may have security or operational vulnerabilities to access patterns such as rowhammer, where rowhammer may be used to gain access to different parts of the memory device. In some cases, memory cells that are imprinted or otherwise degraded could be exploited. For example, if the host device 510 (e.g., a CPU of the host device 510) proceeds with a speculative event in response to an error of the memory device 540, imprint or other failure or phenomenon of the memory device 540 may be a source of triggering such an event. To improve robustness and security, the system 500 may be configured with some level of handoff between the memory device 540 (e.g., an imprint detection component 560, an imprint recovery component 565, a memory controller 550) and the host device 510 (e.g., an imprint manager 525, a host device controller 520) to mitigate such a vulnerability. In some examples, imprint detection techniques such as those described herein may be configured in such a manner that such an exploit is interrupted.

In one example, an unrecoverable data error (e.g., one or more failed bits) may be identified during a bootup event, or a maintenance or recovery event (e.g., an imprint detection event, an imprint recovery procedure). In various examples, unrecoverable ECC errors could be the result of intentional engineering, an inadvertently adverse access pattern, or a random failure. For example, pertaining to an intentional exploit, an adverse actor may intentionally imprint a bit in a critical location of a memory array 555, or identify a memory cell in an array having an imprinted bias direction or other relative weakness with respect to data retention, and engineer an error to occur on these memory cells (e.g., writing critical data to a location of a memory array 555 known to have an imprinted or other degraded ability to store data). Additionally, or alternatively, random exploits could be generated by intentionally powering off a memory device 540, a host device 510, or the system 500 in an attempt to engineer retention failures, or bombard a memory device 540 configured for non-volatile operation with radiation. In some examples, when a host device 510 (e.g., a CPU of the host device 510) receives corrupt data or code, the host device 510 may branch unpredictably. Under benign circumstances, such branching may simply result in a crash of the host device 510 or the system 500. It may be beneficial to avoid such crash (e.g., to avoid an inconvenience), but such a crash may not be associated with other downstream. Under hostile conditions, however, branching may represent a security concern.

In accordance with aspects of the present disclosure, when the system 500 (e.g., the memory device 540, the host device 510) identifies an error, such as an uncorrectable ECC error, whether related to imprint or some other cause, the system 500 may be configured to proceed with various operations and signaling to mitigate or resolve security vulnerabilities.

According to various examples, the memory device 540 may detect a data error (e.g., an uncorrectable error) or an access pattern (e.g., one or more read commands, one or more write commands) that may adversely affect storage characteristics of the memory device 540, such as an access pattern that may weaken the ability of memory cells in a memory array 555 to be written, or to otherwise store data. Such a detection may occur, for example, during a boot operation or during normal operation of the system 500 (e.g., of the memory device 540). In some examples, the memory device 540 may detect an access pattern that may cause the host device 510 to initiate or otherwise perform speculative branching. In some examples, the memory device 540 may identify an imprint attack or identify forced imprint, which may be associated with conditions that may cause imprint of a ferroelectric capacitor (e.g., in an FeRAM application), imprint of another type of capacitor (e.g., in a DRAM application), imprint of a material memory element, or other types of imprint. In some examples, the memory device 540 may determine that a data error is beyond a capability for correction at the memory device 540 (e.g., of an ECC procedure).

In response to such a detection, the memory device 540 may determine to stop functioning normally (e.g., at least temporarily), which may be related to an assumption or configuration of nonvolatility being violated. In some examples, this may include the memory device 540 entering a safe mode, entering a maintenance mode, or entering a recovery mode, or some combination thereof. In some examples, the memory device 540 may initiate recovery operations, such as imprint recovery operations, on the memory array 555, and in some examples, recover data from another portion of the system 500 (e.g., from a different memory array 555, from an auxiliary memory device 590). In some examples, the memory device 540 may determine to cease operations entirely, or at least until a subsequent initialization or boot operation (e.g., initiated by the host device 510).

Additionally, or alternatively, the memory device 540 may be configured to indicate an error to the host device 510 through implicit signaling or lack thereof, or through explicit signaling. In some examples, the memory device 540 may lock or deactivate an address decoder of the memory device 540 (e.g., of the memory controller 550), or lock out certain addresses of the memory device 540 (e.g., of one or more memory arrays 555). In some examples, the memory device 540 may be configured to return random data (e.g., rather than the requested data), which the host device 510 may interpret as an error indication. In some examples, the memory device 540 may be configured to withhold or inhibit a response to the host device 510 (e.g., ignoring commands from the host device 510), such that the memory device 540 may be considered to be locked out completely (e.g., from the perspective of the host device 510), at least temporarily. In some examples, the memory device 540 may be configured to send a message to the host device 510 forcing an exception, handing responsibility for response to the host device 510. In some examples, the response of the memory device 540 may be configured to intentionally cause a failure at the host device 510, such as a purposely-engineered bluescreen event (e.g., rather than attempting to recover from the error, which may open a security vulnerability or permit malicious access).

In some examples, the memory device 540 may be configured to hand off or authorize operation control to (e.g., switch into) a maintenance mode, thereby avoiding or inhibiting accessing or other operations from allowing malicious imprinting. In some examples, such a handoff may be accompanied by the memory device 540 sending a message or other signaling to the host device 510, which may force an exception at the host device 510. In some examples, such signaling may be accompanied by the memory device 540 indicating the address with an ECC error to the host device 510.

In some examples, the host device 510 may be configured to recognize the error of the memory device 540, and attempt to recover data from another location, such as another memory array 555 or an auxiliary memory device 590. In other words, the host device 510 may attempt to perform an access operation with the memory device 540, and based on detecting an irrecoverable error of the memory device 540 (e.g., implicitly, based on characteristics of the response or lack of response from the memory device 540, or explicitly, based on particularly configured signaling from the memory device 540, based on a detection or prediction or imprinting or other degradation at the memory device 540), the host device 510 may attempt to recover data (e.g., backup data, redundant data) based at least in part on an auxiliary memory device 590. In one example, such a data recovery may be facilitated by the memory device 540 signaling an address of such an error, or returning an ECC error when an address with an error is accessed. In some examples, such signaling may include the memory device 540 signaling the failure instead of or in place of requested data of a read operation. Accordingly, the host device 510 may attempt to pull originally-requested data from a backup location.

The system 500 may be configured to recover from such conditions according to various procedures. For example, the host device 510 may perform a recovery by using a table of addresses, such as a translation lookaside buffer (TLB), a cache table, or any other logical or virtual mapping of addresses. Using such a table or other lookup resource, the host device may attempt to retrieve data from alternative storage to replace data that may be corrupted. In some examples, such an approach may prevent other failures at the host device, such as preventing a bluescreen event. In some examples, this approach may enable the host device 510 to recover from an ECC error at the memory device 540. In some examples, an exception may be passed to a processor at the host device (e.g., a CPU), which may initiate a fresh boot operation, where the host device 510 may be configured to reattempt to use the memory device 540 (e.g., for a preconfigured quantity of reattempts), or use an auxiliary memory device 590.

In one example of such a recovery, the system 500 may be configured such that parity bits are stored elsewhere in the system 500 (e.g., separate from the memory device 540). In other words, when writing data to the memory device 540, parity bits related to that data may be written to an auxiliary memory device 590. In such examples, the system 500 may be configured such that the host device 510 can attempt to correct for a data error at the memory device 540 using multiple memory devices (e.g., at least one auxiliary memory device 590), which may include performing a more-sophisticated error correction scheme (e.g., as coordinated at the host device 510) than what is performed or supported at the memory device 540 (e.g., a chip-level or on-die ECC scheme).

In some examples, such schemes may be supported or augmented by a bit flipper of the memory device 540, which may improve the robustness of a memory device 540 to certain types of malicious attacks. For example, a bit flipper functionality that includes an inverted writeback may inherently increase robustness to malicious imprint, because the inverted writeback may itself inhibit or recover certain aspects of imprint. However, the described techniques may thwart other malicious attacks, or attacks where inverted writeback is insufficient to inhibit or prevent imprinting. Moreover, the described techniques are beneficial to a system 500 or a memory device 540 that is not configured with certain inverted writeback techniques, or other inherent resistance to imprint or other memory degradation that may be exploited.

Figure 6:
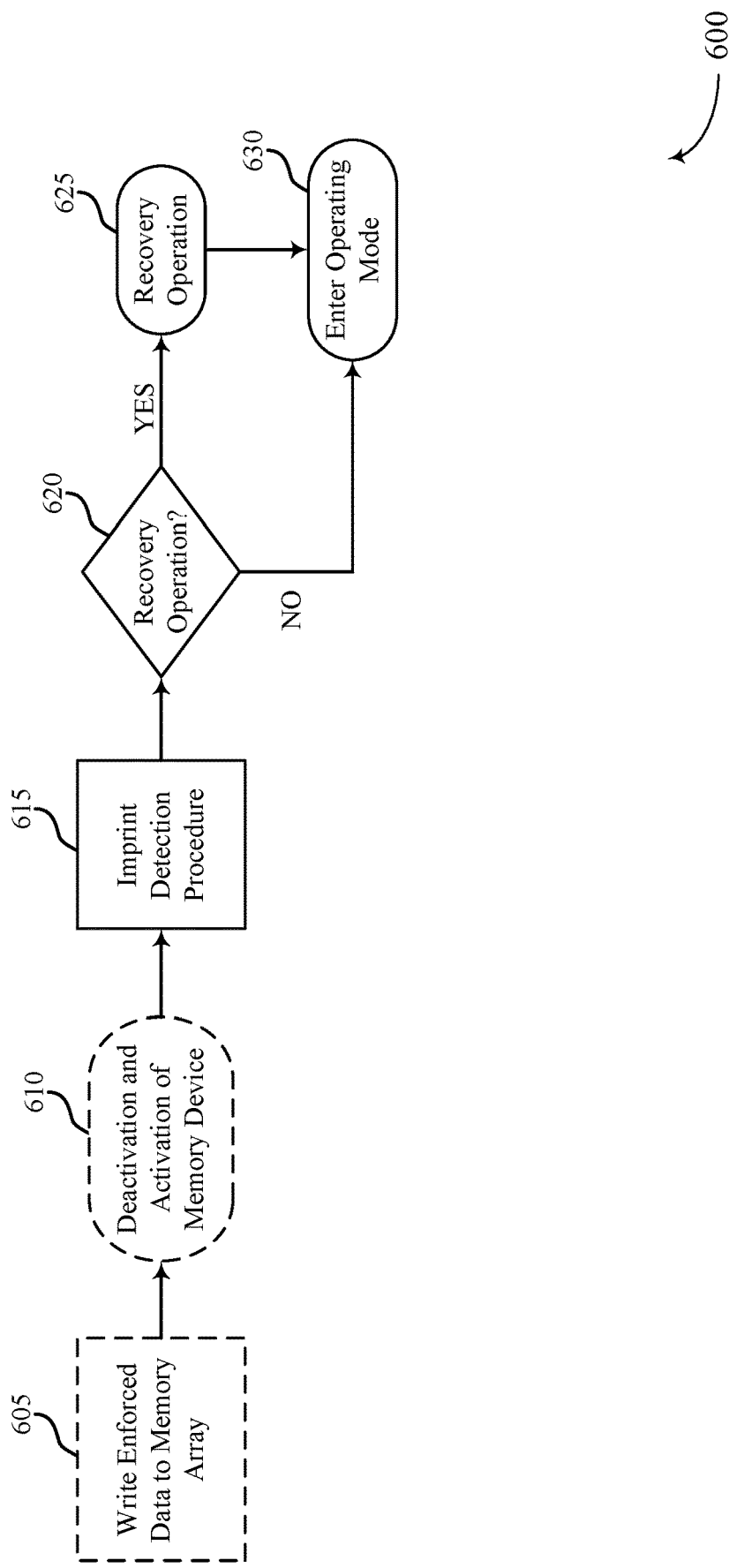
FIG. 6 illustrates an example of a process flow that supports imprint management for memory systems in accordance with examples as disclosed herein.

FIG. 6 illustrates an example of a process flow 600 that supports imprint management for memory systems in accordance with examples as disclosed herein. The features of the process flow 600 may be implemented or performed by a memory device (e.g., a memory device 110, a memory die 160, a memory die 200, or a memory device 540 described with reference to FIGS. 1 through 5) or one or more components of a memory device (e.g., a device memory controller 155, a local memory controllers 165, a local memory controller 265, a memory controller 550, or an imprint detection component 560) as described with reference to FIGS. 1 through 5. In some examples, one or more of the described techniques may be offloaded to a host device (e.g., performed by or otherwise controlled by a host device 510 or imprint manager 525 described with reference to FIG. 5).

In some cases, when performing an imprint detection procedure on memory cells of a memory array, logic states stored by the memory cells may be random from the perspective of the imprint detection procedure. For example, the logic states stored by the memory cells may be unknown or otherwise not specifically configured to support the imprint detection procedure. In other words, a memory device may, in some cases, perform an imprint detection procedure at 615 on memory cells for which the previously stored data is unrelated to (e.g., irrespective of, not specific to) the imprint detection procedure. For example, the memory cells of the memory array on which the imprint detection procedure is performed may have been used to store application data prior to the imprint detection procedure (e.g., prior to conditions associated with imprinting). In such cases, the memory device may use whatever data happened to be stored to the memory cells prior to starting the imprint detection procedure at 615 as potentially imprinted data, or potentially imprinted logic states. In such cases, the memory device may or may not rely on a degree of randomness of the stored data as supporting a mix of logic states throughout evaluated memory cells of a memory array, or portion thereof, that is used in an imprint detection procedure at 615.

In other cases, prior to performing the imprint detection procedure at 615, the memory device may, at 605, write enforced (e.g., known, preconfigured) data to memory cells that are to be evaluated (e.g., a subset of the array), so that in the event of a subsequent imprint detection procedure, the memory device may perform the imprint detection procedure on these memory cells and treat the enforced data as the potentially imprinted logic states. The memory device may write the enforced data proactively, and according to various techniques, before determining to initiate the imprint detection procedure (e.g., before a shutdown and subsequent reactivation at 610). Writing the enforced data may include the memory device writing all memory cells of (e.g., of a subset of cells for an imprint evaluation) to the same logic state (e.g., writing "solid" enforced data), to a desired mix of logic states (e.g., writing "mixed" enforced data, writing a known or preconfigured proportion of different logic states), or to a known pattern of logic states (e.g., alternating logic states, a "checkerboard" pattern)).

As one example, a memory device may use one or more copy word lines or pages (e.g., memory cells, memory pages, or memory sections made available by a wear-leveling or other procedure) as a subset of memory cells to which to write the enforced data at 605. In some examples, a memory controller may transfer data between memory cells of one or more of the memory arrays, or with an auxiliary memory device, based on a wear-leveling procedure or algorithm. Wear-leveling may include, for example, transferring application data from one physical location to another physical location within a memory array, or across or between memory arrays, which may prevent one memory cell or subset of a memory array from being written or read more (e.g., significantly more) than another memory cell or another subset. Excessive accesses may decrease the lifetime of an overused memory cell compared to a memory cell that is not accessed as often, and thus wear-leveling may protect a memory device against overuse of individual memory cells that may cause the memory cell to prematurely fail.

In some cases, a memory array may include extra (e.g., spare) memory cells, rows, or pages, which may support transferring or otherwise shifting application data within the memory array. In some examples, such space in a memory array, or such shifting of application data, may be part of a wear-leveling functionality. In some examples, such spare memory cells may be referred to as gap memory cells, or may be associated with one or more gap word lines or gap pages. Thus, as a result of these and other aspects of operation or configuration, at any given time, some memory cells of a memory array may not be actively storing application data, or such data may be unimportant to the memory device or the host device.

In some cases, spare memory cells may be available and used to store known or enforced data that may be available for use in a subsequent imprint detection procedure. As application data shifts in physical location in accordance with a wear-leveling procedure, known or enforced data for use in a subsequent imprint detection procedure may also shift (e.g., to a newly available row or page that is not actively being used for application data). In some cases, the wear leveling operation may be performed on a word line basis, and a word line coupled with memory cells presently unused for application data may be referred to as a copy word line or shift word line. As such, a first set of logic states (e.g., in a known or enforced pattern) may be written to memory cells coupled with one or more copy word lines made available by the wear leveling operation. Upon activation of a memory device, or other triggering of the memory device, the memory controller may perform an imprint detection procedure using the known or enforced pattern of logic states written to memory cells of the memory arrays made available by the wear leveling procedure (e.g., memory cells coupled with copy word lines).

In some cases, known or enforced data may be continuously updated (e.g., refreshed) at a memory array. In such cases, known or enforced data may be present at the memory array in the event of sudden or unexpected deactivation events (e.g., power loss, crash), or other standby events where a host device or memory device may not be actively monitored or otherwise operated. In some cases, a memory controller may enforce a set of logic states at the memory array as part of one or more deactivation procedures, which may be included when initiating a shutdown or standby mode. For example, when a device, such as a host device, initiates a deactivation procedure, a host device controller 520, an imprint detection component 525, a memory controller 550, or an imprint detection component 560 may identify one or more portions of a memory array 555 for enforcing a data condition, and the memory device may write enforced data to the identified portions of the memory array.

In some examples, a memory device (e.g., an imprint detection component 560) may record or otherwise track enforced logic states such that subsequent access operations (e.g., read operations, write operations) of the same subset of memory cells can be compared to the enforced logic states, or be otherwise based on the enforced logic states (e.g., when determining an evaluation data condition based on an imprinted data condition). In some examples, an imprint detection component 560 or memory controller 550 may write a pattern of data as the enforced logic states. For example, the enforced data may include an alternating pattern of logic 0s and logic 1s, which may be referred to as a checkerboard pattern, a solid pattern of all logic 0s or all logic 1s, or various other combinations or distributions of logic 0s and logic 1s. In some examples, enforcing a known data condition may include reading and recording a set of logic states already written to the subset of memory cells. In this regard, a record of the written or stored data may be used as the enforced or known logic states.

In some cases, a memory device or host device may perform an imprint detection procedure in response to a deactivation and reactivation of the memory device. For example, at 610, the memory device may be deactivated (e.g., as part of a power down procedure of a device associated with the memory device, as part of entering a standby mode). While deactivated, the memory device may be exposed to various environmental conditions (e.g., increased temperatures), which may be relevant to whether memory cells of the memory device become imprinted. Whether due to adverse environmental conditions or otherwise, imprint may, in some cases, occur while the memory device is deactivated or in a standby state. In a deactivated state or standby state, the memory device may not track or sense the environmental conditions to which it was exposed, or the duration for which it was deactivated. The memory device may subsequently be activated at 610 (e.g., prior to 615).

Upon activation, a memory device or host device may not have data or information (e.g., relevant to a probability of imprinting while the memory device was deactivated) that can be used to determine whether to perform an imprint recovery procedure. In some cases, a host device may initiate, or the memory device may otherwise perform (e.g., autonomously) one or more evaluations upon activation. For example, as part of a power-on self-test (POST) process, a host device may instruct a memory device to perform, or the memory device may otherwise initiate or perform one or more tests to determine if the memory device is functioning within one or more specifications (e.g., specifications related to memory cell equalization or normalization), which may include an imprint detection procedure.

At 615, the memory device or host device may perform an imprint detection procedure. In some cases, a memory device may perform an imprint detection procedure based on deactivation and activation at 610, or on another basis as described herein. In various examples, the operations of 615 may follow (e.g., be triggered by) an activation of the memory device, or may be triggered based on an imprint evaluation performed during other operations of the memory device or host device. In some examples, the operations of 615 may be performed continuously until detecting the presence of imprint, or initiated based on some other indication of imprint (e.g., a static bake condition, an identification or inadvertent or malicious access patterns that may cause imprint). In some examples, the imprint detection procedure may include identifying a subset of memory cells of a memory array 555 for performing one or more steps of the imprint detection process.

In some cases, a subset of memory cells for an imprint detection procedure may be based on locations of the memory that were written to enforced logic states. For example, the subset of cells may be based on or correspond to portions of a memory array 555 written at step 605. In cases where the memory device did not previously enforce data, the memory device may, at 615, select a subset of memory cells for performing the imprint detection procedure. The subset of memory cells may be predefined, randomly selected, or be selected based on one or more other configurations or activation procedures. In some examples, a subset of memory cells selected for an imprint detection procedure may include one or more arrays 555 or different sections of a memory device.

As part of an imprint detection procedure, at 615, the memory device may write a first set of logic states to the subset of memory cells. In some examples, the first set of logic states may include a known (e.g., preconfigured, predefined, enforced) pattern. For example, the memory device may write solid data of all logic 0s or logic 1s to the subset of memory cells. In some examples, the memory device may write an opposite logic state to each memory cell of the subset, for example, by reading the current data state of a memory cell (e.g., using a default reference voltage) and then writing the opposite state to the respective memory cell, which may be referred to as a read-invert-writeback procedure. In some examples, the memory device may write a mix of logic states as the first set of logic states. This may include writing a pattern such as a pattern or alternating logic 1s and logic 0s, a random set of logic states, or any other combination of logic states.

In cases, where enforced data was written to a memory array prior to a suspected imprint event (e.g., prior to deactivation of the memory device, prior to the memory device entering a standby state), the first set of logic states may be based on the enforced data. For example, if a solid set of logic states (e.g., all logic 0s) was enforced prior to deactivation, the memory device may write an opposite solid set of logic states (e.g., all logic 1s), the same logic states (e.g., all logic 0s) or other logic pattern as described herein. In some cases, the memory device may write a pattern of data to the subset of memory cells prior to deactivation.

As another part of the imprint detection procedure, the memory device may perform one or more read operations on the one or more portions of the subset of memory cells (e.g., the memory cells). The read operation on the subset of memory cells may produce another set of logic states (e.g., a second set of logic states) that the memory device may compare to the first set of logic states (e.g., as written at 615). In some case, the memory device may perform additional read or write operations on the subset of memory cells to obtain additional sets of logic states as part of the imprint detection analysis.

In some cases, the memory device or host device may obtain the second set of logic states or other, additional sets of logic states, based on reading the evaluated memory cells using one or more different reference voltages. For example, the memory device may be configured with a default or operational reference voltage for use when reading logic states of the memory array (e.g., under normal operation). The default or operational reference voltage may be set to reduce or minimize the amount of read errors that occur during read operations during normal operation (e.g., when a memory array 555 is in an access mode or normal operating mode). In some cases, the memory device or host device may obtain a second set of logic states by reading the evaluated memory cells using the default reference voltage. In some examples, the memory device or host device may obtain a second set of logic states by reading the evaluated memory cells using one or more offset reference voltages. In such cases, an offset reference voltage may be associated with an expected number of errors or mismatches as discussed herein (e.g., according to a probabilistic distribution of memory cell behavior).

The memory device may determine one or more quantities of errors based on mismatches or discrepancies between written logic states (e.g., the first set of logic states, one or more target logic states of a preceding write operation) and read logic states (e.g., the second set of logic states). In some cases, the memory device or host device may compare the logic state that was read from each memory cell to a known, recorded, or enforced value for the logic state that was previously written to that memory cell. The memory device or host device may determine an error or mismatch if the logic states are different and determine that no error or mismatch occurred if the logic states are the same. The memory device or host device may count the number of errors for one or more portions of the subset of memory cells to determine a quantity of errors.

At 620, the memory device or host device may determine whether a recovery operation should be performed (e.g., based at least in part on the imprint detection procedure performed at 615). In some examples (e.g., when an imprint detection procedure at 615 includes identifying quantities of errors or mismatches), such a determination of whether a recovery operation should be performed may be based on an identified quantity of errors or mismatches, such as comparing an identified quantity of errors or mismatches to a threshold. For example, if the second set of logic states was obtained by reading the memory cells using a default reference voltage, then the threshold may be relatively low (e.g., at or close to zero errors, based on a capability of an ECC operation or ECC component 570). In some cases, where a second set of logic states was obtained by reading the memory cells using an offset reference voltage (e.g., a reference voltage above or below the default reference voltage), the threshold may be relatively higher (e.g., based on an expected or probabilistic number of errors that would occur with reading at the offset voltage as described herein, such as in relation to FIG. 7).

In some cases, the memory device or host device may determine a first quantity of errors (e.g., from reading using a first threshold voltage) and a second quantity of errors (e.g., from reading using a second threshold voltage) and determine whether a recovery operation should be performed based on both the first and second quantity of errors. This may include determining a gradient parameter (e.g., a difference, a linear slope, a non-linear regression) between the first quantity of errors and the second quantity of errors, examples of which are further described herein (e.g., in relation to FIG. 7). In some cases, a memory device or host device may determine to perform a recovery operation, for example, based on determining that a threshold was satisfied. The threshold may, for example, relate to a number of errors, the gradient parameter, or other parameters.

In some examples, a memory device may indicate to a host device that a recovery operation is needed, and the memory device may wait to receive instructions (e.g., a command to perform the recovery operation, or a command to enter an access or other operating mode, an approval to proceed with the recovery procedure) from the host device. Thus, in some cases, the host device may make the determination of whether or when the memory device should perform the repair procedure in response to signaling from the memory device. In cases where the memory device determines that a repair operation is not needed (e.g., the threshold is not satisfied) the memory device may indicate to a host device that it is ready to complete a boot procedure or otherwise enter an access or other operating mode (e.g., an indication by a memory device 540, based at least in part on determining that a memory array 555 is not imprinted or is not imprinted above a threshold, that the memory device 540 is available for access operations).

At 625, the memory device or the host device may perform the recovery operation, which may include cycling memory cells of a memory array one or more times (e.g., according to a biasing pattern, according to a pattern of access operations). For example, the memory device may perform a plurality of access operations (e.g., read and write operations) on one or more memory arrays of the memory device. In some cases, the write operations may comprise inverted writeback operations, in which a respective memory cell is read (e.g., using a default reference voltage) and the complement or opposite of the determined (e.g., read) logic state is written back to the respective memory cell. In some examples, the recovery operation of 620 may include performing a plurality of write operations to all or substantially all of the of the memory cells in a memory array based on analyzing data from the subset of memory cells of the same memory array, or a different memory array.

In some examples, the memory device may determine that the recovery operation has completed and send one or more related indications to the host device. In some cases, the memory device may perform the cycling operation and then send an indication to a host device that the memory device can be booted and used by the host device, or that the memory device may enter an access or other operating mode. In some cases, upon completing the recovery operation, the memory device may perform a subsequent or second imprint detection procedure to determine or otherwise evaluate whether the repair operation was successful (e.g., to confirm that the recovery operation was successful prior to indicating an availability to the host device or transitioning to a normal operating mode.

At 630, the memory device of the host device, either after determining at 620 not to perform a recovery operation or after completing the recovery operation at 625 may enter an operating mode (e.g., a normal operating mode, an access mode). In various examples, this may include resuming an access mode or normal operating mode, or completing a boot process.

Although the example of process flow 600 illustrates an imprint detection that leverages written and read logic states of a memory array (e.g., according to a direct detection or evaluation of a presence of imprint), other examples of the process flow 600 may leverage other techniques for imprint detection, or may instead make a decision regarding recovery operations (e.g., at 620) based on a prediction or inference regarding memory cell imprint, such as detecting or identifying conditions that may be related to or otherwise be accompanied by memory cell imprinting or other memory cell asymmetry of failures (e.g., elevated temperatures, inactive durations, a detection or inadvertent or malicious access operations or patterns that may cause imprint or other skewing, asymmetry, or other adverse memory cell characteristics).

Figure 7:
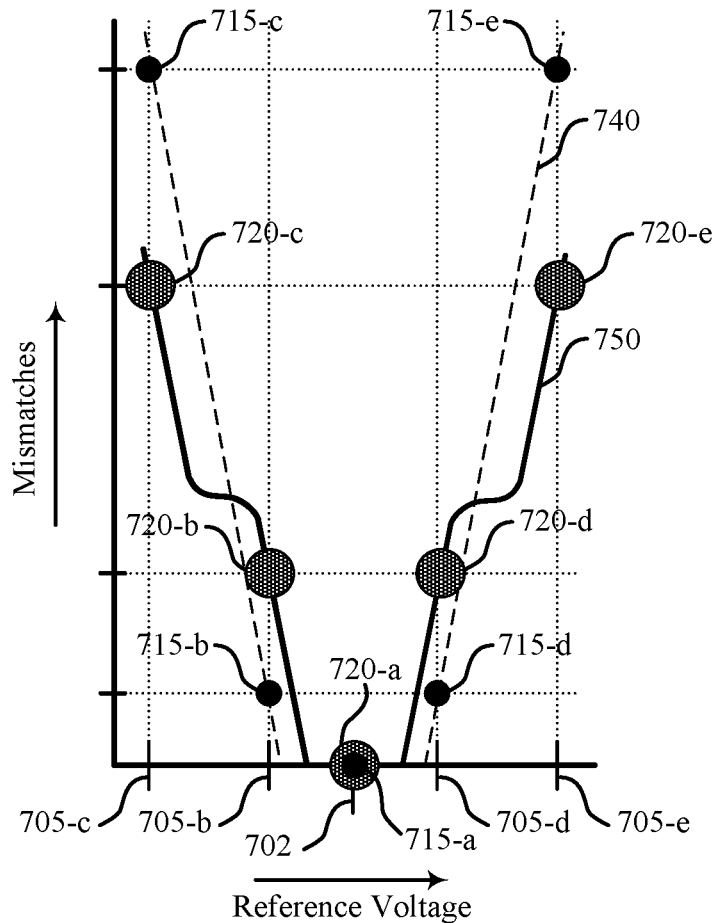
FIG. 7 illustrates a plot of imprint detection conditions that may support imprint management for memory systems in accordance with examples as disclosed herein.

FIG. 7 illustrates a plot 700 of imprint detection conditions that may support imprint management for memory systems in accordance with examples as disclosed herein. The plot 700 may be illustrative of quantities of mismatches between target logic states (e.g., written logic states, logic states attempted to be written, expected logic states) and detected logic states (e.g., read logic states), as a function of reference voltage used to detect the stored logic states (e.g., by a sense component 250, via a reference line 255). One or more of the illustrated imprint detection conditions may be implemented or performed as part of an imprint detection procedure by a memory device (e.g., a memory device 110, a memory die 160, a memory die 200, or a memory device 540 described with reference to FIGS. 1 through 5) or one or more components of a memory device (e.g., a device memory controller 155, a local memory controllers 165, a local memory controller 265, a memory controller 550, or an imprint detection component 560) as described with reference to FIGS. 1 through 5.

In the example of plot 700, a non-imprinted characteristic 740 may illustrate an expected number of mismatches when reading a representative population of memory cells 205 at different reference voltages without imprinting (e.g., when the representative population of memory cells 205 are equalized or normalized). For example, an expected number of mismatches may be related to a stochastic or probabilistic relationship of read voltages resulting from a read operation, and a respective reference voltage. According to the illustrated example of plot 700, a read signal (e.g., of a digit line 215) being higher than a reference voltage (e.g., of a reference line 255) may indicate a logic 1, and a read signal being lower than a reference voltage may indicate a logic 0. In a middle voltage region (e.g., near a default reference voltage), an expected number of mismatches for a given reference voltage may be zero. In some examples, an expected number of mismatches may be zero throughout range of reference voltages corresponding to a read window. As a reference voltage is increased or decreased beyond such a middle region, expected mismatches or errors may increase along a slope according to the probabilistic or stochastic relationship.

In the example of plot 700, an imprinted characteristic 750 may illustrate a number of mismatches when reading the same representative population of memory cells 205 at different reference voltages when the representative population of memory cells have been imprinted with one or more logic states. In contrast to the non-imprinted characteristic 740, the imprinted characteristic 750 may have a kinked slope related to an imprint of multiple or mixed logic states. For example, on either side of a central region (e.g., around a default reference voltage 702), one side of the kink may be related to the behavior of memory cells imprinted in one logic state and another side of the kink may be related to behavior of memory cells imprinted in another, different logic state. In some examples, such a kinked behavior may be leveraged as part of an imprint detection operation.

In other examples, a representative population of memory cells may be imprinted with a single logic state (not shown), and an imprinted characteristic 750 may have a same or similar slope as a non-imprinted characteristic 740, but the imprinted characteristic 750 may be shifted along the reference voltage axis. In such examples, the shifting of the characteristic may be leveraged as part of an imprint detection operation (e.g., based on detecting or identifying an asymmetry relative to a default reference voltage 702, based on detecting higher mismatches than expected on one side of a default reference voltage 702 but not the other).

In some examples, an imprint detection procedure may include reading a subset of memory cells at one or more reference voltages (e.g., a default reference voltage 702, one or more offset reference voltages 705) and determining a number of mismatches (e.g., errors, discrepancies) between logic states that were read using the respective reference voltage and previously written logic states or target logic states as described herein. The plot 700 illustrates example relationships between different reference voltages 702 and 705 used to read logic states, an expected number of mismatches 715 (e.g., fails, errors, or discrepancies expected for a normalized or equalized memory array 555, according a probabilistic or stochastic relationship) when reading at a respective reference voltage 702 or 705, and a measured number of mismatches 720 (e.g., fails, errors, or discrepancies) for an example of an imprinted memory array 555 when reading at a respective reference voltage 702 or 705.

The default reference voltage 702 may be a default or operational reference voltage for a memory device. Read operations using the default reference voltage 702 may be expected to produce no errors (e.g., where an expected number of mismatches 715-a equals zero), a statistically insignificant number of errors, or a number of errors less than what may be corrected by an ECC operation when the memory cells of the memory array are functioning properly (e.g., when no imprint has occurred, in an equalized or normalized memory array 555). In some cases, the default reference voltage 702 may be a reference voltage that the memory device uses when performing access operations during normal operating procedures, such as data accesses associated with application data. Although, in some examples, the default reference voltage 702 may be fixed at a memory device, in other examples the default reference voltage 702 (e.g., for normal operations, for default operations) may be adjusted at a memory device over the course of operating the memory device for reasons unrelated to imprinting (e.g., as an adaptive reference voltage, as a configurable reference voltage, to compensate for changes in memory device or memory cell behaviors applicable to normalized or equalized operations).

As part of an imprint detection procedure, the memory device may read memory cells using one or more offset reference voltages 705, which may be less than the default reference voltage 702 (e.g., offset reference voltages 705-b or 705-c) or greater than the default reference voltage 702 (e.g., offset reference voltages 705-d or 705-e). In some cases, as part of an imprint detection procedure, a measured numbers of mismatches 720 as detected at different offset reference voltages 705 may deviate from expected numbers of mismatches 715, which may be associated with memory cells being imprinted in different logic states.

In some cases, a memory device may determine logic states stored at memory cells to be evaluated for imprinting using an offset reference voltage 705 that is higher than or lower than the default reference voltage 702, and may compare a measured quantity of mismatches 720 at the offset reference voltage 705 with an expected quantity of mismatches 715 at the offset reference voltage as part of an imprint evaluation. For example, the offset reference voltage 705-b may be associated with an expected number of mismatches 715-b when reading normally operating memory cells (e.g., not imprinted, not degraded, equalized, normalized), the offset reference voltage 705-b may be associated with an expected number of mismatches 715-b when reading normally operating memory cells, the offset reference voltage 705-b may be associated with an expected number of mismatches 715-b when reading normally operating memory cells, and the offset reference voltage 705-b may be associated with an expected number of mismatches 715-b when reading normally operating memory cells.

In some cases, a memory device may read a subset of memory cells using the offset reference voltage 705-b as part of an imprint detection procedure. The memory device may determine a measured number of mismatches 720-b from reading the subset of memory cells using the offset reference voltage 705-b, and if at least a portion of the memory cells have become imprinted, then the measured number of mismatches 720-b may be greater than or equal to the expected number of mismatches 715-b. In some cases, reading the subset of memory cells using the offset reference voltage 705-b may indicate or measure whether cells that were written to a logic 0 state (e.g., a target logic state) are imprinted in a logic 1 state. For example, the measured number of mismatches 720-b may be greater than the expected number of mismatches 715-b if the imprint detection procedure is measuring memory cells intended to store a logic 0 state but are imprinted in a logic 1 state.

In some cases, a memory device may read a subset of memory cells using the offset reference voltage 705-*c* as part of an imprint detection procedure. The memory device may determine a measured number of mismatches 720-*c* from reading the subset of memory cells using the offset reference voltage 705-*c*, and if at least a portion of the memory cells have become imprinted, then the measured number of mismatches 720-*c* may be less than or equal to the expected number of mismatches 715-*c*. In some cases, reading the subset of memory cells using the offset reference voltage 705-*c* may indicate or measure whether cells that were written to a logic 0 state (e.g., a target logic state) are also imprinted in a logic 0 state. For example, the measured number of mismatches 720-*c* may be less than the expected number of mismatches 715-*c* if the imprint detection procedure is measuring memory cells intended to store a logic 0 state that are also imprinted in a logic 0 state.

In some cases, a memory device may read a subset of memory cells using the offset reference voltage 705-*d*. The memory device may determine a measured number of mismatches 720-*d* from reading the subset of memory cells using the offset reference voltage 705-*d*, and if at least a portion of the memory cells have become imprinted, then the measured number of mismatches 720-*d* may be greater than or equal to the expected number of mismatches 715-*d*. In some cases, reading the subset of memory cells using the offset reference voltage 705-*d* may indicate or measure whether cells that were written to a logic 1 state (e.g., a target logic state) are imprinted in a logic 0 state. For example, the measured number of mismatches 720-*d* may be greater than the expected number of mismatches 715-*d* if the imprint detection procedure is measuring memory cells intended to store a logic 1 state but are imprinted in a logic 0 state.

In some cases, a memory device may read a subset of memory cells using the offset reference voltage 705-*e* as part of an imprint detection procedure. The memory device may determine a measured number of mismatches 720-*e* from reading the subset of memory cells using the offset reference voltage 705-*e*, and if at least a portion of the memory cells have become imprinted, then the measured number of mismatches 720-*e* may be less than or equal to the expected number of mismatches 715-*e*. In some cases, reading the subset of memory cells using the offset reference voltage 705-*e* may indicate or measure whether cells that were written to a logic 1 state (e.g., a target logic state) are also imprinted in a logic 1 state. For example, the measured number of mismatches 720-*e* may be less than the expected number of mismatches 715-*e* if the imprint detection procedure is measuring memory cells intended to store a logic 1 state that are also imprinted in a logic 1 state.

In some cases, an ability to detect imprint in a memory array, based on memory cells intended to store a logic state that may be imprinted in a same logic state or a different logic state, may be dependent on an initial distribution of imprinted memory cells (e.g., a quantity or proportion of memory cells imprinted in logic 0 state and a quantity or proportion of memory cells imprinted in logic 1 state), a set of logic states written to the subset of memory cells (e.g., an imprinted set of logic states, a first set of logic states), a quantity of imprinted memory cells, or a combination thereof. Accordingly, to support various examples of imprint evaluation, a memory device may be configured to read memory cells according to a default reference voltage 702, one or more offset reference voltages 705, or various combinations thereof, where the such conditions may be preconfigured, or selected or indicated by a memory device of a host device.

Figure 8A:
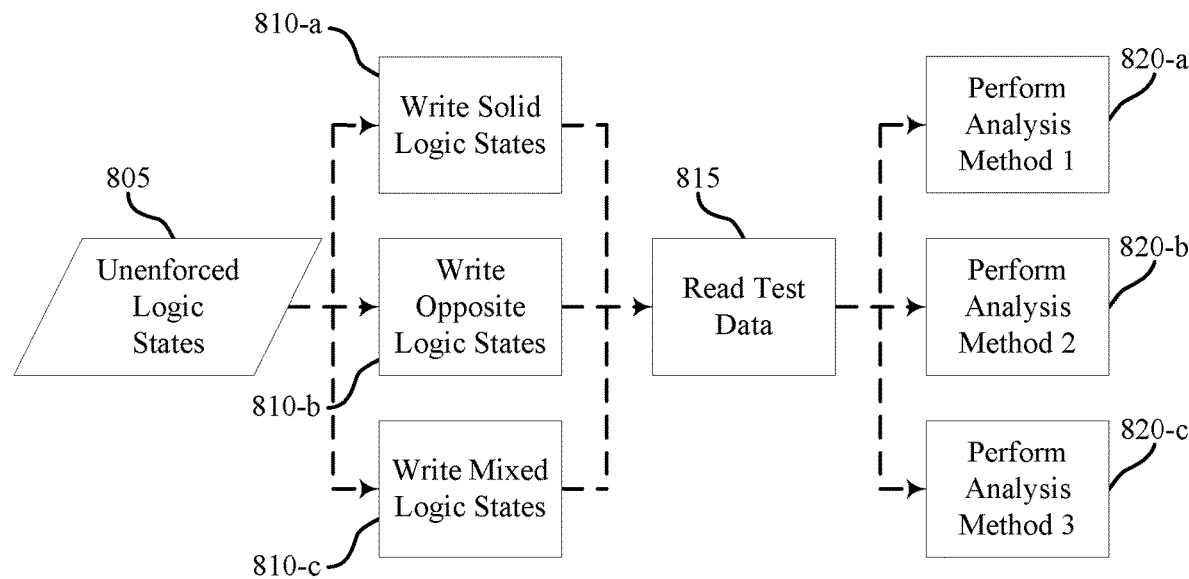
FIGS. 8A and 8B illustrate examples of imprint evaluation processes that support imprint management for memory systems in accordance with examples as disclosed herein.

FIG. 8A illustrates an example of an imprint evaluation process 800-*a* that supports imprint management for memory systems in accordance with examples as disclosed herein. The operations of the imprint evaluation process 800-*a* may be implemented or performed by a memory device (e.g., a memory device 110, a memory die 160, a memory die 200, or a memory device 540 described with reference to FIGS. 1 through 5) or one or more components of a memory device (e.g., a device memory controller 155, a local memory controller 165, a local memory controller 265, a memory controller 550, or an imprint detection component 560) as described with reference to FIGS. 1 through 5. In some examples, one or more of the described techniques may be offloaded to a host device (e.g., performed by or otherwise controlled by a host device 510 or imprint manager 525 described with reference to FIG. 5). In other words, a system (e.g., a system 500) may be configured to perform the imprint evaluation process 800-*a* according to various distributions of operations between a memory device and a host device. The operations of imprint evaluation process 800-*a* may include one or more techniques described with reference to FIGS. 1 through 7. In some examples, the imprint evaluation process 800-*a* may be configured to evaluate whether one or more memory cells of a memory array have undergone a shift from an unimprinted hysteresis curve 430 to an imprinted hysteresis curve 440, or any other change in hysteresis or charge mobility properties that may be caused by memory cell imprint.

The imprint evaluation process 800-*a* illustrates examples of operations that may be variously combined to support multiple possible implementations of an imprint detection procedure, where the logic states of memory cells used to perform the procedure are not known at (e.g., are not enforced prior to) the start of the procedure. For example, prior to a deactivation event, a standby event, or an otherwise triggered imprint detection procedure or evaluation mode, an imprint detection circuit (e.g., an imprint detection component 560, an imprint manager 525) or a controller (e.g., a memory controller 550, a host device controller 520) may not have written to or read data from the memory array for later use in the imprint detection procedure. In some examples, the imprint detection procedure may be performed as part of a boot sequence and the memory device may not have stored a record as to which logic states are stored at respective memory cells. In some examples, the memory device may not have performed a read operation to determine the logic states of the memory cells after deactivation. The imprint detection procedure may be triggered or initiated based on various criteria, such as a memory device or host device being powered on, a memory device or host device being initialized, a memory device or a host device being awakened from a sleep or standby state, based on operational criteria such as a quantity or rate of errors (e.g., as corrected by an ECC component or algorithm) exceeding or otherwise satisfying a threshold, or entering a diagnostic mode or maintenance mode, and other criteria.

At 805, the memory device or host device may identify one or more subsets of memory cells for performing the imprint detection procedure, which may be storing unenforced logic states (e.g., unknown logic states, logic states that may not be specific to imprint detection operations, a set of logic states that may or may not have been imprinted). The subset(s) of memory cells may include a portion of the memory cells, such as a portion of a memory array 555, may span more than one array, may be distributed throughout different portions of one or more memory arrays 555, or a combination thereof. The subset of memory cells may be determined by the memory device or host device upon initiating the imprint detection procedure or may be dedicated (e.g., preconfigured to be used) for performing imprint detection procedures.

At 810, the memory device or host device may write a set of logic states (e.g., a first set of logic states) to the subset of memory cells of the memory array. The logic states written to the subset of memory cells may be referred to as a set of imprint evaluation logic states, written evaluation logic states, or more generally, imprint evaluation data. The imprint evaluation process 800-*a* illustrates three examples of writing a set of logic states to support an imprint detection evaluation, one or more of which may be selected or performed by the memory device or host device based on various criteria (e.g., a configuration of a memory device or host device, a preconfiguration of a memory device or host device, a selection and a command by a host device to the memory device, operating conditions of the host device or memory device, data type, distribution of logic states that may be imprinted, and others).

As a first example, at 810-*a*, the memory device or host device may write a set of solid (e.g., same, equal, identical) logic states to all of the subset of memory cells. In some cases, this may include writing each cell to represent a logic 0. In other cases the memory device or host device may write each cell to represent a logic 1. In various examples, the memory device or host device may write a set of solid logic states with or without reading or determining the current (e.g., imprinted, potentially imprinted) logic state written to each cell.

As a second example, at 810-*b*, the memory device or host device may write a set of opposite logic states to the subset of memory cells. In some examples, writing a set of opposite logic states may include performing a read-invert-write back procedure for each cell. For example, for each of the subset of memory cells, the memory device or host device may read a current logic state of the respective memory cell (e.g., using a default reference voltage 702), invert that logic state (e.g., determine an opposite or complement of the read logic state), and write back the inverted or opposite logic state to the respective memory cell. In some examples, such techniques may assume or rely on some amount of charge or other characteristic being stored in respective memory cells at 810-*b* that would be indicative of a potentially imprinted logic state.

As a third example, at 810-*c*, the memory device or host device may write a set of mixed data to the subset of memory cells. In some cases, writing the set of mixed data may include writing a pattern (e.g., checkerboard pattern, alternating logic states), writing random data, writing a distribution or proportion of multiple logic states, reading and writing back the same logic state (e.g., an as-read logic state, a non-inverted logic state, based on reading the subset of memory cells using a default reference voltage 702), or other logic states to the subset of the memory array.

In some examples, the memory device or host device may record or track which logic states are written to respective memory cells. The memory device or host device may record or track the first set of logic states for comparison at a later point in the imprint detection procedure (e.g., during an evaluation operation).

In some cases, different portions of one or more memory arrays may be used for performing different parts (e.g., sub-operations) of the imprint detection procedure 800-*a*. For example, a memory device or host device may write a first portion of the first set of logic states to a first portion of the subset of memory cells and a second (e.g., remaining) portion of the first set logic states to a second portion of the subset of memory cells. In some examples, the memory device or host device may write the same pattern or set of logic states to multiple portions of the subset of memory cells. For example, the subset of memory cells may contain multiple repeating sets of logic states. In this regard, the memory device or host device may use the different sets of logic states written to different portions of the array to perform different parts of a subsequent read operation (e.g., at 815).

At 815, the memory device or host device may read the subset of memory cells, which may include reading logic states that it wrote (e.g., test data, evaluation data) or attempted to write to the subset of memory cells at step 810, to obtain a second set of logic states. In some cases, the memory device or host device may write the entire set of test data at 810 and then perform the read operation at 815 on the subset of memory cells. In some cases, the memory device or host device may wait a defined or pre-determined duration or delay between writing the test data and reading the test data (e.g., between a writing of 810 and a reading of 815).

The memory device or host device may read the test data (e.g., read the memory cells of the subset) one or more times, using one or more reference voltages, such as a default reference voltage 702 or one or more offset reference voltages 705. In some cases, the reference voltage used to read the test data written to the subset of memory cells may depend on (e.g., be selected or determined based at least in part on) a method of analysis used to evaluate whether imprint has occurred or whether the memory device should perform a recovery procedure.

At 820, the memory device or host device may perform an imprint evaluation method based at least in part on the test data read or determined at 815 (e.g., to determine whether or not to perform an imprint recovery). The process flow 800-*a* illustrates three examples for performing an imprint detection evaluation, one or more of which may be selected and performed based on various criteria (e.g., a configuration of a memory device or host device, a preconfiguration of a memory device or host device, a selection and a command by a host device to the memory device, operating conditions of the host device or memory device, data type, distribution of logic states that may be imprinted, and others).

At 820-*a*, the memory device or host device may perform a first method of analysis (e.g., Method 1) that may include reading the subset of memory cells at two offset reference voltages. For example, the memory device or host device may evaluate or compare data (e.g., a measured quantity of mismatches 720 or errors) obtained using a first offset reference voltage 705 to data (e.g., a measured quantity of mismatches 720 or errors) obtained using a second offset reference voltage 705. In some cases, the first and second offset reference voltages 705 may both be below, or both be above, a default reference voltage 702. For example, the memory device or host device may obtain a second set of logic states by reading the subset of memory cells using a first offset reference voltage 705 that is below the default reference voltage 702 (e.g., an offset reference voltage 705-*b*). The memory device or host device may obtain a third set of logic states by reading the subset of memory cells using a second offset reference voltage 705 that is also below the default reference voltage (e.g., an offset reference voltage 705-*c*).

In some cases, the first and second offset reference voltages 705 may both be less than a default reference voltage 702, and the second offset reference voltage 705 (e.g., offset reference voltage 705-*c*) may be less than the first offset reference voltage 705 (e.g., offset reference voltage 705-*b*, an offset reference voltage 705 that is farther from the default reference voltage 702 than the first offset reference voltage 705). The memory device or host device may obtain the second set of logic states by reading using the first offset reference voltage 705 before obtaining the third set of logic states by reading using the second offset reference voltage 705. In these cases, the memory device or host device may not need to re-write the first set of logic states to the subset of memory cells because the expected quantity of mismatches 715 due to reading at the second reference voltage 705 may be greater than the expected quantity of mismatches 715 due to reading at the first offset reference voltage 705, or because applying the first offset reference voltage 705 may be associated with a lesser change of charge state or polarization state than applying the second offset reference voltage 705 (e.g., the first offset reference voltage being associated with a non-destructive read operation, the first offset reference voltage being associated with a read operation that may not adversely affect a result of a read operation using the second offset reference voltage). In such examples, the memory device may or may not perform a rewrite operation between reading at the first offset reference voltage 705 and reading at the second offset reference voltage 705.

In some cases, the memory device or host device may read at the second offset reference voltage 705 (e.g., an offset reference voltage 705 having a greater difference from a default reference voltage 702 than the first offset reference voltage) prior to reading at the first offset reference voltage 705. In these cases, the memory device may or may not rewrite the first set of logic states to the subset of memory cells after reading using the second offset reference voltage 705 and prior to reading using the first offset reference voltage 705 (e.g., depending on whether logic states stored by the subset of memory cells may have been disturbed by reading at the second offset reference voltage 705). For example, the memory device may rewrite the first set of logic states if reading using the second offset reference voltage 705 may introduce a greater number of mismatches or errors due to reading at an offset reference voltage 705 that is farther from the default reference voltage 702, or if reading using the second offset reference voltage 705 is associated with a change in charge state or polarization state of the memory cells (e.g., when reading at the second offset reference voltage 705 is associated with a reduction in polarization of one or more of the memory cells, when a reading with the second offset reference voltage may affect a result of reading with the first offset reference voltage). In some examples, different subsets of memory cells may be used for the reading at the different offset reference voltages 705 (e.g., a first subset of memory cells for reading at the first offset reference voltage 705, a second subset of memory cells for reading at the second offset reference 705, where the first and second subsets are different or non-overlapping), which may overcome any issues related to reading the same memory cells at different reference voltages.

In some cases, the first and second offset reference voltages 705 may both be greater than a default reference voltage 702, and the second offset reference voltage 705 (e.g., offset reference voltage 705-*e*) may be greater than the first offset reference voltage 705 (e.g., offset reference voltage 705-*d*, an offset reference voltage 705 that is farther from the default reference voltage 702 than the first offset reference voltage 705). The memory device or host device may obtain the second set of logic states by reading using the first offset reference voltage 705 before obtaining the third set of logic states by reading using the second offset reference voltage 705. In these cases, the memory device or host device may not need to re-write the first set of logic states to the subset of memory cells because the expected quantity of mismatches 715 due to reading at the second reference voltage 705 may be greater than the expected quantity of mismatches 715 due to reading at the first offset reference voltage 705, or because applying the first offset reference voltage 705 may be associated with a lesser change of charge state or polarization state than applying the second offset reference voltage 705 (e.g., the first offset reference voltage being associated with a non-destructive read operation, the first offset reference voltage being associated with a read operation that may not adversely affect a result of a read operation using the second offset reference voltage). In such examples, the memory device may or may not perform a rewrite operation between reading at the first offset reference voltage 705 and reading at the second offset reference voltage 705.

In some cases, the memory device or host device may read at the second offset reference voltage 705 (e.g., an offset reference voltage 705 having a greater difference from a default reference voltage 702 than the first offset reference voltage) prior to reading at the first offset reference voltage 705. In these cases, the memory device may or may not rewrite the first set of logic states to the subset of memory cells after reading using the second offset reference voltage 705 and prior to reading using the first offset reference voltage 705 (e.g., depending on whether logic states stored by the subset of memory cells may have been disturbed by reading at the second offset reference voltage 705). For example, the memory device may rewrite the first set of logic states if reading using the second offset reference voltage 705 may introduce a greater number of mismatches or errors due to reading at an offset reference voltage 705 that is farther from the default reference voltage 702, or if reading using the second offset reference voltage 705 is associated with a change in charge state or polarization state of the memory cells (e.g., when reading at the second offset reference voltage 705 is associated with a reduction in polarization of one or more of the memory cells, when a reading with the second offset reference voltage may affect a result of reading with the first offset reference voltage). In some examples, different subsets of memory cells may be used for the reading at the different offset reference voltages 705 (e.g., a first subset of memory cells for reading at the first offset reference voltage 705, a second subset of memory cells for reading at the second offset reference 705, where the first and second subsets are different or non-overlapping), which may overcome any issues related to reading the same memory cells at different reference voltages.

The memory device or host device may determine a first quantity of mismatches or errors (e.g., a first measured number of mismatches 720) by comparing the second set of logic states with the first set of logic states. For example, a mismatch or error may be counted when a logic state read from a memory cell at 815 does not match the logic state written to that memory cell at 810 (e.g., an intended written logic state, a target logic state). This mismatch may indicate that the memory cell was imprinted (e.g., experienced a change from an unimprinted hysteresis curve 430 to an imprinted hysteresis curve, prior to the write operations of 810) and, in response to the write operation of 810, failed to change to the written logic state or changed or flipped back to an imprinted logic state. Similarly, the memory device or host device may determine a second quantity of mismatches or errors (e.g., a second measured number of mismatches 720) by comparing the third set of logic states to the first set of logic states (e.g., as written at 810 or as rewritten after determining the second set of logic states).

In some cases, the memory device or the host device may determine a difference between the first quantity of mismatches or errors and the second set of mismatches or errors (e.g., a difference between a first measured number of mismatches 720 and a second expected number of mismatches 720), and compare this determined or measured difference to an expected difference between mismatches or errors associated with reading at the first and second offset reference voltages 705 (e.g., a difference between a corresponding first expected number of mismatches 715 and a corresponding second expected number of mismatches 715). For example, the memory device or host device may store or otherwise identify a first expected number of mismatches or errors (e.g., an expected number of mismatches 715-*b* or an expected number of mismatches 715-*d*) associated with reading at a first offset reference voltage 705 and a second expected number of mismatches or errors (e.g., an expected number of mismatches 715-*c* or an expected number of mismatches 715-*e*) associated with reading at a second offset reference voltage 705. As such the memory device or host device may determine an expected difference based on comparing the first expected number of mismatches or errors with the second expected number of mismatches or errors (e.g., a difference between expected number of mismatches 715-*c* and expected number of mismatches 715-*b*, a difference between expected number of mismatches 715-*e* and expected number of mismatches 715-*d*).

The memory device or host device may determine to perform a recovery operation based on comparing the difference of the measured conditions of the two offset reference voltages 705 to the difference of the expected conditions of the two offset reference voltages 705. If the measured difference deviates (e.g., above or below) from the expected difference by a defined amount, or otherwise satisfies a threshold, then an imprint recovery operation will be initiated or performed. In one example, if the difference between the measured number of mismatches 720-*c* and the measured number of mismatches 720-*b* is less than the difference between the expected number of mismatches 715-*c* and the expected number of mismatches 715-*b*, or is lower than the difference between the expected number of mismatches 715-*c* and the expected number of mismatches 715-*b* by some threshold amount, then an imprint recovery operation will be performed.

In some cases, the memory device or host device may determine a measured gradient (e.g., slope or other gradient, whether linear or non-linear, such as a non-linear regression) based on the first quantity of mismatches or errors and the second set of mismatches or errors (e.g., a slope between a first measured number of mismatches 720 and a second measured number of mismatches 720), and compare this determined or measured gradient to an expected gradient between mismatches or errors associated with reading at the first and second offset reference voltages 705 (e.g., a slope between a corresponding first expected number of mismatches 715 and a corresponding second expected number of mismatches 715).

For example, the memory device or host device may store or otherwise identify an expected gradient between mismatches or errors at two offset reference voltages 705 (e.g., a slope between expected numbers of mismatches 715-*c* and 715-*b*, at reference voltages 705-*c* and 705-*b*, respectively), and the memory device or host device may determine whether to perform a recovery operation based on comparing a measured gradient between mismatches or errors at the two offset reference voltages 705 (e.g., a slope between measured numbers of mismatches 720-*c* and 720-*b*, at the reference voltages 705-*c* and 705-*b*, respectively) to the expected gradient. In one example, if the slope between the measured number of mismatches 720-*c* and the measured number of mismatches 720-*b* is shallower than the slope between the expected number of mismatches 715-*c* and the expected number of mismatches 715-*b*, or is shallower than the slope between the expected number of mismatches 715-*c* and the expected number of mismatches 715-*b* by some threshold amount, then an imprint recovery operation will be performed. In some examples, such techniques may be beneficial during a bootup sequence, because slopes or gradients may provide favorable observability into possible imprint characteristics, and a memory device may be particularly sensitive to imprint while powered down or otherwise holding logic states or charge states in a memory array.

In another example, an expected number of mismatches 715 may be computed or otherwise determined (e.g., dynamically) based on a measured number of mismatches 720 and an expected slope. Such techniques may illustrate an extrapolation from a set of measured mismatches to identify an expected number of mismatches based on a known slope, and a known difference between evaluated reference voltages, where another measured of mismatches can be compared to the calculated expectation. If the second measured number of mismatches 720 and the extrapolated expected number of mismatches 715 are different by some threshold amount (e.g., 16×), then recovery operations may be initiated. Such a technique may be less computationally intensive than a direct slope calculation or comparison, and may be beneficial when slope is well-understood or characterized, which may support hard-coding or otherwise configuring various aspects of imprint detection.

At 820-*b*, the memory device or host device may perform a second method of analysis (e.g., Method 2) that may include reading the subset of memory cells using a default or operational reference voltage (e.g., a default reference voltage 702). The memory device or host device may compare data obtained reading at the default reference voltage (e.g., a measured number of mismatches 720-*a*) to a threshold, where the threshold may be related to an expected number of errors (e.g., related to an expected number of mismatches 715-*a*). In some cases, reading the subset of memory cells using the default reference voltage may not be expected to result in any mismatches errors, or may be expected to produce substantially no errors.

In these examples, the memory device or host device may set the threshold to zero or substantially zero mismatches or errors, and may determine that imprint has occurred, or that a recovery operation is to be performed, if this threshold is satisfied (e.g., met or exceeded). In some examples, the memory device or host device may set the threshold based on an error tolerance for performing read operations using a default reference voltage 702. For example, if the error tolerance related to the default reference voltage 702 specifies an allowable or expected number of read errors to occur when reading a defined number of cells, the threshold may be set based on this tolerance (e.g., above, below, equal to, etc.). In this regard, the memory device or host device may determine that imprint has occurred when the number of errors from reading using the default reference voltage exceeds a tolerance.

In some cases, a relevant threshold (e.g., related to a difference between an expected number of mismatches 715 and a measured number of mismatches 720) may be based on an ECC operation performed by the memory device. In this regard, threshold may be at or above the number of errors that are correctable by an ECC operation for the subset of memory cells. For example, if the ECC operation uses single error correcting (SEC) codewords, a threshold may be set to one error. In other examples, the threshold may be set to a level that is below the number of errors that are correctable by an ECC operation for the subset of memory cells.

At 820-c, the memory device or host device may perform a third method of analysis (e.g., Method 3) that may include reading the subset of memory cells using one or more offset reference voltages 705. The memory device or host device may compare data (e.g., a measured number of mismatches 720) obtained using one or more offset reference voltages 705 to an expected number of mismatches 715 associated with reading using the same one or more offset reference 705. In some cases, the memory device or host device may obtain a second set of logic states by reading using a first reference voltage (e.g., one of the offset reference voltages 705) and determine a quantity of errors or mismatches (e.g., a measured number of mismatches 720) between the second set of logic states and the first set of logic states. The memory device or host device may compare a measured number of mismatches 720 with an expected number of mismatches 715 (e.g., for a respective offset reference voltage 705), and determine whether or not imprint has occurred, or whether or not to perform a recovery operation, based on the comparison. For example, if, for one or more of the evaluated offset reference voltages 705, a measured number of mismatches 720 is greater or less than a corresponding expected number of mismatches 715 by a defined factor or threshold amount, then the memory device may determine that imprint has occurred or determine to perform a recovery procedure.

In some cases, the memory device or host device may only determine a measured number of mismatches 720 at a single reference offset voltage 705. For example, determining errors at a single reference voltage 705 may occur (e.g., be selected by a memory device or a host device) when the subset of memory cells contained a random or mixed distribution of logic states prior to initiating the imprint detection procedure (e.g., prior to 810), and when writing the first set of logic states (e.g., at 810) included writing random or a mixed distribution of data to the subset of memory cells.

In some cases (e.g., when performing an imprint evaluation at multiple offset reference voltages 705), the memory device or host device may determine a second measured number of mismatches 720 using a second reference offset voltage 705, which may use different subsets of memory cells than used to determine a first measured number of mismatches 720, or a same subset of memory cells (e.g., when performing a rewrite operation, such as an imprint evaluation rewrite, between evaluations at different offset reference voltages 705). For example, the memory device or host device may write a third set of logic states to a second subset of memory cells of the memory array and obtain a fourth set of logic states by reading the third set of logic states using a second reference offset voltage 705. This may include using one offset reference voltage 705 that is less than a default reference voltage 702 and one offset reference voltage 705 that is greater than the default reference voltage 702. For example, the first offset reference voltage 705 may be less than the default reference voltage 702 (e.g., offset reference voltage 705-b or offset reference voltage 705-c) and the second offset reference voltage 705 may be greater than the default reference voltage 702 (e.g., offset reference voltage 705-d or offset reference voltage 705-e). As such, a first measured number of mismatches 720 may be obtained by reading the first subset of memory cells using the first offset reference voltage 705 and a second measured number of mismatches 720 may be obtained by reading the second subset of memory cells using the second offset reference voltage 705.

The memory device or host device may determine whether or not imprint has occurred, or whether or not to perform a recovery operation, based on comparing the first measured number of mismatches 720 to a first expected number of mismatches 715, based on comparing the second measure number of mismatches 720 to a second expected number of mismatches 715, or a combination thereof. For example, if the first or second measured number of mismatches 720 is greater than or less than the corresponding expected number of mismatches 715 by a defined factor, then the memory device or host device may determine that imprint has occurred, or to perform or trigger a recovery procedure.

Figure 8B:
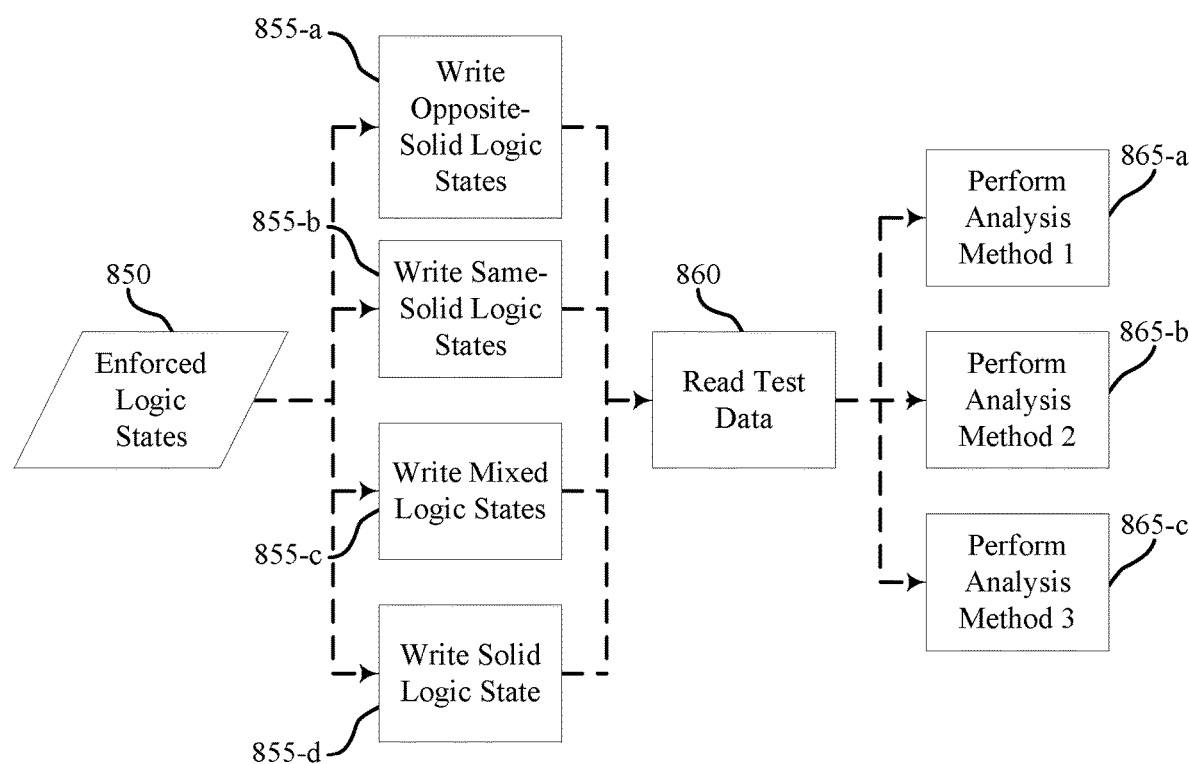

FIG. 8B illustrates an example of an imprint evaluation process 800-b that supports imprint management for memory systems in accordance with examples as disclosed herein. The imprint evaluation process 800-b may implement or perform one or more features described with reference to the imprint evaluation process 800-a of FIG. 8A. The features of the imprint evaluation process 800-b may be implemented or performed by a memory device (e.g., a memory device 110, a memory die 160, a memory die 200, or a memory device 540 described with reference to FIGS. 1 through 5) or one or more components of a memory device (e.g., a device memory controller 155, a local memory controllers 165, a local memory controller 265, a memory controller 550, or an imprint detection component 560) as described with reference to FIGS. 1 through 5. In some examples, one or more of the described techniques may be offloaded to a host device (e.g., performed by or otherwise controlled by a host device 510 or imprint manager 525 described with reference to FIG. 5). In other words, a system (e.g., a system 500) may be configured to perform the imprint evaluation process 800-b according to various distributions of operations between a memory device and a host device. The features of process flow imprint evaluation process 800-b may include one or more techniques described with reference to FIGS. 1 through 8A. In some examples, the imprint evaluation process 800-b may be configured to evaluate whether one or more memory cells of a memory array have undergone a shift from an unimprinted hysteresis curve 430 to an imprinted hysteresis curve 440, or any other change in hysteresis or charge mobility properties that may be caused by memory cell imprint.

The imprint evaluation process 800-b illustrates examples of operations that may be variously combined to support multiple possible implementations of an imprint detection procedure, where the logic states of memory cells used to perform the procedure are known at (e.g., enforced or otherwise configured prior to) the start of the procedure. For example, prior to a deactivation event, a standby event, or otherwise triggered imprint detection procedure or evaluation mode, an imprint detection circuit (e.g., imprint detection component 560, an imprint manager 525) or a controller (e.g., a memory controller 550, a host device controller 520) may have written or enforced data on the memory array specifically for later use in the imprint detection procedure as described herein. The imprint detection procedure may be triggered or initiated based on various criteria, such as a memory device or host device being powered on, a memory device or host device being initialized, a memory device or a host device being awakened from a sleep or standby state, based on operational criteria such as a quantity or rate of errors (e.g., as corrected by an ECC component or algorithm) exceeding or otherwise satisfying a threshold, or entering a diagnostic mode or maintenance mode, and other criteria.

At 850, the memory device or host device may identify one or more subsets of memory cells for performing the imprint detection procedure, which may be storing enforced, or otherwise known logic states (e.g., a set of logic states that may or may not have been imprinted). The subset(s) of memory cells may include a portion of the memory cells, such as a portion of an array, may span more than one array, may be distributed throughout different portions of one or more array(s), or a combination thereof. The subset of memory cells may have been storing logic states enforced by the memory device prior to initiating the imprint detection procedure. For example, to support the imprint detection procedure, the memory device or host device may have written a recoded or tracked set of logic states to the subset of memory cells (e.g., prior to a deactivation, or otherwise prior to initiating the imprint detection procedure) as described herein. Accordingly, in the example of 800-*b*, a memory device may have a known data background which may or may not have been imprinted, which may facilitate certain aspects of imprint detection including those described herein.

In one example, wear leveling may be operating on the memory device on an ongoing basis, which may be leveraged for enforcing a known data pattern. For example, in each gap row or page that becomes open or available, the wear leveling operation may include or otherwise enable writing a checkerboard logic pattern to the gap row or page. The memory device may keep track of which rows or pages have been written with a checkerboard pattern, and accordingly, the gap row or page may be selected for imprint evaluation with an understanding that the gap row or pages have been written with the checkerboard pattern. In other examples, available rows or pages may be written with a solid data pattern, or other patterns or proportions of data states. In other examples, a known data pattern may be enforced in a dedicated portion of a memory array, which may be rewritten or inverted over time to avoid a non-representative imprint or other condition of the dedicated portion of the memory array.

At 855, the memory device or host device may write a set of logic states (e.g., a first set of logic states) to the subset of memory cells of the memory array. The logic states written to the subset of memory cells may be referred to as a set of imprint evaluation logic states, written evaluation logic states, or more generally, imprint evaluation data. The process flow 800-*b* illustrates three examples of writing a set of logic states to support an imprint detection evaluation, one or more of which may be selected and performed by the memory device or host device based on various criteria (e.g., a configuration of a memory device or host device, a preconfiguration of a memory device or host device, a selection and a command by a host device to the memory device, operating conditions of the memory device or host device, data type, distribution of logic states that may be imprinted, and others).

As a first example, at 855-*a*, the memory device may write a set of opposite solid logic states to the subset of memory cells. This may occur if the memory device or host device wrote a first set of solid or same logic states to the subset of memory cells prior to deactivation. For example, if a set of all logic 0s was written to the subset of memory cells prior to deactivation, then, at 855-*a*, the memory device or host device may write all logic 1s to the same subset of memory cells. In various examples, the writing of 855-*a* may or may not include reading an initial state of the subset of memory cells, since the subset of memory cells may have remained in an enforced data pattern.

As a second example, at 855-*b*, the memory device or host device may write a set of same solid logic states to the subset of memory cells. This may occur if the memory device or host device wrote a first set of solid or same logic states to the subset of memory cells prior to deactivation. For example, if a set of all logic 0s was written to the subset of memory cells prior to deactivation, then at 855-*a*, the memory device may re-write all logic 0s to the same subset of memory cells. In some cases, because memory cells are being evaluated in a same logic state that may be imprinted, using this approach may be associated with initiating or triggering recovery operations upon identifying fewer mismatches than expected.

As a third example, at 855-*c*, the memory device or host device may write a set of defined (e.g., mixed) data to the subset of memory cells. In some cases, writing the set of mixed data may include writing a pattern (e.g., checkerboard pattern, alternating logic states), writing random data, writing a distribution or proportion of multiple logic states, reading and writing back the same logic state (e.g., an as-read logic state, a non-inverted logic state, based on reading the subset of memory cells using a default reference voltage 702), or other logic states to the subset of the memory array.

As a fourth example, at 855-*d*, the memory device or host device may write a set of solid logic states to the subset of memory cells. In some cases, this may include writing each cell to represent a logic 0. In other, cases the memory device or host device may write each cell to represent a logic 1. The memory device or host device may write a set of solid logic states without reading or determining the current logic state written to each cell.

In some examples, the memory device or host device may record or track which logic states are written to respective memory cells. The memory device or host device may record or track the first set of logic states for comparison at a later point in the imprint detection procedure (e.g., during an evaluation operation).

In some cases, different portions of one or more memory arrays may be used for performing different parts (e.g., sub-operations) of the imprint detection procedure 800-*b*. For example, a memory device or host device may write a first portion of the first set of logic states to a first portion of the subset of memory cells and a second (e.g., remaining) portion of the first set logic states to a second portion of the subset of memory cells. In some examples, the memory device or host device may write the same pattern or set of logic states to multiple portions of the subset of memory cells. For example, the subset of memory cells may contain multiple repeating sets of logic states. In this regard, the memory device or host device may use the different sets of logic states written to different portions of the array to perform different parts of a subsequent read operation (e.g., at 815).

At 860, the memory device or host device may read the subset of memory cells, which may include reading logic states that it wrote (e.g., test data, evaluation data) or attempted to write to the subset of memory cells at step 850, to obtain a second set of logic states. In some cases, the memory device or host device may write the entire set of test data at 850 and then perform the read operation at 860 on the subset of memory cells. In some cases, the memory device or host device may wait a defined or pre-determined duration or delay between writing the test data and reading the test data (e.g., between a writing of 855 and a reading of 860).

The memory device or host device may read the test data (e.g., read the memory cells of the subset) one or more times, using one or more reference voltages, such as a default reference voltage 702 or one or more offset reference voltages 705. In some cases, the reference voltage used to read the test data written to the subset of memory cells may depend on (e.g., be selected or determined based at least in part on) a method of analysis used to evaluate whether imprint has occurred or whether the memory device should perform a recovery procedure.

At 865, the memory device or host device may perform an imprint evaluation method based at least in part on the test data read or determined at 860 (e.g., to determine whether or not to perform an imprint recovery). The process flow 800-*b* illustrates three examples for performing an imprint detection evaluation (e.g., Method 1, Method 2, and Method 3, which may include similar techniques as described with reference to the process flow 800-*a* of FIG. 8A), one or more of which may be selected and performed based on various criteria (e.g., a configuration of a memory device or host device, a preconfiguration of a memory device or host device, a selection and a command by a host device to the memory device, operating conditions of the host device or memory device, data type, distribution of logic states that may be imprinted, and others). For example, step 865-*a* may include one or more techniques as described with reference to step 820-*a*, step 865-*b* may include one or more techniques as described with reference to step 820-*b*, and step 865-*c* may include one or more techniques as described with reference to step 820-*c*. As described herein, any function associated with any of Method 1, Method 2, or Method 3 may be recombined with any other function described as associated with any other method.

TABLE 1

Array imprinting and imprint evaluation scenarios

| Imprinted Data Condition | Imprinted Data Distribution | Evaluation Data Condition | Evaluation Method | Scenario |
|---|---|---|---|---|
| Unenforced Data | Solid | Solid | Method 1 | 1 |
| | | | Method 2 | 2 |
| | | | Method 3 | 3 |
| | | Opposite State | Method 1 | 4 |
| | | | Method 2 | 5 |
| | | | Method 3 | 6 |
| | | Mixed | Method 1 | 7 |
| | | | Method 2 | 8 |
| | | | Method 3 | 9 |
| | Mixed | Solid | Method 1 | 10 |
| | | | Method 2 | 11 |
| | | | Method 3 | 12 |
| | | Opposite State | Method 1 | 13 |
| | | | Method 2 | 14 |
| | | | Method 3 | 15 |

TABLE 1-continued

Array imprinting and imprint evaluation scenarios

| Imprinted Data Condition | Imprinted Data Distribution | Evaluation Data Condition | Evaluation Method | Scenario |
|---|---|---|---|---|
| | | Mixed | Method 1 | 16 |
| | | | Method 2 | 17 |
| | | | Method 3 | 18 |
| Enforced Data | Solid | Opposite Solid | Method 1 | 19 |
| | | | Method 2 | 20 |
| | | | Method 3 | 21 |
| | | Same Solid | Method 1 | 22 |
| | | | Method 2 | 23 |
| | | | Method 3 | 24 |
| | | Mixed | Method 1 | 25 |
| | | | Method 2 | 26 |
| | | | Method 3 | 27 |
| | Mixed | Solid | Method 1 | 28 |
| | | | Method 2 | 29 |
| | | | Method 3 | 30 |
| | | Opposite State | Method 1 | 31 |
| | | | Method 2 | 32 |
| | | | Method 3 | 33 |
| | | Same State | Method 1 | 34 |
| | | | Method 2 | 35 |
| | | | Method 3 | 36 |
| | | Any Mixed | Method 1 | 37 |
| | | | Method 2 | 38 |
| | | | Method 3 | 39 |

Table 1 illustrates scenarios anticipated by the combination of options for imprinted data conditions, imprinted data distributions, evaluation data conditions, and evaluation methods described with reference to process flows 800-*a* and 800-*b*, any of which may be supported by operations at a memory device, operations at a host device, or coordinated operations at both a memory device. Each of the described scenarios may have various advantages or other considerations for implementing imprint management in a memory system.

Regarding the described examples for imprinted data condition, in some scenarios, enforced data may support relatively improved imprint detection, because known or otherwise assumed conditions of imprint may support favorable insight towards potentially imprinted conditions. However, an unenforced data condition (e.g., random data, data that is not specifically configured for imprint management) may be relatively faster, or more power efficient, since a system may not be required to perform an enforced write operation. In some examples, an enforced data condition may be applied in limited circumstances (e.g., during a shutdown or idling of the memory device), which may mitigate slowdown or power consumption associated with an enforced data pattern. Moreover, in some cases, an unenforced data condition may be random enough to support suitable observability into imprint conditions. For example, variance from a "worst case" condition of a solid data pattern may be equal to $\frac{1}{2}^n$ for a number of pages, n. When a data condition is related to a wear leveling operation using (32×8) pages, the probability that more than 70% of the data is in the same state is approximately $\frac{1}{2^{57}}$, or nearly zero. Accordingly, in some scenarios with 256 pages, it may be reasonable to assume random data irrespective of what was actually written. Thus, although the described techniques may support a solid unenforced imprinted data condition, such conditions may be unlikely.

Regarding the described examples for imprinted data distribution, a mixed data distribution may support relatively greater observability under conditions where an imprinting phenomenon may be relatively uniformly likely for different logic states, or when an imprint detection method relies on different offset reference voltages 705 on both sides of a default reference voltage (e.g., according to examples of Evaluation Method 3). In some examples, solid data may provide advantages when an imprinting phenomenon or prevalence is relatively skewed towards one logic state, or when an evaluation method does not rely on different offset reference voltages 705 on both sides of a default reference voltage (e.g., according to examples of Evaluation Methods 1, 2, or 3). In some cases, Evaluation Methods 2 or 3 may be more suitable than Evaluation Method 1 under a solid imprinted data distribution, or an opposite state or same state evaluation data distribution, because a solid imprinted data distribution may not be associated with a kinked characteristic 740, and accordingly may not be associated with a detectable change in slope upon imprinting (e.g., may not support a detection of Method 1).

Regarding the described examples for evaluation data condition, in some cases, a solid evaluation data pattern may support relatively greater or deeper observability for both solid and mixed imprinted data distributions, depending on the evaluation method used. In some cases, it may be advantageous to match a solid imprinted data pattern against an opposite solid evaluation pattern, such as when performing a single-sided configuration of Evaluation Method 3. In some cases, a mixed evaluation data pattern may be preferable when evaluating for imprinting of multiple states, and mixed data may be preconfigured or selectively configured to be same state, different state, or unenforced (e.g., random). In some scenarios, an imprinted logic state may not be known when not enforced (e.g., when the imprinting itself causes a stored logic state to be lost), in which case it may be preferable to apply an enforced data condition when relying on an opposite state evaluation data condition.

Regarding the described examples for evaluation method, by performing various evaluations related to slopes or gradients (e.g., between conditions at different reference voltages), Evaluation Method 1 may provide relatively strong observability into imprint characteristics (e.g., as pertaining to a kinked imprinted characteristic 740), which may support distinguishing between memory cell imprinting and other failures or phenomena. Such methods may be supported by relatively sophisticated curve fitting, or chip-level evaluations between a measured slope and an expected slope or an expected number of mismatches identified based at least in part on a measured number of mismatches and an expected slope (e.g., to a different reference voltage).

In some examples, Evaluation Method 1 may be configured with slope or gradient calculations on both sides of a default reference voltage 702 if both logic states have similar sensitivity for imprint, or if relatively robust calculations are desired. In some examples, Evaluation Method 1 may be configured with slope or gradient calculations on one side of a default reference voltage 702 if one logic state is more sensitive to imprint than another, or if a single slope or gradient calculation provides suitable observability. In some cases, Evaluation Method 3 may be preconfigured to be performed with a single slope or gradient calculation, or may be selectively performed with a single slope or gradient calculation based on an imprint data (e.g., when reading only one side of a default reference voltage 702 would indicate whether imprinting has occurred, when only one condition of imprinted logic state or evaluation logic state is expected).

In some examples, Evaluation Method 2 may be used with a mismatch threshold that is below a ECC correction floor (e.g., a threshold that is below or within a failure correction capability of the ECC algorithm), and the system may be configured to permit some non-zero level or rate of mismatches or ECC correction before initiating imprint recovery operations. Although such a technique may have relatively lower visibility or observability into the particular failure mode being related to imprint (e.g., since Evaluation Method 2 may not discern between hard failures and imprint failures), such a technique may be relatively fast and efficient. In some scenarios, Method 2 may have unmeasurable results or otherwise lack sensitivity, but recovery operations may be triggered upon detection of any mismatch when using Evaluation Method 2. In other words, using Evaluation Method 2 may be relatively conservative with respect to imprinting (e.g., potentially triggering or initiating imprint recovery more often than necessary).

In some examples, Evaluation Method 3 may be associated with margining a reference voltage level to the point where a non-zero quantity of mismatches is expected. In some examples, calculations of Evaluation Method 3 may be similar to those of Evaluation Method 2, but the use of an offset reference voltage 705 may provide better visibility or observability into imprint than the use of a default reference voltage as in Evaluation Method 2. In some cases, if a memory device 540 degrades over its operation, an expected number of mismatches accordingly may be expected to increase, which may not be explicitly related to imprint. Accordingly, later in an operational life, performing Evaluation Method 3 may be expected to have false positives as to imprint (e.g., falsely detecting read window collapse due to wearout), which may trigger or initiate imprint recovery more often than necessary. However, in some examples, various thresholds of the Evaluation Method 3 may be adjusted over time (e.g., based on detected or monitored age or wear).

In some examples, Evaluation Method 3 may be configured with read operations at two different offset reference voltages, and imprint recovery may be initiated if mismatches at either condition exceed a hard coded limit, proceed. However, unlike Evaluation Method 1, Evaluation Method 3 may omit a slope calculation, which may support certain hardware or calculation efficiencies when compared with Evaluation Method 1. In some cases, ratio, or other indication of asymmetry. In some examples, Evaluation Method 3 may be configured with two offset reference voltages if both logic states have similar sensitivity for imprint, or one offset reference voltage if one logic state is more sensitive to imprint than another. In some cases, Evaluation Method 3 may be preconfigured to be performed with a single offset reference voltage 705 or may be selectively performed with a single offset reference voltage 705 based on an imprint data (e.g., when reading only one side of a default reference voltage 702 would indicate whether imprinting has occurred, when only one condition of imprinted logic state or evaluation logic state is expected).

In some examples, it may be preferable to perform Evaluation Method 3 or configure a system to perform Evaluation Method 3 with a mixed imprinted data distribution, whether enforced or probabilistic (e.g., unenforced). When the imprinted data condition is unenforced, Evaluation Method 1 or 2 may be favorable when using a solid evaluation data condition (e.g., according to Scenario 10 or 11), or Method 3 may be favorable when using a mixed evaluation data condition (e.g., according to Scenario 18). When the imprinted data condition is enforced, it may be preferable to use Evaluation Method 1 or 3 with an opposite state evaluation data condition (e.g., according to Scenario 31 or 33). However, these are merely illustrative examples, and any of the described scenarios may be used to support the imprint management techniques described herein. In some cases, various selections or configurations may be based on a quantity of memory cells in an evaluated subset, a quantity of subsets, a probability of data being in such a state (e.g., when unenforced or probabilistic).

In some examples of the described techniques, an option of either the process flow 800-a or the process flow 800-b may be selected or identified based at least in part on an outcome of an earlier step. For example, if a memory device 540 has a known worst case data state for imprint, then the memory device 540 may be configured to write an enforced solid imprint data pattern, and perform Evaluation Method 3 on an evaluation data state written in an opposite solid state. In other cases, a more conservative approach may be preferable, which may include, for example, performing Evaluation Method 3 on a mixed evaluation data condition.

Figure 9:
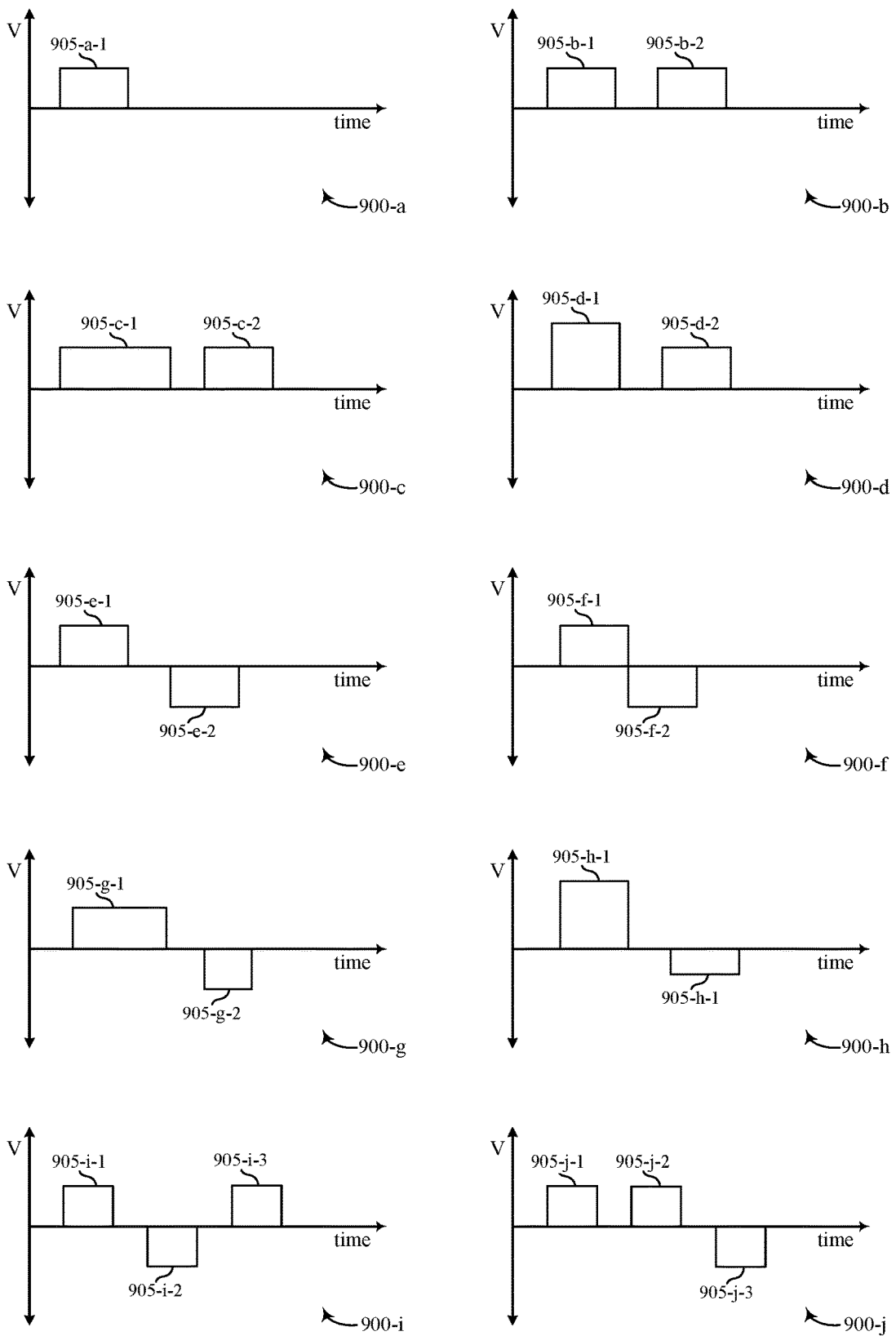
FIG. 9 illustrates examples of cell biasing that support imprint management for memory systems in accordance with examples as disclosed herein.

FIG. 9 illustrates examples of cell biasing 900 that support imprint management for memory systems in accordance with examples as disclosed herein. Each of the cell biasing 900-a through 900-j may include one or more pulses 905, which may be configured or initiated to promote or encourage cell equalization or normalization, or otherwise resolve asymmetry with respect to storing different logic states. In some examples, a cell biasing 900 may be configured to return a ferroelectric memory cell to an unimprinted hysteresis curve 430 as described with reference to FIGS. 4A and 4B. However, the described techniques may be applied to other cells that undergo imprinting or other degradation, which may or may not be related to hysteresis properties or charge mobility of a memory cell. For example, in some cases, cell biasing 900 may be applied to equalize or normalize an ability of a memory cell to be programmed with a different atomic configuration, to be programmed with a different degree of crystallinity, to be programmed with a different atomic distribution, or to be programmed with some other characteristic associated with a different logic state. In various examples, one or more cycles of a cell biasing 900 may be included in a recovery of repair operation or procedure as described herein.

Each of the pulses 905 may be associated with a read operation (e.g., where a pulse 905 represents a read bias or a bias of a read operation triggered or initiated in response to an imprint evaluation), or a write operation (e.g., where a pulse 905 represents a write bias or a bias of a write operation triggered or initiated in response to an imprint evaluation), or a refresh operation (e.g., where a pulse 905 represents a refresh bias or a bias of a refresh operation triggered or initiated in response to an imprint evaluation), or some other access operation. In some examples, a pulse 905 may be a dedicated pulse of a repair or recovery operation that is not necessarily part of an access operation. In the described examples of cell biasing 900, a positive voltage, V, may be associated with a logic 0 (e.g., may have a same polarity as writing a logic 0 to a memory cell), though it is to be understood that an association or correspondence between a logic state and a polarity may change (e.g., according to a bit flipping configuration, according to a memory management configuration, according to a logic state mapping configuration). For example, a positive voltage, V, may correspond to a positive $V_{cap}$ as described with reference to FIGS. 3A, 3B, 4A, and 4B, where a positive voltage 315 may be associated with writing a logic 0. In some examples, applying a positive voltage may generally be associated with mitigating or reducing an imprinting of a memory cell with a logic 1 (e.g., an imprinted logic 1). In other words, when determining to increase an ability of a memory cell to switch between a logic 1 and a logic 0, or switch from a logic 1 to a logic 0, a repair or recovery operation may include applying at least a voltage or a voltage pulse 905 having a polarity associated with a logic 0 (e.g., a positive voltage, V). As described with reference to the cell biasing 900-a through 900-j, voltage pulses 905 may be configured with various durations, various amplitudes, various polarities, or various combinations of same or different durations, amplitudes, or polarities, to support various techniques for imprint management.

In some examples, a cell biasing 900 may be applied to a standard addressable subset of a memory array (e.g., one page), or a cell biasing 900 may be applied to a larger subset of the memory array comprised of multiple addressable subsets that may not be typically accessible by the user (e.g., according to a ganged, or parallel recovery operation). In other words, cell biasing may not be limited to what a user can address at one time. Rather, the described cell biasing 900 may be applied to any number of rows or pages at a time (e.g., two pages at once, ten pages at once, 1000 pages at once), which may support recovery operations working through a memory array more quickly than if a cell biasing 900 is applied to a single page at a time.

Cell biasing 900-a through 900-d illustrate examples of unipolar cell biasing 900 in accordance with examples as described herein. Unipolar cell biasing 900 may refer to various examples of applying one or more pulses 905 of a single polarity to a memory cell for a particular duration. As described herein, a unipolar cell biasing 900 may be applied as a single pulse 905, or more than one pulse 905 (e.g., a pulse train). In various examples, a total time under bias, a bias level (e.g., amplitude), a total number of pulses 905, or a duration between pulses 905 may be configurable or selectable. In some examples, a unipolar cell biasing 900 may be selected or applied if a desired recovery is in a particular direction (e.g., a known direction from one logic state to another). Thus, any one or more of the cell biasing 900-a through 900-d (e.g., having a positive polarity) may be applied to a particular memory cell for which an imprint condition (e.g., direction) is known. In some examples, cell biasing 900 that is similar to any of cell biasing 900-a through 900-d, but with a negative polarity, may be applied to a memory cell having a different direction of imprinting, such as a memory cell imprinted with a logic 0.

In a first example of unipolar cell biasing 900, a cell biasing 900-a may include a single pulse 905-a-1. In a second example of unipolar cell biasing 900, a cell biasing 900-b may include multiple pulses (e.g., pulse 905-b-1 and pulse 905-b-2), which may each have a same duration and amplitude. Although the unipolar cell biasing 900-b illustrates an example with two pulses 905, a unipolar cell biasing 900 in accordance with the present disclosure may include any number of pulses 905, including more than two pulses. In a third example of unipolar cell biasing 900, a cell biasing 900-c may include multiple pulses (e.g., pulse 905-c-1 and pulse 905-c-2) each having a different duration. Although the unipolar cell biasing 900-c illustrates an example of pulses 905 having successively shorter durations, a unipolar cell biasing 900 in accordance with the present disclosure may include pulses 905 having successively longer durations, or durations that change with other patterns. In a fourth example of unipolar cell biasing 900, a cell biasing 900-d may include multiple pulses (e.g., pulse 905-d-1 and pulse 905-d-2) each having a different duration. Although the unipolar cell biasing 900-d illustrates an example of pulses 905 having successively smaller amplitudes, a unipolar cell biasing 900 in accordance with the present disclosure may include pulses 905 having successively greater amplitudes, or amplitudes that change with other patterns. Further, although the cell biasing 900-*d* is illustrated with a gap between pulse 905-*d*-1 and 905-*d*-2 (e.g., a zero bias duration or region), in some examples unipolar cell biasing 900 may be performed without such a gap (e.g., according to an increasing or decreasing staircase biasing). In other examples of cell biasing 900, successive pulses 905 may have both different durations and different amplitudes, and such cell biasing may include more than two pulses 905.

Applying a unipolar cell biasing 900 for imprint recovery may be advantageous in some circumstances. For example, unipolar cell biasing 900 may be associated with relatively low power consumption, since the voltage may not swing as far or cross a zero or ground voltage. In some examples, unipolar cell biasing 900 may be beneficial if an initial read voltage (e.g., of normal read operations, of an imprint detection or evaluation) was biased in anticipation of end-of-life wear out, in which case it may be desirable to recover with respect to one logic state more aggressively (e.g., if such a logic state was trimmed with a smaller read margin).

Cell biasing 900-*e* and 900-*f* illustrate examples of symmetric bipolar cell biasing 900 in accordance with examples as described herein. Bipolar cell biasing 900 may refer to various examples of applying one or more pulses 905 at each of different polarities to a memory cell for a particular duration. For example, a first pulse 905 may be applied with a first polarity and a second pulse 905 may be applied with a second (e.g., opposite) polarity. In various examples, a total time under bias, a bias level (e.g., amplitude), a total number of pulses 905, or a duration between pulses 905 may be configurable or selectable. In examples of symmetric bipolar cell biasing 900, such configurations may be applied equally or otherwise in a same manner for pulses 905 in each polarity. Thus, any one or more of the cell biasing 900-*e* or 900-*f* may be applied to a memory cell without prior knowledge of an imprint directionality.

In a first example of symmetric bipolar cell biasing 900, a cell biasing 900-*e* may include multiple pulses (e.g., pulse 905-*e*-1 and pulse 905-*e*-2), which may each have a same duration and amplitude, and a gap period between them. In a second example of symmetric bipolar cell biasing 900, a cell biasing 900-*f* may include multiple pulses (e.g., pulse 9054-*f*-1 and pulse 905-*f*-2), which may each have a same duration and amplitude, and no gap period between them. Although cell biasing 900-*e* and 900-*f* illustrate symmetric bipolar cell biasing according to a single pair of pulses 905, other examples of symmetric cell biasing 900 may include more than one pair of pulses 905, which may or may not have a gap period between them. Moreover, successive pairs of pulses 905 may have different (e.g., decreasing, alternating) amplitudes, different (e.g., shorter, longer, alternating) durations, and other differing characteristics.

Applying a symmetric bipolar cell biasing 900 for imprint recovery may be advantageous in some circumstances. For example, symmetric bipolar cell biasing 900 may be associated with more effective imprint recovery than unipolar cell biasing 900 (e.g., due to charge state switching, due to cycling effects). Moreover, symmetric bipolar cell biasing 900 may not depend on or rely on a known or predicted directionality of imprint, or may be otherwise suitable when no recovery direction is specified.

Cell biasing 900-*g* through 900-*j* illustrate examples of asymmetric bipolar cell biasing in accordance with examples as described herein. Asymmetric bipolar cell biasing 900 may refer to various examples of applying one or more pulses 905 at each of different polarities to a memory cell where pulses 905 of different polarities have different characteristics. For example, a first pulse 905 may be applied with a first polarity and a second pulse 905 may be applied with a second (e.g., opposite) polarity and at a different amplitude, a different duration, a different repetition, or various combinations thereof.

In a first example of asymmetric bipolar cell biasing 900, a cell biasing 900-*g* may include multiple pulses (e.g., pulse 905-*g*-1 and pulse 905-*g*-2), where pulses of opposite polarities are applied with a different duration. Although the asymmetric bipolar cell biasing 900-*g* illustrates an example of pulses 905 having a longer duration or different duty cycle for pulses 905 having a positive polarity (e.g., to support recovering an imprint of a logic 1), an asymmetric cell biasing 900 in accordance with the present disclosure may include pulses 905 having a longer duration or different duty cycle for pulses 905 having a negative polarity (e.g., to support recovering an imprint of a logic 0), or durations that change or are applied with other patterns. Moreover, successive pairs of pulses 905 may have different (e.g., decreasing, increasing, alternating) amplitudes, different (e.g., shorter, longer, alternating) durations, and other differing characteristics, which may include or omit a gap period between pulses 905 or pairs of pulses 905.

In a second example of asymmetric bipolar cell biasing 900, a cell biasing 900-*h* may include multiple pulses (e.g., pulse 905-*h*-1 and pulse 905-*h*-2), where pulses of opposite polarities are applied with a different amplitude. Although the asymmetric bipolar cell biasing 900-*h* illustrates an example of pulses 905 having a greater amplitude for pulses 905 having a positive polarity (e.g., to support recovering an imprint of a logic 1), an asymmetric cell biasing 900 in accordance with the present disclosure may include pulses 905 having a greater amplitude for pulses 905 having a negative polarity (e.g., to support recovering an imprint of a logic 0). Moreover, successive pairs of pulses 905 may have different (e.g., decreasing, increasing, alternating) amplitudes, different (e.g., shorter, longer, alternating) durations, and other differing characteristics, which may include or omit a gap period between pulses 905 or pairs of pulses 905.

In a third example of asymmetric bipolar cell biasing 900, a cell biasing 900-*i* may include multiple pulses (e.g., pulse 905-*i*-1, pulse 905-*i*-2, and pulse 905-*i*-3), where pulses of opposite polarities are applied according to different quantities, and alternating polarities. Although the asymmetric bipolar cell biasing 900-*i* illustrates an example with a greater quantity of pulses 905 having a positive polarity (e.g., to support recovering an imprint of a logic 1), an asymmetric cell biasing 900 in accordance with the present disclosure may include pulses 905 having a greater quantity of pulses 905 having a negative polarity (e.g., to support recovering an imprint of a logic 0). Moreover, although the pulses 905-*i* are illustrated as having a same duration and amplitude, successive pulses 905 or subsets of pulses 905 (e.g., subsets of three pulses 905-*i*-1 through 905-*i*-3, or subsets of different quantities) may have different (e.g., decreasing, increasing, alternating) amplitudes, different (e.g., shorter, longer, alternating) durations, and other differing characteristics, which may include or omit a gap period between pulses 905 or pairs of pulses 905.

In a fourth example of asymmetric bipolar cell biasing 900, a cell biasing 900-*j* may include multiple pulses (e.g., pulse 905-*j*-1, pulse 905-*j*-2, and pulse 905-*j*-3), where pulses of opposite polarities are applied according to different quantities, and subsets of one or more sequential pulses 905 having a same polarity (e.g., a first subset, corresponding to pulses 905-*j*-1 and 905-*j*-2, having a positive polarity, and a second subset, corresponding to pulse 905-*j*-3, having a negative polarity). Although the asymmetric bipolar cell biasing 900-*j* illustrates an example with a greater quantity of pulses 905 having a positive polarity (e.g., to support recovering an imprint of a logic 1), an asymmetric cell biasing 900 in accordance with the present disclosure may include a greater quantity of pulses 905 having a negative polarity (e.g., to support recovering an imprint of a logic 0). Moreover, although the pulses 905-*j* are illustrated as having a same duration and amplitude, successive pulses 905 or subsets of pulses 905 (e.g., subsets of three pulses 905-*h*-1 through 905-*h*-3, or subsets of different quantities) may have different (e.g., decreasing, increasing, alternating) amplitudes, different (e.g., shorter, longer, alternating) durations, and other differing characteristics, which may include or omit a gap period between pulses 905 or pairs of pulses 905.

Although the pulses 905 are illustrated as step changes in voltage, in other examples, different biasing profiles may be used to support an application of a pulse 905 as part of a recovery or repair operation. For example, pulses 905 may be applied with a ramped increase in voltage, a ramped decrease in voltage, a stepped increase in voltage, a stepped decrease in voltage, a logarithmic increase in voltage, a logarithmic decrease in voltage, or other profiles or combinations of profiles. In some examples, such profiles may be varied from one pulse 905 to another pulse 905 in a pulse train, and such profiles may be applied asymmetrically to support different recovery techniques.

In some examples, a determination of how many cycles to perform, or what kind of cycling to perform, may be configured or selected based on various conditions or characteristics.

Regarding cycling recovery options, a size of an array space to perform a recovery event may affect an applied stress during a recover. If recovering an entire array, for example, applying a relatively low number of cycles with relatively long duration and relatively high amplitude, along with relatively high parallelism (e.g., relatively many pages being recovered simultaneously or during overlapping durations) may be beneficial to reduce power or current draw. If recovering a relatively small subset of an array, for example, applying a relatively high number of cycles with relatively short duration and moderate to high amplitude may be beneficial to recover cells as quickly as possible. In various examples, a decision may be made to maintain data (e.g., and move data to a different location during recovery), or to purge data during recovery.

In some examples, a cell biasing 900 may consider detected or predicted severity when configuring corresponding pulses 905. For example, for relatively higher severity imprinting, it may be preferable to apply a greater quantity of pulses 905. In one example, for a low severity, a relatively small number of pulses 905 may be applied (e.g., less than 1,000), for a moderate severity, a moderate number of pulses 905 may be applied (e.g., less than 10,000), and for a high severity, a high number of pulses 905 may be applied (e.g., greater than 10,000). Additionally, or alternatively, it may be preferable to apply a higher bias as detected or predicted severity increases. For example, for a relatively low severity, pulses 905 with relatively lower amplitude may be applied, and for relatively high severity, pulses 905 with relatively higher amplitude may be applied.

Additionally, or alternatively, in some examples, a cell biasing 900 may consider detected age or wear when configuring corresponding pulses 905. For example, a cell biasing may scale a quantity of pulses 905 depending on age, such as applying a greater number of pulses 905 with age. In one example, during early-life, $\frac{1}{10}$th of a default number of target cycles or pulses 905 may be applied, and during late-life, 10 times a default number of target cycles or pulses 905 may be applied. Additionally, or alternatively, it may be preferable to apply a higher bias as age increases, which may correspond to reducing fatigue or wear out of memory cells during early-life conditions. For example, for early-life, an amplitude of pulses 905 may be relatively decreased, for mid-life, an amplitude of pulses 905 may be a standard or otherwise maintained bias, and for late-life, an amplitude of pulses 905 may be relatively increased.

Additionally, or alternatively, in some examples, a cell biasing 900 may consider detected temperature (e.g., of a host device, of a memory device) when configuring corresponding pulses 905. For example, when recovery biasing is relatively improved at elevated temperatures (e.g., due to increased charge mobility or atomic distribution mobility), at relatively low temperatures, a greater number (e.g., 10× a default number) of pulses 905 may be applied, and at relatively high temperatures, a lesser number (e.g., $\frac{1}{10}$th a default number) of pulses 905 may be applied. Additionally, or alternatively, at relatively low temperatures, a greater amplitude of pulses 905 may be applied, and at relatively high temperatures, a lower or default amplitude of pulses 905 may be applied Additionally, or alternatively, in some examples, a cell biasing 900 may consider an available time for performing recovery when configuring corresponding pulses 905. For example, a system may be configured to apply as many pulses 905 as possible during an available time, assuming a number of performed cycles is less than a number of target cycles. In another example, if there is a limited amount of time available for recovery, a system may be configured to apply a higher bias to decrease recovery time.

Additionally, or alternatively, in some examples, a cell biasing 900 may consider an available power or other power condition when configuring corresponding pulses 905. In some examples, a system may be configured to scale a number of cycles, as well as parallelism and speed, with an amount of power available. In one example, when a system or host device is plugged in, the imprint recovery may be configured to perform as many cycles as possible and as quickly as possible (e.g., as allowed by a power specification). In another example, when a system or host device is on battery power, recovery operations may be scaled back (e.g., to $\frac{1}{10}$th a rate, $\frac{1}{10}$th an amplitude, $\frac{1}{10}$th a quantity) to save battery power.

Figure 10:
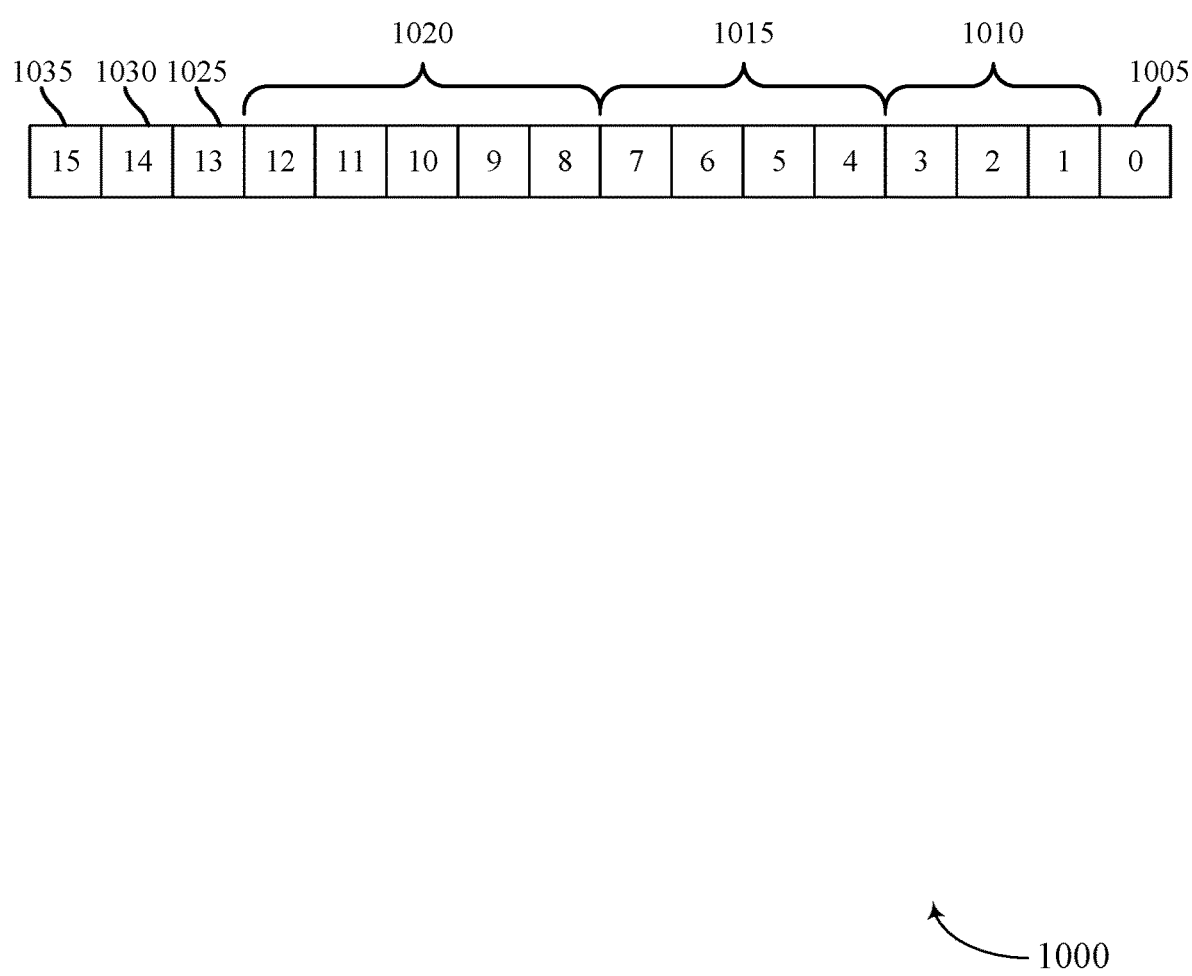
FIG. 10 illustrates an example of signaling that supports imprint management for memory systems in accordance with examples as disclosed herein.

FIG. 10 illustrates an example of signaling 1000 that supports imprint management for memory systems in accordance with examples as disclosed herein. The signaling 1000 may be exchanged between a host device and a memory device (e.g., over a channel), such as an exchange between a host device interface 515 and a memory interface 545 as described with reference to FIG. 5. Although the signaling 1000 is illustrated as a sequence of bits, the signaling 1000 may be conveyed as values stored or written to a single 16-bit register or some other number of registers, may or may not be modulated (e.g., according to PAM3, PAM4, PAM8, and other PAM configurations, quadrature amplitude modulation (QAM), quadrature phase shift keying (QPSK), and/or others), and may be conveyed over a single channel or signal path or multiple channels of signal paths. For example, the signaling 1000 may or may not be conveyed between a host device and a memory device in a coherent packet or bitstream. In some examples, the signaling may be illustrative of register or other values or indicators that may be readable or writable by a host device, a memory device, or both. Additionally, or alternatively, the signaling 1000 may be illustrative of register or other values or indicators that may be polled or triggered (e.g., by a trigger signal sent by one of a memory device or a host device) for reading by the host device or the memory device.

In some examples, the signaling 1000 may be referred to as a recovery flag encoding, and each of the positions may represent a binary or otherwise modulated value of the recovery flag encoding. The signaling 1000 may be configured for two-way communication between a host device and a memory device (e.g., between an imprint manager 525 and one or more of an imprint detection component 560 or an imprint recovery component 565, as described with reference to FIG. 5), such that each of the host device and the memory device has command authority to write a value to one or more of the indicated fields (e.g., such that, in aggregate, the signaling 1000 may be configured for a two-way set between a host device and a memory device). In some examples, one or more of the portions of the signaling 1000 may be hard-coded or fused, which may include a fixed configuration or setting during a manufacturing or initial powering of one or more of the host device or memory device.

In some examples, a portion 1005 may be referred to as a request flag. In some examples, the portion 1005 may support a memory device conveying or indicating a sense of urgency related to imprint recovery.

In some examples, a portion 1010 may be referred to as an imprint state indicator. In some examples, the portion 1010 may support a memory device conveying or indicating an imprint state, an imprint severity, or both.

In some examples, a portion 1015 may be referred to as a recovery time indicator. In some examples, the portion 1015 may support a memory device conveying or indicating an estimated recovery time. Additionally, or alternatively, the portion 1015 may support a host device conveying or indicating an available time for recovery operations, which may include the host device overwriting a value of the portion 1015 written by the memory device (e.g., during an Enable state).

In some examples, a portion 1020 may be referred to as a recovery method indicator. In some examples, the portion 1020 may support a memory device conveying or indicating a configured, determined, or selected recovery method. Additionally, or alternatively, the portion 1020 may support a host device conveying or indicating a configured, determined, or selected recovery method, which may include the host device overwriting a value of the portion 1020 written by the memory device (e.g., during an Enable state).

In some examples, a portion 1025 may be referred to as a force enable/disable flag. In some examples, the portion 1025 may support a memory device conveying or indicating a sense of urgency related to imprint recovery (e.g., as an override). For example, the portion 1025 may act as an override of a portion 1035.

In some examples, a portion 1030 may be referred to as a pause recovery flag. In some examples, the portion 1030 may support a host device pausing imprint recovery, such as a pause during relatively high user demand or other performance requirement.

In some examples, a portion 1035 may be referred to as an enable/disable flag. In some examples, the portion 1035 may support a host device conveying or indicating an approval for enabling recovery. In some examples, a host device may write an approval indication to the portion 1035 in response to a recovery indication by a memory device in the portion 1005. In some examples, the host device may make such a decision based on a system state or user demand.

Although each of the portions are illustrated and described as including some quantity of binary fields, the example of signaling 1000 is only one example for supporting 16-bit signaling between a host device and a memory device. In other examples, signaling may be distributed differently across a 16-bit register, or a register having any other quantity of fields, which may be binary or modulated according to some other quantity of levels of a modulation scheme. In some examples, one or more of the portions of the signaling 1000 may be combinatorial within a memory device.

Figure 11:
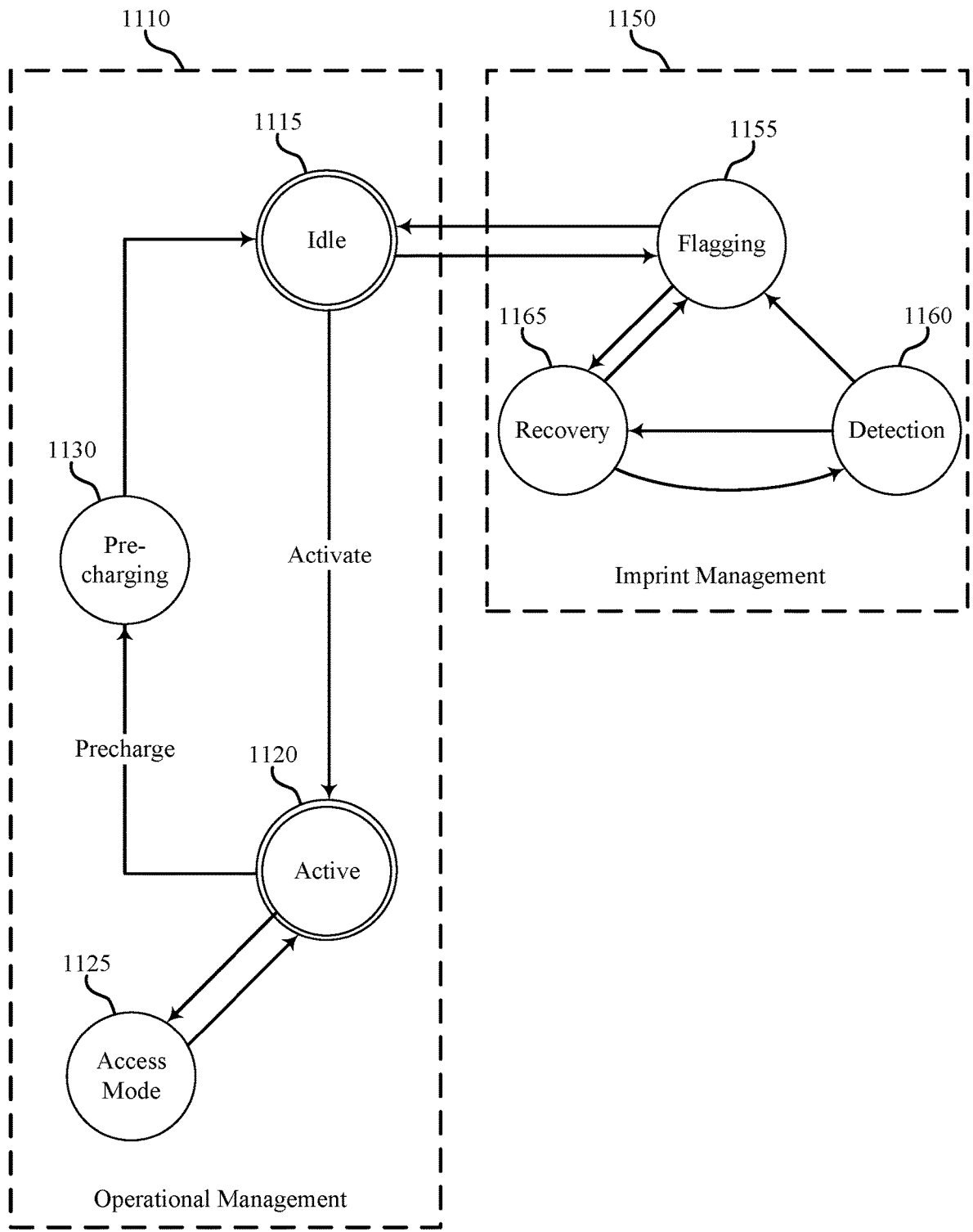
FIG. 11 illustrates an example of a state diagram that supports imprint management for memory systems in accordance with examples as disclosed herein.

FIG. 11 illustrates an example of a state diagram 1100 that supports imprint management for memory systems in accordance with examples as disclosed herein. For example, the state flow 1110 may illustrate aspects of an operational management state machine at a memory device, and the state flow 1150 may illustrate aspects of an imprint management state machine at the memory device or a host device coupled with the memory device, or some combination thereof. In various examples, the state flow 1110 and the state flow 1150 may be operating concurrently, or the state flow 1110 may hand over aspects of an operational state (e.g., of the memory device) to the state flow 1150. In some examples, the state flow 1150 may be considered to be a portion of the state flow 1110, such as an illustrative flow of sub-states within an idle state 1115. In some examples, the state flow 1110 may illustrate aspects of a RAM state machine according to various memory system standards (e.g., one or more Joint Electron Device Engineering Council (JEDEC) standards).

The idle state 1115 may illustrate a state where the memory device is not actively exchanging data with a host device, or not otherwise responding to access commands from the host device. The idle state 1115 may correspond to a low-power, but enabled, operational state of a memory device (e.g., when powered on, but not actively operating, a waiting state). For example, the idle state 1115 may correspond to a state in which no memory bank of the memory device is activated (e.g., compared to the active state 1120, which may correspond to a state in which one or more banks are activated). In some examples, the state flow 1150 may be configured such that, whenever the process flow is in the idle state 1115, imprint detection (e.g., related to the detection state 1160) may be enabled. In some examples, the state flow 1110 may transition from the idle state 1115 to the active state 1120 in response to a command from a host device, where such a transition may be associated with an Activate (ACT) command or signal between the host device and the memory device.

The active state 1120 may correspond to a "Row Active" state, which may include portions of the memory device being enabled or biased in a manner that generally supports access operations (e.g., read operations, write operations, rewrite operations, refresh operations) at the memory device, such as enabling a memory array or applying an array-level biasing (e.g., biasing a common plate of the memory array). In some examples, the state flow 1110 may transition from the active state 1120 to the access mode state 1125 in response to a command from a host device, such as a particular access command (e.g., a read command, a write command, a rewrite command, a refresh command), or other accessing of a particular portion of the memory device.

The access mode state 1125 may correspond to any one or more of a "Read" state, a "Write" state, or other state that supports accessing and communicating information with particular memory cells of the memory device. For example, while operating in the access mode state 1125, the memory device read particular memory cells and convey data to the host device, may receive data from the host device and write the data to particular memory cells, or both. In some examples, the access mode state may include cell-level or address-level biasing, activations of a particular row or column multiplexer, sense amplification or latching, and other operations. In some examples, the state flow 1110 may transition from the access mode state 1125 to the active state 1125 upon completing access operations (e.g., upon responding to a set of received or cached access commands, without an explicit command).

The precharging state 1130 may correspond to a state where all banks of the memory device are being precharged or otherwise biased (e.g., in preparation to return to the idle state 1115). The precharge state 1130 may be a transitional state between the active state 1120 and the idle state 1115 that follows access operations, which may include conditioning or otherwise preparing a memory array to return to the idle state 1115. In some examples, the state flow 1110 may transition from the active state 1120 to the precharging state 1130 in response to a command from a host device, where such a transition may be associated with an Precharge (PRE) command or signal between the host device and the memory device. A transition from the precharging state 1130 to the idle state 1115 may occur without an explicit command (e.g., from a host device).

Referring to the state flow 1150, the detection state 1160 may refer to a state during which various examples of imprint detection may be performed. In various examples, such detection may be event-driven (e.g., triggered or initiated) or otherwise scheduled (e.g., occurring continuously, occurring according to a defined period). When an imprinting of the memory device is detected or predicted, the detection state 1160 may, in some examples, set a request flag or indicator, and the state flow may proceed to the flagging state 1155. In such examples, the state flow 1150 may transition from the flagging state 1155 to the recovery state 1165 based on signaling exchanged with the host device or the state flow 1110. In some examples, such techniques or state transitions may be applied when imprint severity is relatively low, or when the memory device is required to support particular operational constraints (e.g., that require signaling or negotiation with the host device to perform recovery), or based on other considerations.

In another example, when an imprinting of the memory device is detected or predicted, the detection state 1160 may, in some examples, set a forced recovery flag or indicator, and the state flow may proceed directly to the recovery state 1165. In some examples, such techniques or state transitions may be applied when imprint severity is relatively high, when the memory device is unable to support particular operations (e.g., due to an unrecoverable error), or is otherwise configured to support recovery determinations and operations autonomously.

The recovery state 1165 may refer to a state during which various examples of imprint detection may be performed, including discrete recovery events on an entire memory array, or recovery during operations or by modifying operations (e.g., when the state flow 1110 and the state flow 1150 are operating concurrently). In some examples, after performing a recovery operation, the state flow 1150 may transition from the recovery state 1165 to the detection state 1160 to evaluate or confirm recovery, which may be referred to as a recovery test.

In some examples, signaling between the idle state 1115 and the flagging state 1155, or more generally a signaling between the state flow 1110 and the state flow 1150, may include various recovery request, approval, or denial signaling as described herein. For example, the flagging state 1155 may issue a recovery request to the state flow 1110, which may be responded to when the state flow 1110 is in the idle state 1115. In turn, the idle state 1115 may issue an approval or denial to the state flow 1150, which may be used to remain in the flagging state 1155 or proceed to the recovery state 1165. In some examples, a transition between the idle state 1115 and the flagging state 1155 may be initiated according to such signaling (e.g., when a system operates in a single state of either the state flow 1110 or the state flow 1150).

In some examples, signaling between the idle state 1115 and the flagging state 1155, or more generally a signaling between the state flow 1110 and the state flow 1150, may include various modifications to the operation of the state flow 1110. For example, to support various examples of recovery during operation or recovery by modified operations described herein, such signaling may include triggers, indicators, or parameters that may be used during the operation of the state flow 1110 (e.g., modifying operation or parameters of any one or more of the idle state 1115, the active state 1120, the access mode state 1125, or the precharging state 1130).

Figure 12:
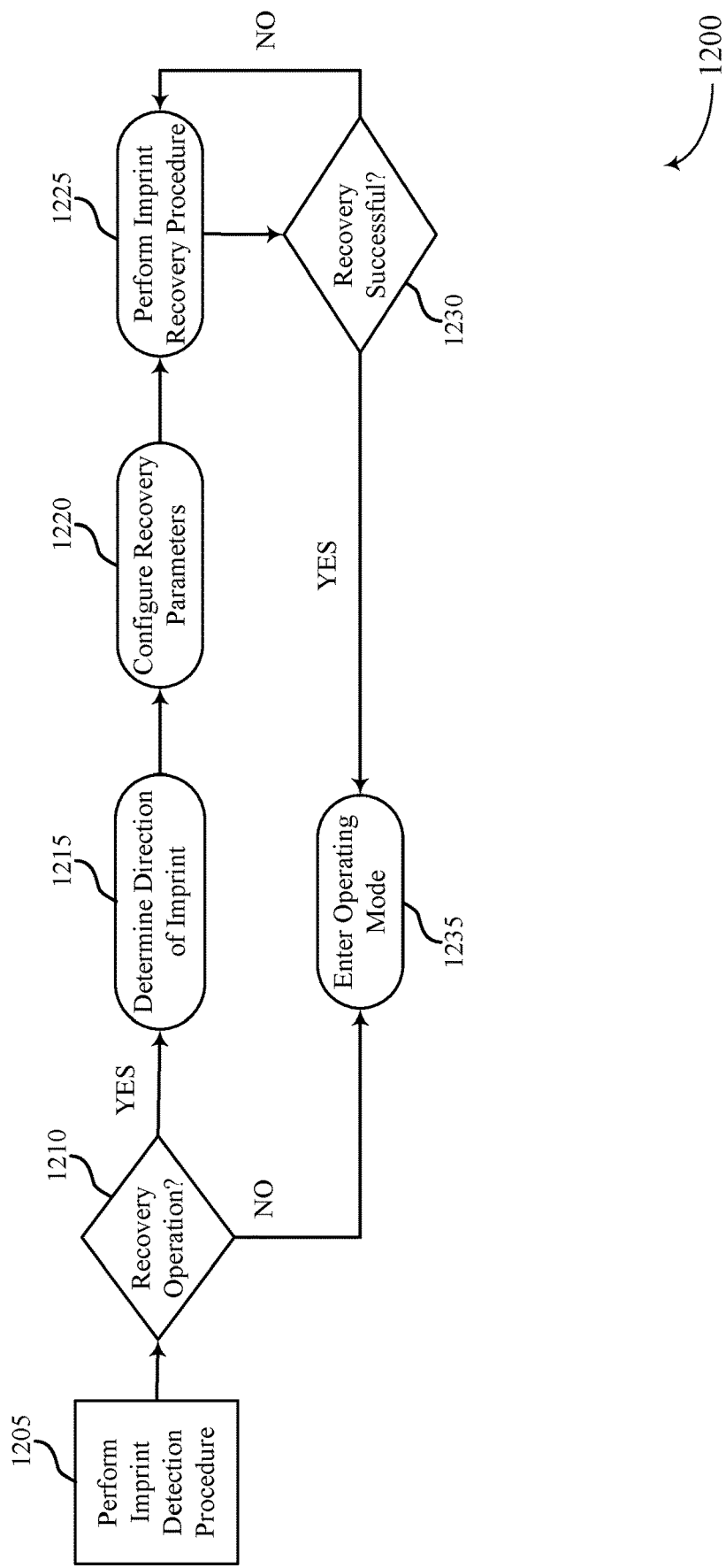
FIGS. 12 through 16 illustrate examples of process flows that support imprint management for memory systems in accordance with examples as disclosed herein.

FIG. 12 illustrates an example of a process flow 1200 that supports imprint management for memory systems in accordance with examples as disclosed herein. In some examples, the process flow 1200 may be performed by a memory device (e.g., a memory device 540 as described with reference to FIG. 5), where the operations may be performed within the memory device (e.g., autonomously, without signaling or other interaction with a host device). In other examples, the process flow 1200 may be performed in a system that includes a memory device and a host device (e.g., a system 500 as described with reference to FIG. 5), and various operations of the process flow 1200 may be performed by either the memory device or the host device.

At 1205, the process flow 1200 may include performing an imprint detection procedure. For example, at 1205, the process flow 1200 may include performing any one or more of the imprint detection procedures described with reference to FIGS. 5 through 8. In various examples, the operations of 1205 may include one or more of writing enforced or unenforced logic states (e.g., corresponding to an imprinted data condition), writing a subset of memory cells of a memory array according to an evaluation data condition, or performing one or more imprint evaluation methods (e.g., as described with reference to FIG. 8A or FIG. 8B). In various examples, the operations of 1205 may be performed continuously, may be triggered or initiated based on a periodic scheduling, or may be event-driven (e.g., triggered or initiated as part of a powering up or boot of the memory device or system). In some examples, the operations of 1205 may include one or more aspects of the operations of 605 or 615 described with reference to FIG. 6.

At 1210, the process flow 1200 may include determining whether to perform an imprint recovery operation. If a determination is made to perform an imprint recovery, the process flow 1200 may proceed to 1215. If a determination is made to not perform an imprint recovery, the process flow 1200 may proceed to 1235. In some examples, a determination at 1210 may be based on an outcome of an imprint evaluation method as described herein. In some examples, the operations of 1210 may include one or more aspects of the operations of 620 described with reference to FIG. 6.

At 1215, the process flow 1200 may include determining a direction of imprint. In some examples, such a determination may be made for individual memory cells on a cell-by-cell basis. In some examples, such a determination may be made in aggregate for a subset of memory cells of a memory array. In various examples, the determination of 1215 may include aspects of a predicted or probabilistic direction of imprint, a prediction based on a known sensitivity of imprinting with respect to logic state, or based on a measurement of imprint of one or more memory cells or a representative population of memory cells.

At 1220, the process flow 1200 may include configuring recovery parameters, which may be based at least in part on a direction of imprint determined at 1215. For example, a host device or memory device may determine whether to perform a unipolar cell biasing 900 or an asymmetric bipolar cell biasing 900 as described with reference to FIG. 9. In some examples, the configuring of 1220 may include determining one or more of an amplitude for voltage pulses 905, a duration for voltage pulses 905, a quantity of cycles of voltage pulses 905, or other configurations. In some examples, the configuring of 1220 may be based at least in part on a detected or predicted severity of imprint, a detected temperature of a host device or memory device, a detected aging or wear, a detected power condition, a signaled available duration for recovery operations, or other conditions.

At 1225, the process flow 1200 may include performing an imprint recovery procedure. For example, at 1225, the process flow may include performing a discrete recovery event on a full memory array 555, a recovery operation during operation, or modifying other operations on a memory array 555 for the purpose of imprint recovery, as described with reference to FIG. 5, any of which may be based at least in part on a preconfiguration for such methods or a selection from a set of such recovery methods. In some examples, the operations of 1225 may include one or more aspects of the operations of 625 described with reference to FIG. 6.

At 1230, the process flow 1200 may include determining whether the imprint recovery procedure of 1225 was successful. If the determination indicates that the imprint recovery procedure of 1225 was successful, the process flow 1200 may proceed to 1235. If the determination indicates that the imprint recovery procedure of 1225 was not successful, the process flow 1200 may return to 1225 (e.g., to repeat the imprint recovery procedure according to the same configuration or parameters or modified configuration or parameters). In some examples, the operations of 1230 may include one or more aspects of the imprint detection procedure of 1205.

At 1235, the process flow 1200 may include entering an operating mode, which may include normal operations where data exchange is supported between the host device and the memory device (e.g., according to normal operation or conditions, according to an access mode). In some examples, the operations of 1235 may include one or more aspects of the operations of 630 described with reference to FIG. 6.

Figure 13:
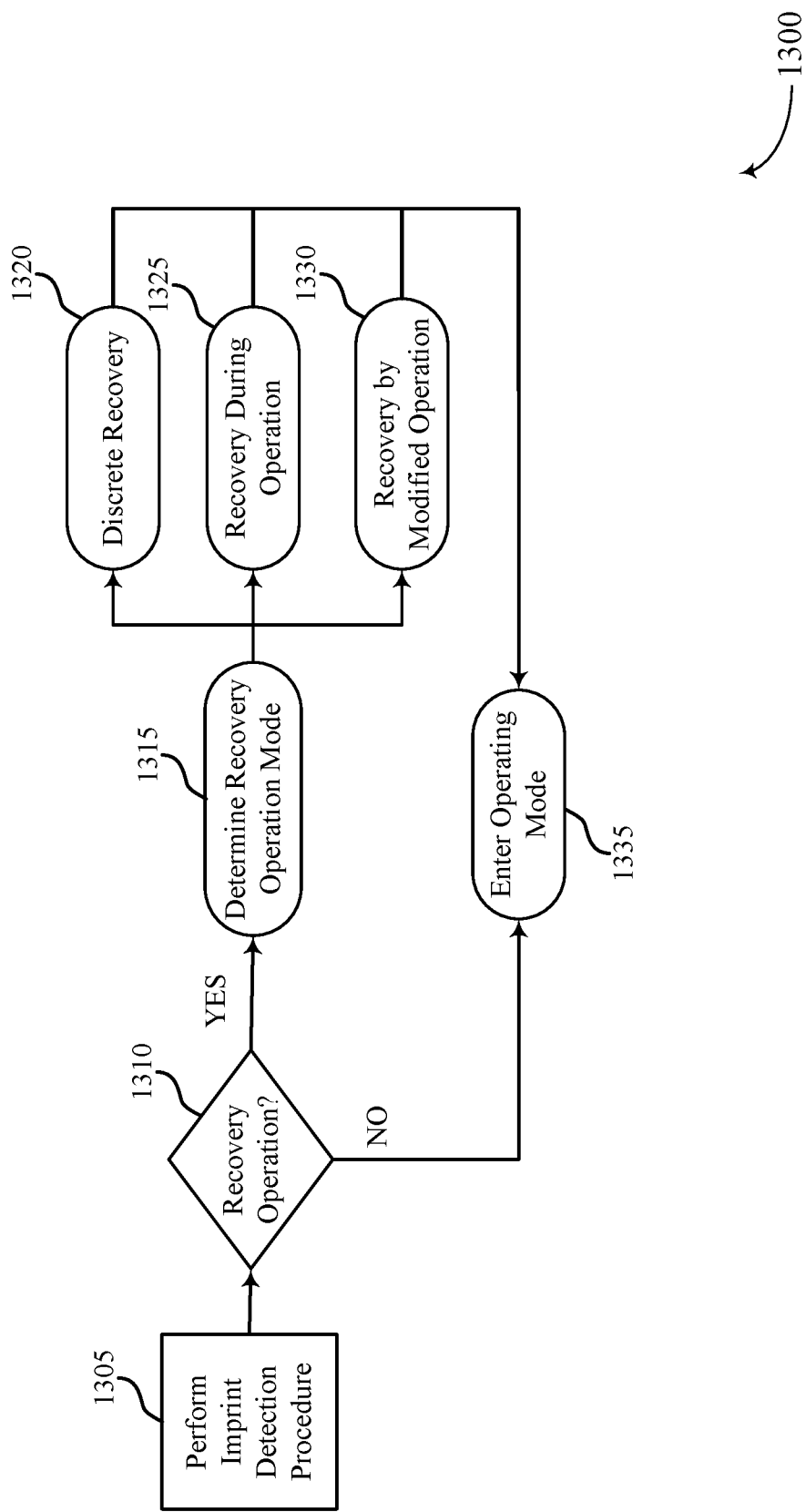

FIG. 13 illustrates an example of a process flow 1300 that supports imprint management for memory systems in accordance with examples as disclosed herein. In some examples, the process flow 1300 may be performed by a memory device (e.g., a memory device 540 as described with reference to FIG. 5), where the operations may be performed within the memory device (e.g., autonomously, without signaling or other interaction with a host device). In other examples, the process flow 1300 may be performed in a system that includes a memory device and a host device (e.g., a system 500 as described with reference to FIG. 5), and various operations of the process flow 1300 may be performed by either the memory device or the host device.

At 1305, the process flow 1300 may include performing an imprint detection procedure. For example, at 1305, the process flow 1300 may include performing any one or more of the imprint detection procedures described with reference to FIGS. 5 through 8. In various examples, the operations of 1305 may include one or more of writing enforced or unenforced logic states (e.g., corresponding to an imprinted data condition), writing a subset of memory cells of a memory array according to an evaluation data condition, or performing one or more imprint evaluation methods (e.g., as described with reference to FIG. 8A or FIG. 8B). In various examples, the operations of 1305 may be performed continuously, may be triggered or initiated based on a periodic scheduling, or may be event-driven (e.g., triggered or initiated as part of a powering up or boot of the memory device or system). In some examples, the operations of 1305 may include one or more aspects of the operations of 605 or 615 described with reference to FIG. 6.

At 1310, the process flow 1300 may include determining whether to perform an imprint recovery operation. If a determination is made to perform an imprint recovery, the process flow 1300 may proceed to 1315. If a determination is made to not perform an imprint recovery, the process flow 1300 may proceed to 1335. In some examples, a determination at 1310 may be based on an outcome of an imprint evaluation method as described herein. In some examples, the operations of 1310 may include one or more aspects of the operations of 620 described with reference to FIG. 6.

At 1315, the process flow 1300 may include determining a recovery operation mode. For example, the operations of 1315 may include a selection (e.g., by a memory device, by a host device) between performing a discrete recovery event, performing imprint recovery during operation, or performing an imprint recovery by modified operation, as described with reference to FIG. 5. If a determination is made to perform a discrete recovery, the process flow 1300 may proceed to 1320. If a determination is made to perform an imprint recovery during operation, the process flow 1300 may proceed to 1325. If a determination is made to perform an imprint recovery by modified operation, the process flow may proceed to 1330.

At 1320, the process flow 1300 may include performing discrete recovery procedure on a memory array (e.g., as described with reference to FIG. 5). Following the discrete recovery procedure of 1320, the process flow 1300 may proceed to 1335

At 1325, the process flow 1300 may include performing an imprint recovery during operation of the memory device (e.g., as described with reference to FIG. 5). Following the imprint recovery during operation of the memory device of 1325, the process flow 1300 may proceed to 1335

At 1330, the process flow 1300 may include performing an imprint recovery by modifying operation of the memory device or a memory array of the memory device (e.g., as described with reference to FIG. 5). Following the imprint recovery by modified operation of 1330, the process flow 1300 may proceed to 1335

At 1335, the process flow 1300 may include entering an operating mode, which may include normal operations where data exchange is supported between the host device and the memory device (e.g., according to normal operation or conditions, according to an access mode). In some examples, the operations of 1335 may include one or more aspects of the operations of 630 described with reference to FIG. 6.

Figure 14:
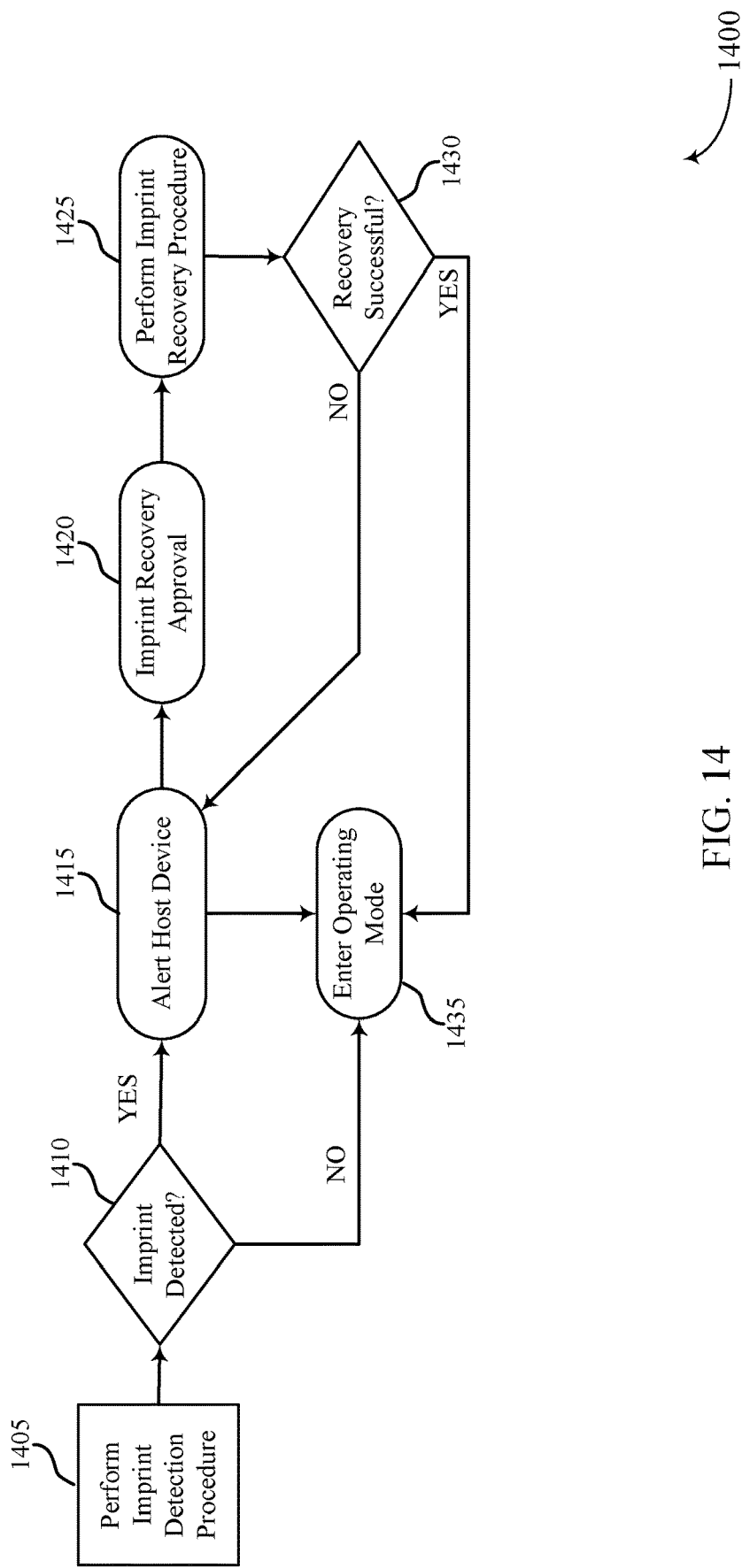

FIG. 14 illustrates an example of a process flow 1400 that supports imprint management for memory systems in accordance with examples as disclosed herein. In some examples, the process flow 1400 may be performed in a system that includes a memory device and a host device (e.g., a system 500 as described with reference to FIG. 5), and various operations of the process flow 1400 may be performed by either the memory device or the host device.

At 1405, the process flow 1400 may include performing an imprint detection procedure. For example, at 1405, the process flow 1400 may include performing any one or more of the imprint detection procedures described with reference to FIGS. 5 through 8. In various examples, the operations of 1405 may include one or more of writing enforced or unenforced logic states (e.g., corresponding to an imprinted data condition), writing a subset of memory cells of a memory array according to an evaluation data condition, or performing one or more imprint evaluation methods (e.g., as described with reference to FIG. 8A or FIG. 8B). In various examples, the operations of 1405 may be performed continuously, may be triggered or initiated based on a periodic scheduling, or may be event-driven (e.g., triggered or initiated as part of a powering up or boot of the memory device or system). In some examples, the operations of 1405 may include one or more aspects of the operations of 605 or 615 described with reference to FIG. 6.

At 1410, the process flow 1400 may include determining whether to perform an imprint recovery operation, or otherwise determining whether imprint is detected or predicted. If a determination is made to perform an imprint recovery, or if imprint is otherwise detected or predicted, the process flow 1400 may proceed to 1415. If a determination is made to not perform an imprint recovery, or if imprint is otherwise not detected or predicted, the process flow 1400 may proceed to 1435. In some examples, a determination at 1410 may be based on an outcome of an imprint evaluation method as described herein. In some examples, the operations of 1410 may include one or more aspects of the operations of 620 described with reference to FIG. 6.

At 1415, the process flow 1400 may include the memory device alerting the host device that imprint has been detected, or that an imprint recovery process is required. In some examples, such an alert may be provided according to the signaling 1000 described with reference to FIG. 10. For example, the alerting of 1415 may include writing or signaling according to any one or more of a portion 1005, 1010, 1015, 1020, or 1025.

At 1420, the process flow 1400 may include the host device indicating to the memory device that imprint recovery is approved, or otherwise is to be performed. In some examples, such an approval may be provided according to the signaling 1000 described with reference to FIG. 10. For example, the alerting of 1415 may include writing or signaling according to any one or more of a portion 1005, 1010, 1015, 1020, or 1025.

At 1425, the process flow 1400 may include performing an imprint recovery procedure. For example, at 1425, the process flow may include performing a discrete recovery event on a full memory array 555, a recovery operation during operation, or modifying other operations on a memory array 555 for the purpose of imprint recovery, described with reference to FIG. 5, any of which may be based at least in part on a preconfiguration for such methods or a selection from a set of such recovery methods. In some examples, the operations of 1425 may include one or more aspects of the operations of 625 described with reference to FIG. 6.

At 1430, the process flow 1400 may include determining whether the imprint recovery procedure of 1425 was successful. If the determination indicates that the imprint recovery procedure of 1425 was successful, the process flow 1400 may proceed to 1435. If the determination indicates that the imprint recovery procedure of 1425 was not successful, the process flow 1400 may return to 1415 (e.g., to repeat an alert indication to the host device, to await another approval, to perform another imprint recovery procedure). In some examples, the operations of 1430 may include one or more aspects of the imprint detection procedure of 1405.

At 1435, the process flow 1400 may include entering an operating mode, which may include normal operations where data exchange is supported between the host device and the memory device (e.g., according to normal operation or conditions). In some examples, the operations of 1435 may include one or more aspects of the operations of 630 described with reference to FIG. 6.

Figure 15:
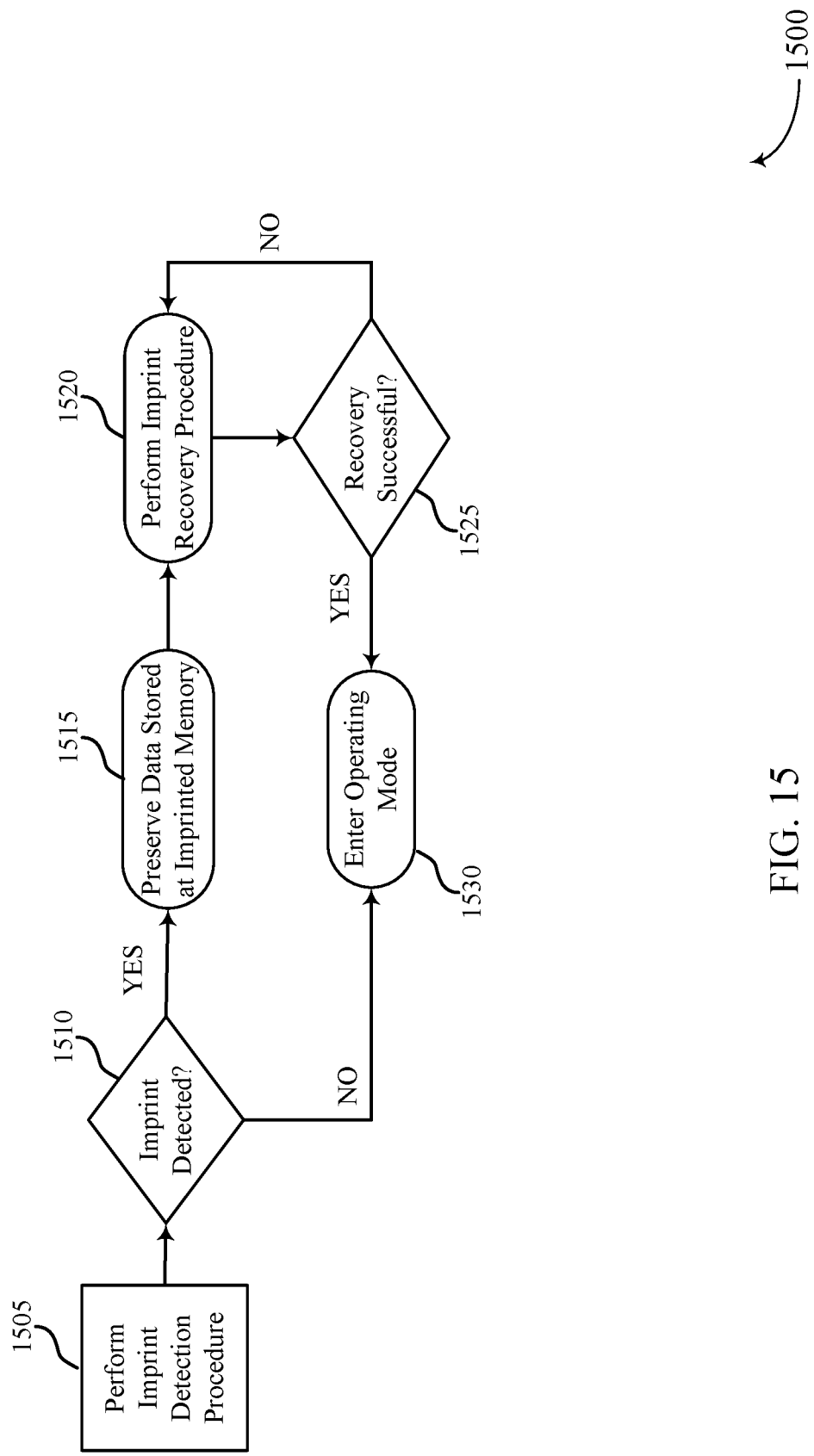

FIG. 15 illustrates an example of a process flow 1500 that supports imprint management for memory systems in accordance with examples as disclosed herein. In some examples, the process flow 1500 may be performed by a memory device (e.g., a memory device 540 as described with reference to FIG. 5), where the operations may be performed within the memory device (e.g., autonomously, without signaling or other interaction with a host device). In other examples, the process flow 1500 may be performed in a system that includes a memory device and a host device (e.g., a system 500 as described with reference to FIG. 5), and various operations of the process flow 1500 may be performed by either the memory device or the host device.

At 1505, the process flow 1500 may include performing an imprint detection procedure. For example, at 1505, the process flow 1500 may include performing any one or more of the imprint detection procedures described with reference to FIGS. 5 through 8. In various examples, the operations of 1505 may include one or more of writing enforced or unenforced logic states (e.g., corresponding to an imprinted data condition), writing a subset of memory cells of a memory array according to an evaluation data condition, or performing one or more imprint evaluation methods (e.g., as described with reference to FIG. 8A or FIG. 8B). In various examples, the operations of 1505 may be triggered or initiated based on a periodic scheduling, or may be event-driven (e.g., triggered or initiated as part of a powering up or boot of the memory device or system). In some examples, the operations of 1505 may include one or more aspects of the operations of 605 or 615 described with reference to FIG. 6.

At 1510, the process flow 1500 may include determining whether to perform an imprint recovery operation, or otherwise determining whether imprint is detected or predicted. If a determination is made to perform an imprint recovery, or if imprint is otherwise detected or predicted, the process flow 1500 may proceed to 1515. If a determination is made to not perform an imprint recovery, or if imprint is otherwise not detected or predicted, the process flow 1500 may proceed to 1535. In some examples, a determination at 1510 may be based on an outcome of an imprint evaluation method as described herein. In some examples, the operations of 1510 may include one or more aspects of the operations of 620 described with reference to FIG. 6.

At 1515, the process flow 1500 may include preserving data stored at a portion of the memory device or memory array associated with detected or predicted imprinting. For example, data associated with imprinted memory cells may be transferred to another portion of a memory array, to another memory array, to one or more sense amplifiers or latches, or to an auxiliary memory device. In various examples, preserved data may be returned to the same subset of memory cells, or maintained at a different subset of memory cells, which may or may not include updating an address table or other lookup resource.

At 1520, the process flow 1500 may include performing an imprint recovery procedure. For example, at 1520, the process flow may include performing a discrete recovery event on a full memory array 555, a recovery operation during operation, or modifying other operations on a memory array 555 for the purpose of imprint recovery, as described with reference to FIG. 5, any of which may be based at least in part on a preconfiguration for such methods or a selection from a set of such recovery methods. In some examples, the operations of 1520 may include one or more aspects of the operations of 625 described with reference to FIG. 6.

At 1525, the process flow 1500 may include determining whether the imprint recovery procedure of 1520 was successful. If the determination indicates that the imprint recovery procedure of 1520 was successful, the process flow 1500 may proceed to 1530. If the determination indicates that the imprint recovery procedure of 1520 was not successful, the process flow 1500 may return to 1520 (e.g., to repeat the imprint recovery procedure according to the same configuration or parameters or modified configuration or parameters). In some examples, the operations of 1525 may include one or more aspects of the imprint detection procedure of 1505.

At 1530, the process flow 1500 may include entering an operating mode, which may include normal operations where data exchange is supported between the host device and the memory device (e.g., according to normal operation or conditions). In some examples, the operations of 1530 may include one or more aspects of the operations of 630 described with reference to FIG. 6.

Figure 16:
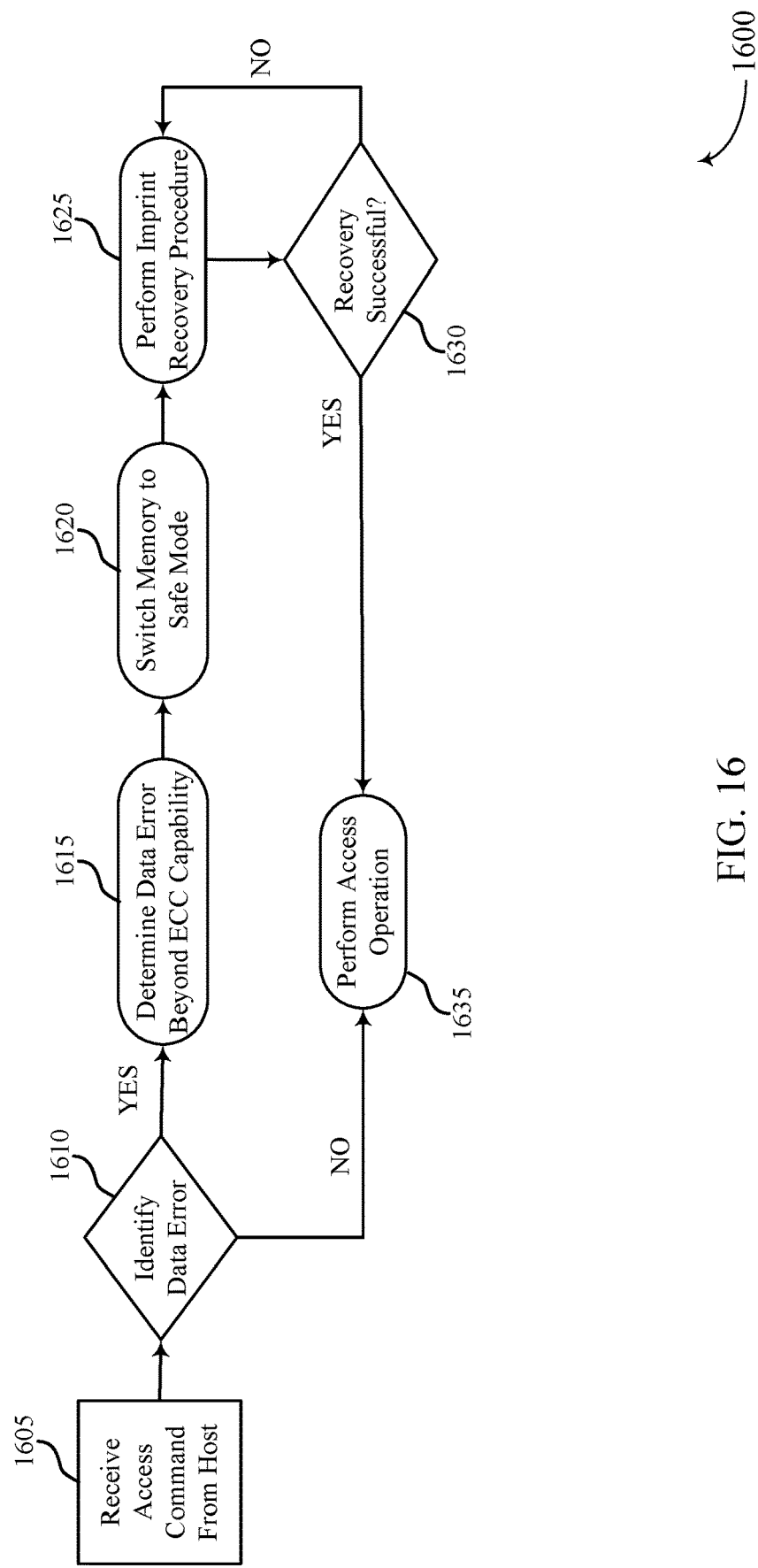

FIG. 16 illustrates an example of a process flow 1600 that supports imprint management for memory systems in accordance with examples as disclosed herein. In some examples, the process flow 1600 may be performed in a system that includes a memory device and a host device (e.g., a system 500 as described with reference to FIG. 5), and various operations of the process flow 1600 may be performed by either the memory device or the host device.

At 1605, the process flow 1600 may include the memory device receiving an access command from a host device. In various examples, the access command may include a read command, a write command, a refresh command, or a combination thereof.

At 1610, the process flow 1600 may include determining whether the access command or some other aspect of operating the memory device is associated with a data error. For example, the operations at 1610 may include an identification of an error by an ECC algorithm, or another portion of a memory device identifying an inadvertent or malicious access pattern associated with imprinting or causing some other memory cell degradation. If the determination of 1610 is associated with an identified data error, the process flow 1600 may proceed to 1615. If the determination of 1610 is not associated with an identified data error, the process flow 1600 may proceed to 1635.

At 1615, the process flow 1600 may include determining whether the data error is beyond a capability of an ECC algorithm or procedure. If the determination at 1615 indicates that the data error is not beyond a capability of the ECC algorithm or procedure, the process flow 1600 may proceed to 1635. If the determination at 1615 indicates that the data error is beyond a capability of the ECC algorithm or procedure, the process flow 1600 may proceed to 1620.

At 1620, the process flow 1600 may include switching the memory device to a safe mode. For example, the memory device may be switched to an inoperable mode, a maintenance mode, a recovery mode, or some other determination to cease normal functions. In some examples, the memory device may indicate to the host device that the memory device is unavailable for access commands, or perform various other operations according to a safe mode (e.g., as described with reference to FIG. 5), which may be related to an assumption of non-volatility being violated. In some examples, the operations of 1620 may be configured to cause a failure at the host device, such as an engineered blue screen event.

At 1625, the process flow 1600 may include performing an imprint recovery procedure. For example, at 1625, the process flow may include performing a discrete recovery event on a full memory array 555, a recovery operation during operation, or modifying other operations on a memory array 555 for the purpose of imprint recovery, as described with reference to FIG. 5, any of which may be based at least in part on a preconfiguration for such methods or a selection from a set of such recovery methods. In some examples, the operations of 1625 may include one or more aspects of the operations of 625 described with reference to FIG. 6.

At 1630, the process flow 1600 may include determining whether the imprint recovery procedure of 1625 was successful. If the determination indicates that the imprint recovery procedure of 1625 was successful, the process flow 1600 may proceed to 1635. If the determination indicates that the imprint recovery procedure of 1625 was not successful, the process flow 1600 may return to 1625 (e.g., to repeat the imprint recovery procedure according to the same configuration or parameters or modified configuration or parameters). In some examples, the operations of 1630 may include one or more aspects of the imprint detection procedure of 1605.

At 1635, the process flow 1600 may include performing the access operation associated with the access command of 1605, or some other access operation (e.g., returning to a normal operating mode). In some examples, the process flow may also include recovering data associated with the data error, which may include pulling backup data from another portion of a memory array, another memory array, or an auxiliary memory device.

Figure 17:
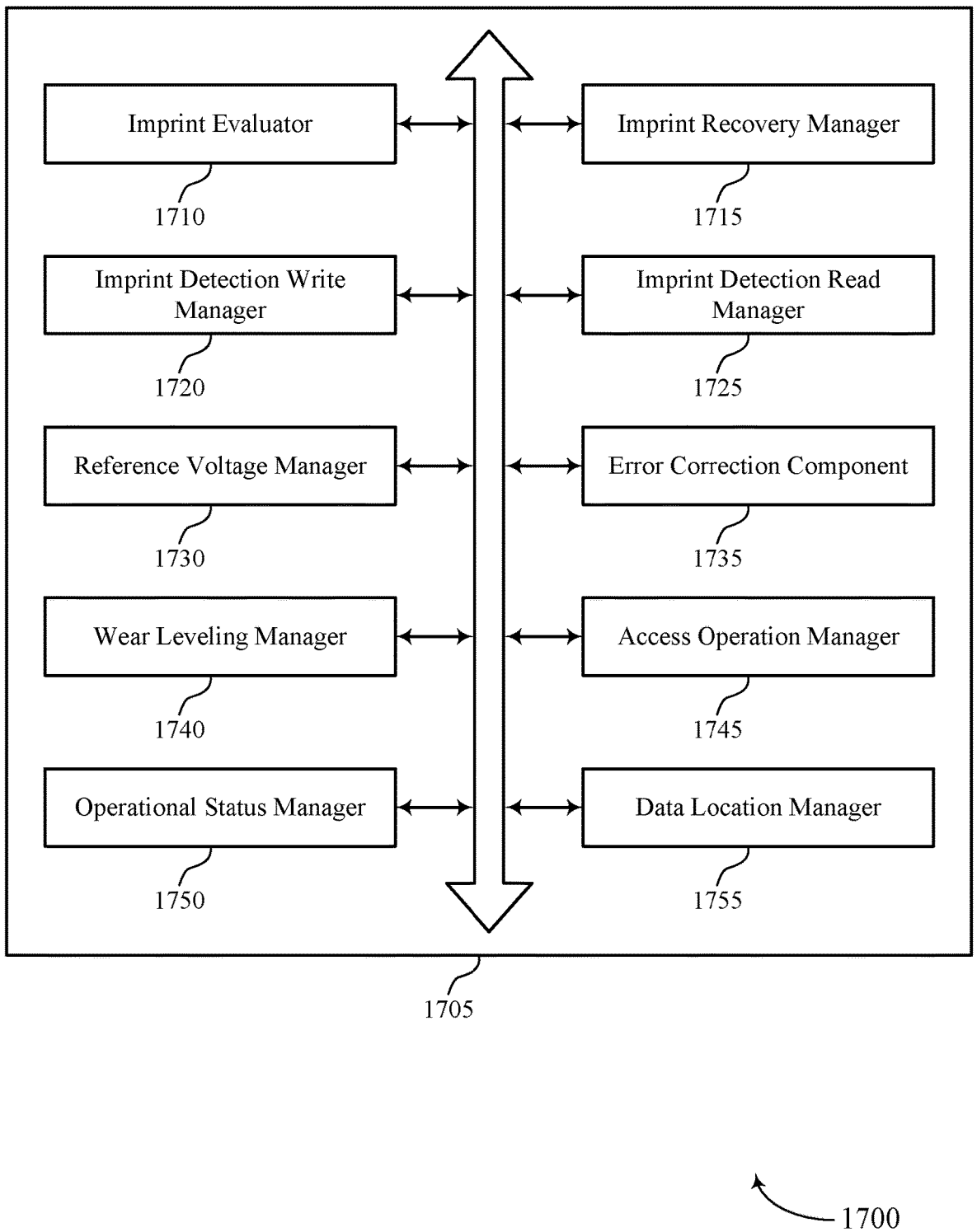
FIG. 17 shows a block diagram of a memory device that supports imprint management for memory systems in accordance with aspects of the present disclosure.

FIG. 17 shows a block diagram 1700 of a memory device 1705 that supports imprint management for memory systems in accordance with examples as disclosed herein. The memory device 1705 may be an example of aspects of a memory device as described with reference to FIGS. 1 through 23. The memory device 1705 may include one or more of an imprint evaluator 1710, an imprint recovery manager 1715, an imprint detection write manager 1720, an imprint detection read manager 1725, a reference voltage manager 1730, an error correction component 1735, a wear leveling manager 1740, an access operation manager 1745, an operational status manager 1750, or a data location manager 1755. Each of these modules may communicate, directly or indirectly, with one another (e.g., via one or more buses).

The imprint evaluator 1710 may manage various examples of evaluating memory cell imprint, including various examples of the techniques described herein.

In some examples, the imprint evaluator 1710 may determine to perform an imprint recovery procedure on a memory cell configured to store one of a set of logic states. In some examples, the imprint recovery procedure may be configured to increase an ability of a memory cell to switch between storing different logic states of the set of logic states (e.g., to increase an ability of the memory cell to switch between storing a first logic state of the set of logic states and storing a second logic state of the set of logic states). In some examples, the imprint recovery procedure may be configured to normalize or equalize access operation behavior for memory cells, such as by reducing or mitigating access operation differences or asymmetries with respect to different logic states (e.g., equalizing or normalizing, with respect to different logic states, a response of memory cells to read operations or write operations). In some examples, the imprint recovery procedure may be configured to increase or equalize a charge mobility of ferroelectric memory cells, or improve or equalize a capability for ferroelectric memory cells to have a polarization change in response to write operations, or both.

In some examples, the imprint evaluator 1710 may determine to increase an ability of a set of memory cells to switch between storing different logic states.

In some examples, the imprint evaluator 1710 may determine that a set of memory cells are imprinted in respective first logic states, and determining to increase an ability of a set of memory cells to switch between storing different logic states may be based on the determining.

In some examples, the imprint evaluator 1710 may determine that a set of memory cells included in a memory device are imprinted in respective first logic states.

In some examples, the imprint evaluator 1710 may determine a severity with which a set of memory cells are imprinted in respective first logic states.

In some examples, the imprint evaluator 1710 may determine whether an identified or determined severity satisfies a threshold.

In some examples, the imprint evaluator 1710 may determine, after performing an imprint recovery procedure, whether the imprint recovery procedure was successful.

In some examples, the imprint evaluator 1710 may determine a quantity of differences between a second set of logic states and a first set of logic states, and determining that a set of memory cells are imprinted in respective first logic states may be based on the quantity of differences between the second set of logic states and the first set of logic states.

In some examples, the imprint evaluator 1710 may determine, after modifying a value of an operational parameter, that a set of memory cells has been operated based on the modified value of the operational parameter for a duration that satisfies a threshold amount of time.

In some examples, the imprint evaluator 1710 may determine, after modifying a value of an operational parameter, that a quantity of refresh operations performed on a set of memory cells satisfies a threshold.

The imprint recovery manager 1715 may manage various examples of performing memory cell imprint operations, including various examples of the techniques described herein. In some examples, the imprint recovery procedure may be configured to increase an ability of the memory cell to switch between storing different logic states of the set of logic states (e.g., to increase an ability of the memory cell to switch between storing a first logic state of the set of logic states and storing a second logic state of the set of logic states). In some examples, the imprint recovery procedure may be configured normalize or equalize access operation behavior for memory cells, such as reducing or mitigating access operation differences or asymmetries with respect to different logic states (e.g., equalizing or normalizing a response of memory cells to read operations or write operations). In some examples, the imprint recovery procedure may be configured to increase a charge mobility of ferroelectric memory cells, or improve a capability for ferroelectric memory cells to have a polarization change in response to write operations, or both.

In some examples, the imprint recovery manager 1715 may perform an imprint recovery procedure on a set of memory cells while access to the set of memory cells is restricted.

In some examples, the imprint recovery manager 1715 may select, based on whether a severity satisfies a threshold, between a first imprint recovery method and a second imprint recovery method, where the first imprint recovery method restricts access to a set of memory cells, and where the second imprint recovery method permits access to the set of memory cells.

In some examples, the imprint recovery manager 1715 may apply a selected imprint recovery method to a set of memory cells.

In some examples, the imprint recovery manager 1715 may perform a second imprint recovery procedure on a set of memory cells based on determining that an imprint recovery procedure was not successful.

In some examples, the imprint recovery manager 1715 may apply one or more voltage pulses to a set of memory cells.

In some examples, the imprint recovery manager 1715 may select an imprint recovery method based on a temperature of a memory device that includes a set of memory cells, an amount of time available for applying an imprint recovery method, an amount of power available for applying an imprint recovery method, an age of a memory device that includes a set of memory cells, or any combination thereof.

In some examples, the imprint recovery manager 1715 may apply, during a refresh operation for a memory cell of a set of memory cells, a set of voltage pulses to the memory cell.

In some cases, a first subset of one or more voltage pulses may have a first polarity, and a second subset of the one or more voltage pulses may have a second polarity (e.g., a different polarity, an opposite polarity).

In some cases, a set of memory cells include ferroelectric memory cells, and an imprint recovery procedure is to increase the ability of the set of memory cells to switch between storing respective first logic states and storing respective second logic states based on altering a configuration of electrostatic domains within the ferroelectric memory cells.

In some cases, a first subset of a set of voltage pulses may have a first polarity and a second subset of the set of voltage pulses may have a second polarity (e.g., a different polarity, an opposite polarity).

The imprint detection write manager 1720 may manage various examples of performing write operations pertaining to the detection of memory cell imprint, including various examples of the techniques described herein.

In some examples, the imprint detection write manager 1720 may write a first set of logic states to a set of memory cells.

The imprint detection read manager 1725 may manage various examples of performing read operations pertaining to the detection of memory cell imprint, including various examples of the techniques described herein.

In some examples, the imprint detection read manager 1725 may read a set of memory cells to obtain a second set of logic states that are based on writing a first set of logic states.

The error correction component 1735 may identify data errors for data.

The access operation manager 1745 may manage various examples of performing or modifying access operations pertaining to imprint management, including various examples of the techniques described herein In some examples, the access operation manager 1745 may modify an operational parameter for a set of memory cells based on determining to increase an ability of the set of memory cells to switch between storing different logic states.

In some examples, the access operation manager 1745 may operate a set of memory cells based on a modified operational parameter.

In some examples, an operational parameter comprises a temporal frequency of refresh operations for a set of memory cells, and modifying a value of the operational parameter includes increasing a temporal frequency of refresh operations for a set of memory cells.

In some examples, a refresh procedure for a set of memory cells comprises at least one refresh operation for each memory cell of the set of memory cells, and an operational parameter comprises a quantity of refresh operations per refresh procedure for the set of memory cells, and, to modify the value of the operational parameter, the access operation manager 1745 may increase a quantity of refresh operations per refresh procedure for the set of memory cells.

In some examples, the access operation manager 1745 may perform a refresh operation of a quantity by reading from a set of memory cells respective first logic states and writing to the set of memory cells respective second logic states.

In some examples, an operational parameter comprises a quantity of commanded refresh operations that a memory device may skip for a set of memory cells, and modifying a value of the operational parameter includes decreasing the quantity of commanded refresh operations that the memory device may skip for the set of memory cells.

In some examples, an operational parameter comprises a magnitude of a voltage used to perform read operations, write operations, or refresh on a set of memory cells, and modifying a value of the operational parameter includes changing the magnitude of the voltage used to perform read operations, write operations, or refresh operations on the set of memory cells.

In some examples, an access procedure for a memory cell of a set of memory cells comprises a read operation and a write operation, and an operational parameter comprises a magnitude of a voltage applied to the memory cell at a time between the read operation and the write operation, and modifying a value of the operational parameter includes changing the magnitude of the voltage applied to the memory cell at the time between the read operation and the write operation.

In some examples, the operational parameter comprises a temporal frequency of an error correcting procedure for a set of memory cells, and modifying the value of an operational parameter includes increasing a temporal frequency of the error correcting procedure for the set of memory cells.

In some examples, the access operation manager 1745 may change a value of an operational parameter to a second value based on determining that a duration satisfies a threshold amount of time, and the access operation manager 1745 may operate a set of memory cells based on the second value of the operational parameter.

In some examples, the access operation manager 1745 may change a value of an operational parameter to a second value based on determining that a quantity of refresh operations satisfies a threshold, and the access operation manager 1745 may operate a set of memory cells based on the second value of the operational parameter.

In some examples, the operational parameter comprises a duration of refresh operations for a set of memory cells, and modifying a value of the operational parameter includes increasing a duration of refresh operations for the set of memory cells.

In some cases, an operational parameter includes a temporal frequency of refresh operations for a set of memory cells.

In some cases, a refresh procedure for a set of memory cells includes at least one refresh operation for each memory cell of the set of memory cells.

In some cases, an operational parameter includes a quantity of refresh operations per refresh procedure for a set of memory cells.

In some cases, an operational parameter includes a quantity of commanded refresh operations that a memory device may skip for a set of memory cells.

In some cases, an operational parameter includes a magnitude of a voltage used to perform read operations, write operations, or refresh on a set of memory cells.

In some cases, an access procedure for a memory cell of a set of memory cells includes a read operation and a write operation.

In some cases, an operational parameter includes a magnitude of a voltage applied to a memory cell at a time between a read operation and a write operation.

In some cases, an operational parameter includes a temporal frequency of an error correcting procedure for a set of memory cells.

In some cases, an operational parameter includes a duration of refresh operations for a set of memory cells.

The operational status manager 1750 may manage various examples of statuses or status signaling, of a memory device, a host device, or a system that includes a memory device and a host device, including various examples of the techniques described herein.

In some examples, the operational status manager 1750 may restrict access to a set of memory cells based on determining that the set of memory cells are imprinted in respective first logic states.

In some examples, the operational status manager 1750 may permit access to a set of memory cells after performing an imprint recovery procedure.

In some examples, the operational status manager 1750 may transmit, to a host device for a memory device that includes a set of memory cells, an indication of whether an imprint recovery procedure was successful.

In some examples, the operational status manager 1750 may determine to operate a memory device that includes a set of memory cells in a maintenance mode, and a determination to perform an imprint recovery operation may be based on determining to operate the memory device in the maintenance mode, and operating the memory device in the maintenance mode may include operating a set of memory cells based on a modified operational parameter.

In some examples, the operational status manager 1750 may determine whether to indicate a selected method (e.g., a selected imprint recovery method) to a host device for a memory device that includes a set of memory cells based on whether the selected method is a first imprint recovery method or a second imprint recovery method.

The data location manager 1755 may manage various aspects of data locations, such as data addressing, data moving, or other aspects, including various examples of the techniques described herein.

The reference voltage manager 1730 may manage various aspects of reference voltages used to read memory cells or evaluate memory cell imprint, including various examples of the techniques described herein.

Figure 18:
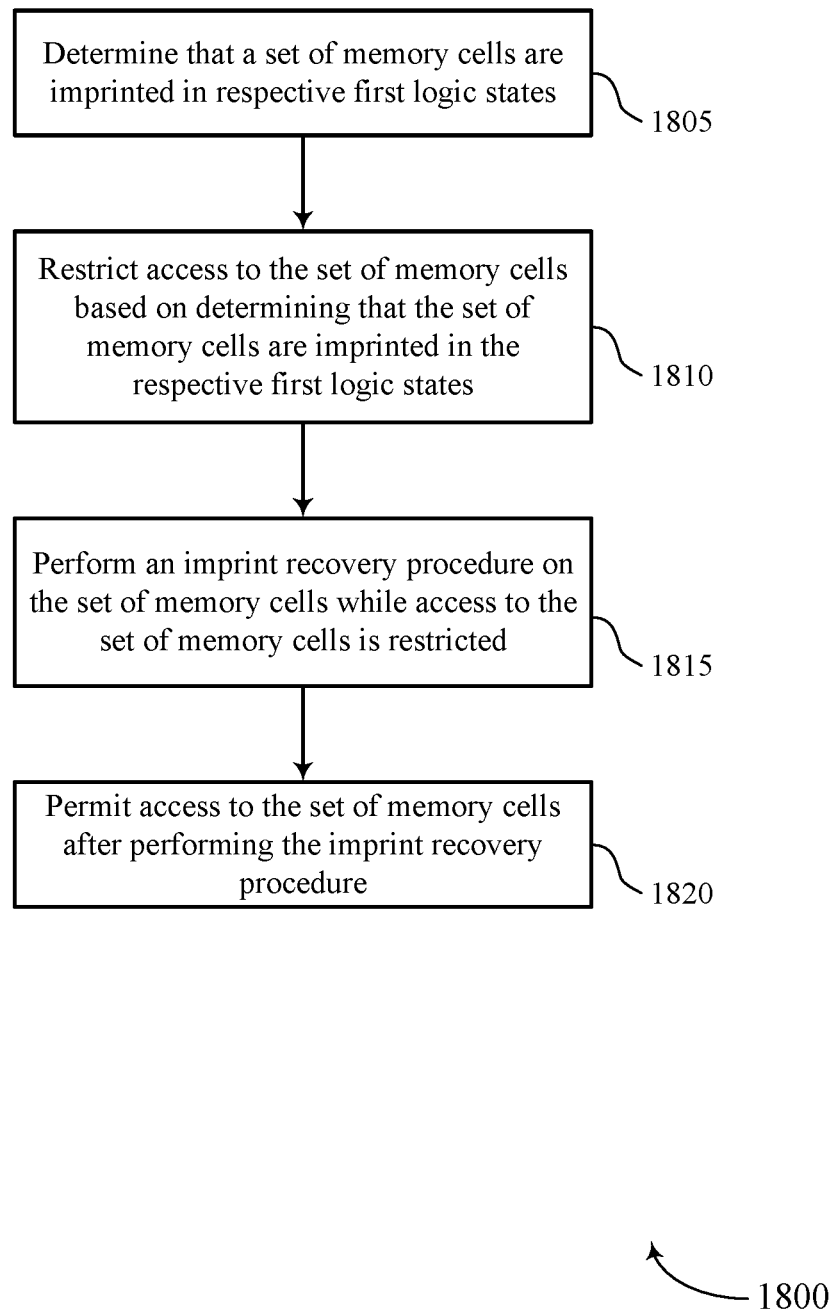
FIGS. 18 through 20 show flowcharts illustrating a method or methods that support imprint management for memory systems in accordance with examples as disclosed herein.

The wear leveling manager 1740 may manage various aspects of wear leveling in a memory device, including various examples of the techniques described herein FIG. 18 shows a flowchart illustrating a method or methods 1800 that supports imprint management for memory systems in accordance with aspects of the present disclosure. The operations of method 1800 may be implemented by a memory device or its components as described herein. For example, the operations of method 1800 may be performed by a memory device as described with reference to FIG. 17. In some examples, a memory device may execute a set of instructions to control the functional elements of the memory device to perform the described functions. Additionally, or alternatively, a memory device may perform aspects of the described functions using special-purpose hardware or circuitry.

At 1805, the memory device may determine that a set of memory cells are imprinted in respective first logic states. The operations of 1805 may be performed according to the methods described herein. In some examples, aspects of the operations of 1805 may be performed by an imprint evaluator as described with reference to FIG. 17.

At 1810, the memory device may restrict access to the set of memory cells based on determining that the set of memory cells are imprinted in the respective first logic states. The operations of 1810 may be performed according to the methods described herein. In some examples, aspects of the operations of 1810 may be performed by an operational status manager as described with reference to FIG. 17.

At 1815, the memory device may perform an imprint recovery procedure on the set of memory cells while access to the set of memory cells is restricted. In some cases, the imprint recovery procedure is configured to increase an ability of the set of memory cells to switch between storing the respective first logic states and storing respective second logic states. The operations of 1815 may be performed according to the methods described herein. In some examples, aspects of the operations of 1815 may be performed by an imprint recovery manager as described with reference to FIG. 17.

At 1820, the memory device may permit access to the set of memory cells after performing the imprint recovery procedure. The operations of 1820 may be performed according to the methods described herein. In some examples, aspects of the operations of 1820 may be performed by an operational status manager as described with reference to FIG. 17.

In some examples, an apparatus as described herein may perform a method or methods, such as the method 1800. The apparatus may include circuitry, features, means, or instructions (e.g., a non-transitory computer-readable medium storing instructions executable by a processor) for determining that a set of memory cells are imprinted in respective first logic states, restricting access to the set of memory cells based on determining that the set of memory cells are imprinted in the respective first logic states, performing an imprint recovery procedure on the set of memory cells while access to the set of memory cells is restricted (e.g., to increase an ability of the set of memory cells to switch between storing the respective first logic states and storing respective second logic states), and permitting access to the set of memory cells after performing the imprint recovery procedure.

Some examples of the method 1800 and the apparatus described herein may further include operations, circuitry, features, means, or instructions for determining, after performing the imprint recovery procedure, whether the imprint recovery procedure was successful.

Some examples of the method 1800 and the apparatus described herein may further include operations, circuitry, features, means, or instructions for performing a second imprint recovery procedure on the set of memory cells based on determining that the imprint recovery procedure was not successful.

Some examples of the method 1800 and the apparatus described herein may further include operations, circuitry, features, means, or instructions for transmitting, to a host device coupled with the memory device, an indication of whether the imprint recovery procedure was successful.

In some examples of the method 1800 and the apparatus described herein, performing the imprint recovery procedure may include operations, circuitry, features, means, or instructions for applying one or more voltage pulses to the set of memory cells.

In some examples of the method 1800 and the apparatus described herein, a first subset of the one or more voltage pulses has a first polarity, and a second subset of the one or more voltage pulses has a second polarity (e.g., a different polarity, an opposite polarity).

Some examples of the method 1800 and the apparatus described herein may further include operations, circuitry, features, means, or instructions for writing a first set of logic states to the set of memory cells, reading the set of memory cells to obtain a second set of logic states that are based on writing the first set of logic states, and determining a quantity of differences between the second set of logic states and the first set of logic states, where determining that the set of memory cells are imprinted in the respective first logic states may be based on the quantity of differences between the second set of logic states and the first set of logic states.

In some examples of the method 1800 and the apparatus described herein, the set of memory cells include ferroelectric memory cells, and the imprint recovery procedure may be to increase the ability of the set of memory cells to switch between storing the respective first logic states and storing respective second logic states based on altering a configuration of electrostatic domains within the ferroelectric memory cells.

Figure 19:
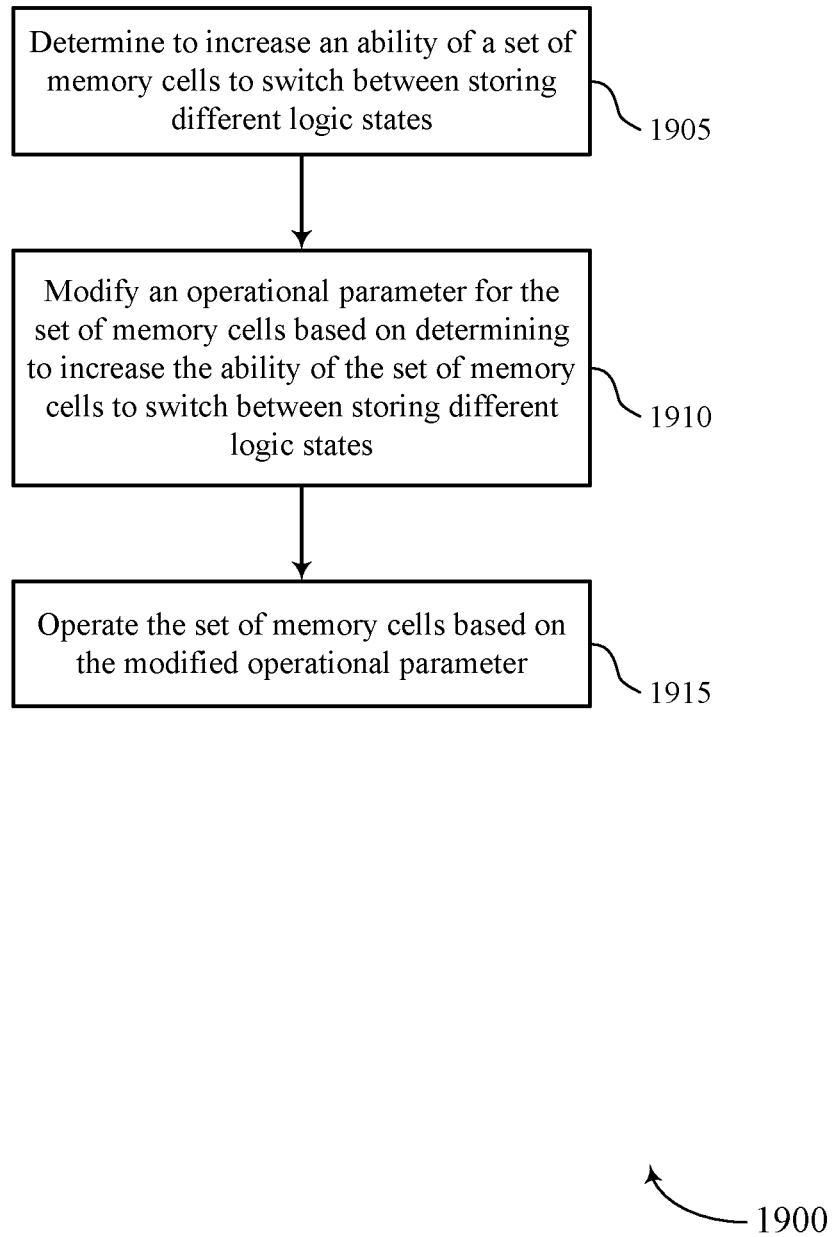

FIG. 19 shows a flowchart illustrating a method or methods 1900 that supports imprint management for memory systems in accordance with aspects of the present disclosure. The operations of method 1900 may be implemented by a memory device or its components as described herein. For example, the operations of method 1900 may be performed by a memory device as described with reference to FIG. 17. In some examples, a memory device may execute a set of instructions to control the functional elements of the memory device to perform the described functions. Additionally, or alternatively, a memory device may perform aspects of the described functions using special-purpose hardware or circuitry.

At 1905, the memory device may determine to increase an ability of a set of memory cells to switch between storing different logic states. The operations of 1905 may be performed according to the methods described herein. In some examples, aspects of the operations of 1905 may be performed by an imprint evaluator as described with reference to FIG. 17.

At 1910, the memory device may modify an operational parameter for the set of memory cells based on determining to increase the ability of the set of memory cells to switch between storing different logic states. The operations of 1910 may be performed according to the methods described herein. In some examples, aspects of the operations of 1910 may be performed by an access operation manager as described with reference to FIG. 17.

At 1915, the memory device may operate the set of memory cells based on the modified operational parameter. The operations of 1915 may be performed according to the methods described herein. In some examples, aspects of the operations of 1915 may be performed by an access operation manager as described with reference to FIG. 17.

In some examples, an apparatus as described herein may perform a method or methods, such as the method 1900. The apparatus may include circuitry, features, means, or instructions (e.g., a non-transitory computer-readable medium storing instructions executable by a processor) for determining to increase an ability of a set of memory cells to switch between storing different logic states, modifying an operational parameter for the set of memory cells based on determining to increase the ability of the set of memory cells to switch between storing different logic states, and operating the set of memory cells based on the modified operational parameter.

Some examples of the method 1900 and the apparatus described herein may further include operations, circuitry, features, means, or instructions for determining that the set of memory cells are imprinted in respective first logic states, and determining to increase the ability of the set of memory cells to switch between storing different logic states may be based on determining that the set of memory cells are imprinted.

In some examples of the method 1900 and the apparatus described herein, the operational parameter includes a temporal frequency of refresh operations for the set of memory cells, and modifying the value of the operational parameter may include operations, circuitry, features, means, or instructions for increasing the temporal frequency of refresh operations for the set of memory cells.

In some examples of the method 1900 and the apparatus described herein, a refresh procedure for the set of memory cells includes at least one refresh operation for each memory cell of the set of memory cells, the operational parameter includes a quantity of refresh operations per refresh procedure for the set of memory cells, and modifying the value of the operational parameter may include operations, circuitry, features, means, or instructions for increasing the quantity of refresh operations per refresh procedure for the set of memory cells.

Some examples of the method 1900 and the apparatus described herein may further include operations, circuitry, features, means, or instructions for performing a refresh operation of the quantity by reading from the set of memory cells respective first logic states and writing to the set of memory cells respective second logic states.

In some examples of the method 1900 and the apparatus described herein, the operational parameter includes a quantity of commanded refresh operations that the memory device may skip for the set of memory cells, and modifying the value of the operational parameter may include operations, circuitry, features, means, or instructions for decreasing the quantity of commanded refresh operations that the memory device may skip for the set of memory cells.

In some examples of the method 1900 and the apparatus described herein, the operational parameter includes a magnitude of a voltage used to perform read operations, write operations, or refresh on the set of memory cells, and modifying the value of the operational parameter may include operations, circuitry, features, means, or instructions for changing the magnitude of the voltage used to perform read operations, write operations, or refresh operations on the set of memory cells.

In some examples of the method 1900 and the apparatus described herein, an access procedure for a memory cell of the set of memory cells includes a read operation and a write operation, the operational parameter includes a magnitude of a voltage applied to the memory cell at a time between the read operation and the write operation, and modifying the value of the operational parameter may include operations, circuitry, features, means, or instructions for changing the magnitude of the voltage applied to the memory cell at the time between the read operation and the write operation.

In some examples of the method 1900 and the apparatus described herein, the operational parameter includes a temporal frequency of an error correcting procedure for the set of memory cells, and modifying the value of the operational parameter may include operations, circuitry, features, means, or instructions for increasing the temporal frequency of the error correcting procedure for the set of memory cells.

Some examples of the method 1900 and the apparatus described herein may further include operations, circuitry, features, means, or instructions for determining, after modifying the value of the operational parameter, that the set of memory cells has been operated based on the modified value of the operational parameter for a duration that satisfies a threshold amount of time, changing the value of the operational parameter to a second value based on determining that the duration satisfies the threshold amount of time, and operating the set of memory cells based on the second value of the operational parameter.

Some examples of the method 1900 and the apparatus described herein may further include operations, circuitry, features, means, or instructions for determining, after modifying the value of the operational parameter, that a quantity of refresh operations performed on the set of memory cells satisfies a threshold, changing the value of the operational parameter to a second value based on determining that the quantity of refresh operations satisfies the threshold, and operating the set of memory cells based on the second value of the operational parameter.

Some examples of the method 1900 and the apparatus described herein may further include operations, circuitry, features, means, or instructions for determining to operate the memory device that includes the set of memory cells in a maintenance mode. In some cases, determining to increase the ability of the set of memory cells to switch between storing different logic states may be based at least in part on determining to operate the memory device in the maintenance mode. In some cases, operating the memory device in the maintenance mode may include operating the set of memory cells based on the modified operational parameter.

In some examples of the method 1900 and the apparatus described herein, the operational parameter includes a duration of refresh operations for the set of memory cells, and modifying the value of the operational parameter may include operations, circuitry, features, means, or instructions for increasing the duration of refresh operations for the set of memory cells. Some examples of the method 1900 and the apparatus described herein may further include operations, circuitry, features, means, or instructions for applying, during a refresh operation for a memory cell of the set of memory cells, a set of voltage pulses to the memory cell.

In some examples of the method 1900 and the apparatus described herein, a first subset of the set of voltage pulses may have a first polarity, and a second subset of the set of voltage pulses may have a second polarity (e.g., a different polarity, an opposite polarity).

Figure 20:
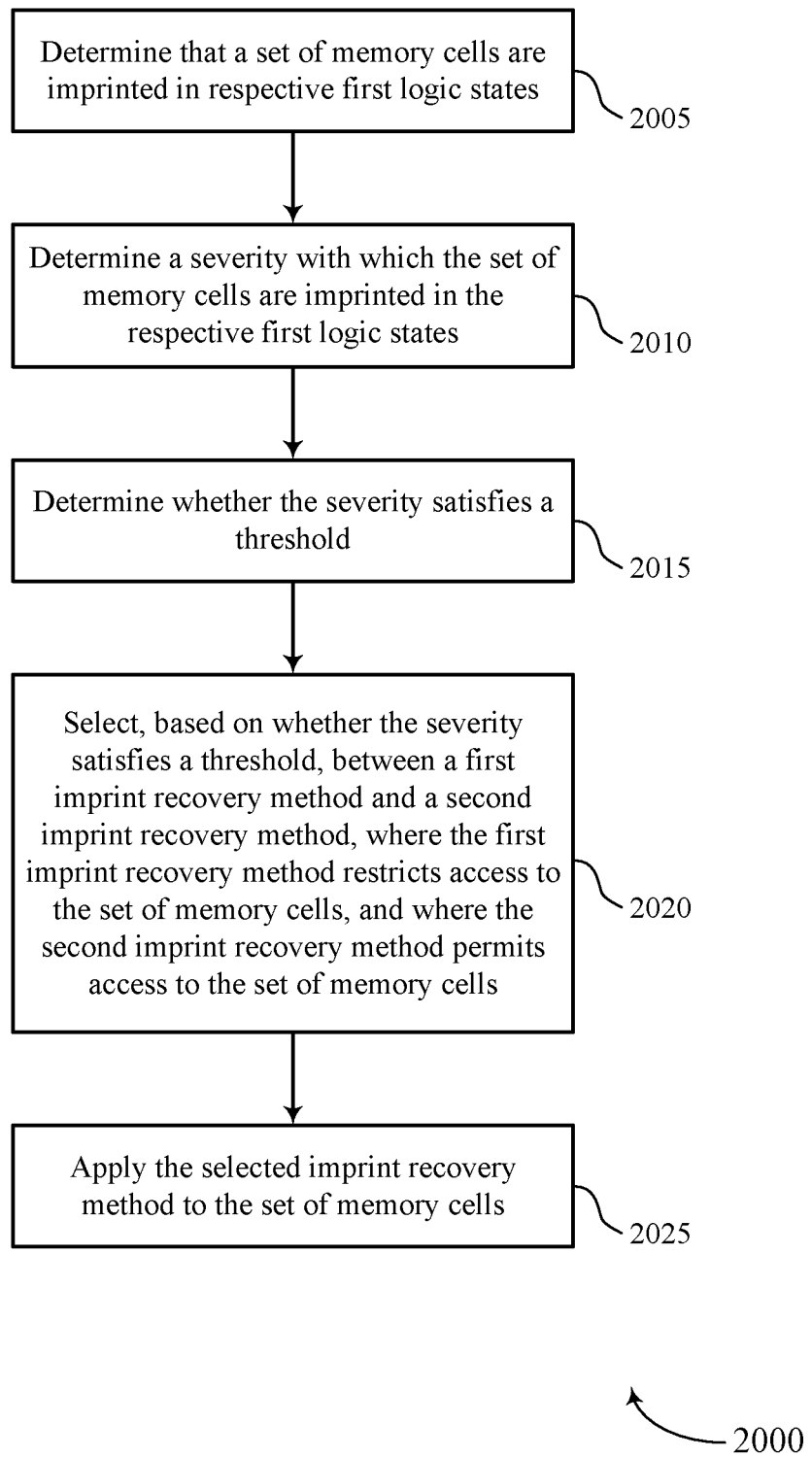

FIG. 20 shows a flowchart illustrating a method or methods 2000 that supports imprint management for memory systems in accordance with aspects of the present disclosure. The operations of method 2000 may be implemented by a memory device or its components as described herein. For example, the operations of method 2000 may be performed by a memory device as described with reference to FIG. 17. In some examples, a memory device may execute a set of instructions to control the functional elements of the memory device to perform the described functions. Additionally, or alternatively, a memory device may perform aspects of the described functions using special-purpose hardware or circuitry.

At 2005, the memory device may determine that a set of memory cells are imprinted in respective first logic states. The operations of 2005 may be performed according to the methods described herein. In some examples, aspects of the operations of 2005 may be performed by an imprint evaluator as described with reference to FIG. 17.

At 2010, the memory device may determine a severity with which the set of memory cells are imprinted in the respective first logic states. The operations of 2010 may be performed according to the methods described herein. In some examples, aspects of the operations of 2010 may be performed by an imprint evaluator as described with reference to FIG. 17.

At 2015, the memory device may determine whether the severity satisfies a threshold. The operations of 2015 may be performed according to the methods described herein. In some examples, aspects of the operations of 2015 may be performed by an imprint evaluator as described with reference to FIG. 17.

At 2020, the memory device may select, based on whether the severity satisfies a threshold, between a first imprint recovery method and a second imprint recovery method states, where the first imprint recovery method restricts access to the set of memory cells, and where the second imprint recovery method permits access to the set of memory cells. In some cases, the first imprint recovery method and the second imprint recovery method may both be configured to increase an ability of the set of memory cells to switch from storing the respective first logic states to storing respective second logic states. The operations of 2020 may be performed according to the methods described herein. In some examples, aspects of the operations of 2020 may be performed by an imprint recovery manager as described with reference to FIG. 17.

At 2025, the memory device may apply the selected imprint recovery method to the set of memory cells. The operations of 2025 may be performed according to the methods described herein. In some examples, aspects of the operations of 2025 may be performed by an imprint recovery manager as described with reference to FIG. 17.

In some examples, an apparatus as described herein may perform a method or methods, such as the method 2000. The apparatus may include circuitry, features, means, or instructions (e.g., a non-transitory computer-readable medium storing instructions executable by a processor) for determining that a set of memory cells are imprinted in respective first logic states, determining a severity with which the set of memory cells are imprinted in the respective first logic states, determining whether the severity satisfies a threshold, selecting, based on whether the severity satisfies a threshold, between a first imprint recovery method and a second imprint recovery method (e.g., both to increase an ability of the set of memory cells to switch from storing the respective first logic states to storing respective second logic states), where the first imprint recovery method restricts access to the set of memory cells, and where the second imprint recovery method permits access to the set of memory cells, and applying the selected imprint recovery method to the set of memory cells.

Some examples of the method 2000 and the apparatus described herein may further include operations, circuitry, features, means, or instructions for selecting the imprint recovery method based on a temperature of the memory device that includes the set of memory cells, an amount of time available for applying the imprint recovery method, an amount of power available for applying the imprint recovery method, an age of the memory device that includes the set of memory cells, or any combination thereof.

Some examples of the method 2000 and the apparatus described herein may further include operations, circuitry, features, means, or instructions for determining whether to indicate the selected method to a host device for the memory device that includes the set of memory cells based on whether the selected imprint recovery method is the first imprint recovery method or the second imprint recovery method.

It should be noted that the methods described herein are possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, and other substrates. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   determining that a set of memory cells are predisposed toward storing respective first logic states over respective second logic states;
   restricting access to the set of memory cells based at least in part on determining that the set of memory cells are predisposed toward storing the respective first logic states over the respective second logic states;
   performing an imprint recovery procedure on the set of memory cells while access to the set of memory cells is restricted, the imprint recovery procedure to alleviate the predisposition of the set of memory cells toward storing the respective first logic states over the respective second logic states; and
   permitting access to the set of memory cells after performing the imprint recovery procedure.

2. The method of claim 1, further comprising:
   determining, after performing the imprint recovery procedure, whether the imprint recovery procedure was successful.

3. The method of claim 2, further comprising:
   performing a second imprint recovery procedure on the set of memory cells based at least in part on determining that the imprint recovery was not successful.

4. The method of claim 2, further comprising:
   transmitting, to a host device for a memory device that includes the set of memory cells, an indication of whether the imprint recovery procedure was successful.

5. The method of claim 1, wherein performing the imprint recovery procedure comprises:
   applying one or more voltage pulses to the set of memory cells.

6. The method of claim 5, wherein:
   a first subset of the one or more voltage pulses have a first polarity; and
   a second subset of the one or more voltage pulses have a second polarity.

7. The method of claim 1, wherein:
   the set of memory cells comprise ferroelectric memory cells; and
   the imprint recovery procedure is to alleviate the predisposition of the set of memory cells toward storing the respective first logic states over the respective second logic states based at least in part on altering a configuration of electrostatic domains within the ferroelectric memory cells.

8. A method, comprising:
   writing a first set of logic states to a set of memory cells;
   reading the set of memory cells to obtain a second set of logic states that are based at least in part on writing the first set of logic states;
   determining that the set of memory cells are imprinted in respective first logic states based at least in part on a quantity of differences between the second set of logic states and the first set of logic states;
   restricting access to the set of memory cells based at least in part on determining that the set of memory cells are imprinted in the respective first logic states;
   performing an imprint recovery procedure on the set of memory cells while access to the set of memory cells is restricted, the imprint recovery procedure to increase an ability of the set of memory cells to switch between storing the respective first logic states and storing respective second logic states; and permitting access to the set of memory cells after performing the imprint recovery procedure.

9. A method, comprising:
determining to reduce a resistance of a set of memory cells to being written with different logic states;
modifying an operational parameter for the set of memory cells based at least in part on determining to reduce the resistance of the set of memory cells to being written with different logic states; and
operating the set of memory cells based at least in part on the modified operational parameter.

10. The method of claim 9, further comprising:
determining that the set of memory cells are imprinted in respective first logic states, wherein determining to reduce the resistance of the set of memory cells to being written with different logic states is based at least in part on determining that the set of memory cells are imprinted.

11. The method of claim 9, wherein:
the operational parameter comprises a temporal frequency of refresh operations for the set of memory cells; and
modifying the value of the operational parameter comprises increasing the temporal frequency of refresh operations for the set of memory cells.

12. The method of claim 9, wherein:
a refresh procedure for the set of memory cells comprises at least one refresh operation for each memory cell of the set of memory cells;
the operational parameter comprises a quantity of refresh operations per refresh procedure for the set of memory cells; and
modifying the value of the operational parameter comprises increasing the quantity of refresh operations per refresh procedure for the set of memory cells.

13. The method of claim 12, further comprising:
performing a refresh operation of the quantity of refresh operations by reading from the set of memory cells respective first logic states and writing to the set of memory cells respective second logic states.

14. The method of claim 9, wherein:
the operational parameter comprises a quantity of commanded refresh operations that a memory device may skip for the set of memory cells; and
modifying the value of the operational parameter comprises decreasing the quantity of commanded refresh operations that the memory device may skip for the set of memory cells.

15. The method of claim 9, wherein:
the operational parameter comprises a magnitude of a voltage used to perform read operations, write operations, or refresh on the set of memory cells; and
modifying the value of the operational parameter comprises changing the magnitude of the voltage used to perform read operations, write operations, or refresh operations on the set of memory cells.

16. The method of claim 9, wherein:
an access procedure for a memory cell of the set of memory cells comprises a read operation and a write operation;
the operational parameter comprises a magnitude of a voltage applied to the memory cell at a time between the read operation and the write operation; and
modifying the value of the operational parameter comprises changing the magnitude of the voltage applied to the memory cell at the time between the read operation and the write operation.

17. The method of claim 9, wherein:
the operational parameter comprises a temporal frequency of an error correcting procedure for the set of memory cells; and
modifying the value of the operational parameter comprises increasing the temporal frequency of the error correcting procedure for the set of memory cells.

18. The method of claim 9, further comprising:
determining, after modifying the value of the operational parameter, that the set of memory cells has been operated based at least in part on the modified value of the operational parameter for a duration that satisfies a threshold amount of time;
changing the value of the operational parameter to a second value based at least in part on determining that the duration satisfies the threshold amount of time; and
operating the set of memory cells based at least in part on the second value of the operational parameter.

19. The method of claim 9, further comprising:
determining, after modifying the value of the operational parameter, that a quantity of refresh operations performed on the set of memory cells satisfies a threshold;
changing the value of the operational parameter to a second value based at least in part on determining that the quantity of refresh operations satisfies the threshold; and
operating the set of memory cells based at least in part on the second value of the operational parameter.

20. The method of claim 9, wherein:
the operational parameter comprises a duration of refresh operations for the set of memory cells; and
modifying the value of the operational parameter comprises increasing the duration of refresh operations for the set of memory cells,
the method further comprising:
applying, during a refresh operation for a memory cell of the set of memory cells, a set of voltage pulses to the memory cell.

21. The method of claim 20, wherein:
a first subset of the set of voltage pulses have a first polarity; and
a second subset of the set of voltage pulses have a second polarity.

22. A method, comprising:
determining to operate a memory device that includes a set of memory cells in a maintenance mode;
determining to increase an ability of the set of memory cells to switch between storing different logic states based at least in part on determining to operate the memory device in the maintenance mode;
modifying an operational parameter for the set of memory cells based at least in part on determining to increase the ability of the set of memory cells to switch between storing the different logic states; and
operating the memory device in the maintenance mode, the maintenance mode comprising operating the set of memory cells based at least in part on the modified operational parameter.

23. A method, comprising:
determining that a set of memory cells are predisposed toward storing respective first logic states over respective second logic states;
determining a severity with which the set of memory cells are predisposed toward storing the respective first logic states over the respective second logic states;
determining whether the severity satisfies a threshold;

selecting, based at least in part on whether the severity satisfies the threshold, between a first imprint recovery method and a second imprint recovery method both to alleviate the predisposition of the set of memory cells toward storing the respective first logic states over the respective second logic states, wherein the first imprint recovery method restricts access to the set of memory cells, and wherein the second imprint recovery method permits access to the set of memory cells; and applying the selected imprint recovery method to the set of memory cells.

24. The method of claim 23, further comprising:

determining whether to indicate the selected method to a host device for a memory device that includes the set of memory cells based at least in part on whether the selected imprint recovery method is the first imprint recovery method or the second imprint recovery method.

25. A method, comprising:

determining that a set of memory cells are imprinted in respective first logic states;

determining a severity with which the set of memory cells are imprinted in the respective first logic states;

determining whether the severity satisfies a threshold;

selecting, based at least in part on whether the severity satisfies the threshold, between a first imprint recovery method and a second imprint recovery method both to increase an ability of the set of memory cells to switch from storing the respective first logic states to storing respective second logic states, wherein the first imprint recovery method restricts access to the set of memory cells, and wherein the second imprint recovery method permits access to the set of memory cells, and wherein selecting the imprint recovery method is based at least in part on a temperature of a memory device that includes the set of memory cells, an amount of time available for applying the imprint recovery method, an amount of power available for applying the imprint recovery method, an age of the memory device that includes the set of memory cells, or any combination thereof; and applying the selected imprint recovery method to the set of memory cells.

\* \* \* \* \*